(12) United States Patent
Kadono et al.

(10) Patent No.: US 8,604,947 B2
(45) Date of Patent: *Dec. 10, 2013

(54) VARIABLE LENGTH CODING METHOD AND VARIABLE LENGTH DECODING METHOD

(75) Inventors: Shinya Kadono, Nishinomiya (JP); Satoshi Kondo, Yawata (JP); Makoto Hagai, Moriguchi (JP); Kiyofumi Abe, Kadoma (JP)

(73) Assignee: Panasonic Corporation, Osaka (JP)

( * ) Notice: Subject to any disclaimer, the term of this patent is extended or adjusted under 35 U.S.C. 154(b) by 389 days.

This patent is subject to a terminal disclaimer.

(21) Appl. No.: 13/091,611

(22) Filed: Apr. 21, 2011

(65) Prior Publication Data

US 2011/0193728 A1 Aug. 11, 2011

Related U.S. Application Data

(60) Division of application No. 12/708,884, filed on Feb. 19, 2010, now Pat. No. 7,956,774, which is a division of application No. 11/980,403, filed on Oct. 31, 2007, now Pat. No. 7,714,752, which is a continuation of application No. 11/543,857, filed on Oct. 6, 2006, now Pat. No. 7,312,731, which is a division of application No. 11/110,922, filed on Apr. 21, 2005, now Pat. No. 7,161,508, which is a division of application No. 10/480,038, filed as application No. PCT/JP02/12230 on Nov. 22, 2002, now Pat. No. 6,967,600.

(30) Foreign Application Priority Data

Nov. 22, 2001 (JP) ................................. 2001-358197
Apr. 1, 2002 (JP) ................................. 2002-099227

(51) Int. Cl.
*H03M 7/40* (2006.01)
(52) U.S. Cl.
USPC .................. 341/67; 341/65; 341/58; 341/59; 341/106; 341/107

(58) Field of Classification Search
USPC ..................... 341/58, 59, 63, 65, 67, 106, 107
See application file for complete search history.

(56) References Cited

U.S. PATENT DOCUMENTS

| 5,233,348 A | 8/1993 | Pollmann et al. |
| 5,325,092 A | 6/1994 | Allen et al. |

(Continued)

FOREIGN PATENT DOCUMENTS

| AU | 200131390 | 10/2001 |
| CN | 1117779 A | 2/1996 |

(Continued)

OTHER PUBLICATIONS

International Search Report issued Aug. 19, 2003 in corresponding International Application No. PCT/JP02/12230.

(Continued)

*Primary Examiner* — Linh Nguyen
(74) *Attorney, Agent, or Firm* — Wenderoth, Lind & Ponack, L.L.P.

(57) ABSTRACT

An image coding apparatus provides a run-length encoding unit RLE1 that subjects quantized coefficients which are obtained by quantizing frequency components of an image signal to a variable length coding process by using a run value Run that indicates the number of successive zero coefficients and a level value Lev that indicates a value of a non-zero coefficient following the zero coefficients. The run-length encoding unit RLE1 includes a reordering unit Lreodr for reordering level values Lev; a variable length coder LVLC for coding reordered level values ROLev by using a code table that is selected according to the value of a quantization parameter QP; a reordering unit Rreodr for reordering run values Run from high frequency component of the quantized coefficients to low frequency component; and a variable length coder RVLC for coding reordered run values RORun by using a code table that is selected according to the number of already-processed run values.

3 Claims, 36 Drawing Sheets

(56) References Cited

U.S. PATENT DOCUMENTS

| | | | |
|---|---|---|---|
| 5,381,145 A | | 1/1995 | Allen et al. |
| 5,402,123 A | * | 3/1995 | Jung .............................. 341/63 |
| 5,455,578 A | | 10/1995 | Bhandari |
| 5,471,206 A | | 11/1995 | Allen et al. |
| 5,497,153 A | | 3/1996 | Jeong |
| 5,539,401 A | | 7/1996 | Kumaki et al. |
| 5,555,321 A | | 9/1996 | Ogura et al. |
| 5,583,500 A | | 12/1996 | Allen et al. |
| 5,602,549 A | | 2/1997 | Jeong |
| 5,640,420 A | | 6/1997 | Jung |
| 5,642,115 A | | 6/1997 | Chen |
| 5,717,394 A | | 2/1998 | Schwartz et al. |
| 5,717,705 A | | 2/1998 | Shikakura et al. |
| 5,729,690 A | | 3/1998 | Jeong et al. |
| 5,751,232 A | | 5/1998 | Inoue et al. |
| 5,793,897 A | * | 8/1998 | Jo et al. .......................... 382/246 |
| 5,809,041 A | | 9/1998 | Shikakura et al. |
| 5,812,788 A | * | 9/1998 | Agarwal ........................ 709/247 |
| 5,825,312 A | | 10/1998 | D'Ortenzio |
| 5,835,145 A | | 11/1998 | Ouyang et al. |
| 5,995,148 A | | 11/1999 | Haskell et al. |
| 6,011,496 A | | 1/2000 | Park et al. |
| 6,016,111 A | * | 1/2000 | Park et al. ........................ 341/55 |
| 6,069,575 A | | 5/2000 | Kinouchi et al. |
| 6,141,446 A | | 10/2000 | Boliek et al. |
| 6,151,075 A | | 11/2000 | Shin et al. |
| 6,241,778 B1 | * | 6/2001 | de Lind van Wijngaarden et al. ............................... 341/58 |
| 6,360,016 B1 | | 3/2002 | Shen et al. |
| 6,388,588 B2 | | 5/2002 | Kitamura |
| 6,438,167 B1 | | 8/2002 | Shimizu et al. |
| 6,477,280 B1 | * | 11/2002 | Malvar .......................... 382/245 |
| 6,577,251 B1 | * | 6/2003 | Yip ................................ 341/50 |
| 6,646,578 B1 | | 11/2003 | Au |
| 6,661,355 B2 | * | 12/2003 | Cornelius et al. ............... 341/58 |
| 6,731,814 B2 | | 5/2004 | Zeck et al. |
| 6,754,394 B2 | | 6/2004 | Boliek et al. |
| 6,763,070 B1 | | 7/2004 | Lee |
| 6,823,082 B2 | | 11/2004 | Hu |
| 6,912,070 B1 | | 6/2005 | Govindaswamy et al. |
| 6,954,157 B2 | | 10/2005 | Kadono et al. |
| 6,967,600 B2 | | 11/2005 | Kadono et al. |
| 7,046,852 B2 | | 5/2006 | Kerofsky |
| RE39,167 E | | 7/2006 | Jo et al. |
| 7,079,693 B2 | * | 7/2006 | Kerofsky ...................... 382/233 |
| 7,099,387 B2 | | 8/2006 | Bjontegaard et al. |
| 7,109,898 B2 | * | 9/2006 | Kadono et al. ................. 341/67 |
| 7,119,722 B2 | | 10/2006 | Koga et al. |
| 7,206,448 B2 | | 4/2007 | Howard |
| 7,228,152 B1 | | 6/2007 | Shinohara et al. |
| 7,248,735 B2 | | 7/2007 | Funakubo |
| 7,312,730 B2 | | 12/2007 | Kadono et al. |
| 7,450,775 B2 | | 11/2008 | Suzuki |
| 7,541,948 B2 | | 6/2009 | Kadono et al. |
| 7,596,279 B2 | | 9/2009 | Sugimoto et al. |
| 7,804,430 B2 | | 9/2010 | Pearlstein et al. |
| 7,956,774 B2 | * | 6/2011 | Kadono et al. ................. 341/67 |
| 2003/0138150 A1 | | 7/2003 | Srinivasan |
| 2003/0202601 A1 | * | 10/2003 | Bjontegaard et al. .... 375/240.22 |
| 2006/0215919 A1 | * | 9/2006 | Srinivasan .................... 382/236 |
| 2006/0274861 A1 | | 12/2006 | Langenbach et al. |
| 2007/0041449 A1 | | 2/2007 | Bjontegaard et al. |

FOREIGN PATENT DOCUMENTS

| | | |
|---|---|---|
| CN | 1133512 A | 10/1996 |
| CN | 1142144 A | 2/1997 |
| CN | 1656817 | 8/2005 |
| EP | 0 987 899 | 3/2000 |
| GB | 2 293 735 | 4/1996 |
| JP | 3-285460 | 12/1991 |
| JP | 06-021830 | 1/1994 |
| JP | 06-237184 | 8/1994 |
| JP | 06-311534 | 11/1994 |
| JP | 7-66982 | 3/1995 |
| JP | 08-046521 | 2/1996 |
| JP | 8-79088 | 3/1996 |
| JP | 8-507191 | 7/1996 |
| JP | 9-294268 | 11/1997 |
| JP | 10-271017 | 10/1998 |
| JP | 2000-341694 | 12/2000 |
| KR | 0147948 | 9/1998 |
| KR | 1999-0036476 | 5/1999 |
| WO | 95/17073 | 6/1995 |
| WO | 03/094529 | 11/2003 |

OTHER PUBLICATIONS

"H.26L Test Model Long Term No. 8 (TML-8)draft0", ITU-Telecommunication Standardization Sector, Jun. 28, 2001, Section 4.3 pp. 17-18, Sections 5.1 and 5.2 pp. 22-29 (with partial English English translation).

Miki, S., "All About MPEG-4" Kogyo Chosakai Publishing Co. Ltd., First Edition, Sep. 1998, pp. 69-73.

Office Action issued Jun. 28, 2007 in U.S. Appl. No. 11/495,601.

Office Action issued May 13, 2008 in U.S. Appl. No. 11/495,600.

Chinese Office Action (in English) issued Mar. 6, 2009 in Chinese Application No. 200610107555.1.

Office Action issued on Oct. 16, 2007 in U.S. Appl. No. 11/495,601.

Office Action issued Feb. 8, 2013 in corresponding Indian Application No. 3235/KOLNP/2006.

Extended European Search Report issued Mar. 15, 2012 in corresponding European Application No. 10 18 0714.

S. Kadono et al., "Improved 2D-VLC coding for High-Bitrate", ISO/IEC JTC1/SC29/WG11, MPEG2001/M7664, Dec. 2001, pp. 1-9.

Extended European Search Report issued Jan. 2, 2012 in corresponding European Application No. 10 180 698.2.

Cheung Auyeung, Motorola, "Results on 3D-VLC and Adaptive 3D-VLC", ITU Telecommunications Standardization Sector, Study Group 15, Working Party 15/1; LBC-95-066, Jan. 1995, pp. 1-7.

Akio Yamada et al., "An Adaptive Scanning Method for Runlength Wavelet Coding", ISO/IEC JTC1/SC29/WG11, XX, XX, vol. MPEG97, No. 1764, Feb. 1, 1997, pp. 1-9, XP002428599.

Gisle Bjøntegaard et al., "Context-adaptive VLC (CVLC) coding of coefficients", 3. JVT Meeting 60. MPEG Meeting; May 6-10, 2002; Fairfax, US; (Joint Video Team of ISO/IEC JTC1/SC29/WG11 and ITU-T SG.16), No. JVT-C028, May 10, 2002, XP030005134, ISSN: 0000-0442, pp. 1-11.

Gisle Bjøntegaard, "Improved low complexity entropy coding for transform coefficients", Joint Video Team (JVT) of ISO/IEC MPEG & ITU-TVCEG (ISO/IEC JTC1/SC29/WG11 and ITU-T SG16 Q6), XX, XX, Jan. 29, 2002, pp. 1-8, XP002257294.

\* cited by examiner

|     | Q1 | Q2 | Q3 | Q4 |     |
|-----|----|----|----|----|-----|
|     | 20 | -10 | 0 | 0 |     |
| Q6→ |    |    |    |    | ←Q7 |
| Q5→ | 5  | 2  | 0  | -1 | ←Q8 |
| Q10→|    |    |    |    | ←Q11|
| Q9→ | 0  | 1  | 0  | 0  | ←Q12|
|     | 0  | 0  | 0  | 1  |     |
|     | Q13| Q14| Q15| Q16|     |

Q1→Q2→Q5→Q9→Q6→Q3→Q4→Q7→Q10→Q13
→Q14→Q11→Q8→Q12→Q15→Q16

20, -10, 5, 0, 2, 0, 0, 0, 1, 0, 0, 0, -1, 0, 0, 1

Run : 0, 0, 0, 1, 3, 3, 2

Level : 20, -10, 5, 2, 1, -1, 1

↓ after rearranged in reverse order

Run : 2, 3, 3, 1, 0, 0, 0

Level : 1, -1, 1, 2, 5, -10, 20

Level value : 1, -1, 1, 1, 2, 5, -10, 20 (QP is relatively small)

Fig.6 (a) When it is determined that QP is equal to or larger than threshold

| Level | 1 | -1 | 1 | 1 | 2 | 5 | -10 | 20 | |
|---|---|---|---|---|---|---|---|---|---|
| Code word | '1' | '01' | '1' | '1' | '001' | '000000001' | '0000000000 0000000001' | '0000000000 0000000000 0000000000 000000001' | Total 75bits |

Fig.6 (b) When it is determined that QP is smaller than threshold

| Level | 1 | -1 | 1 | 1 | 2 | 5 | -10 | 20 | |
|---|---|---|---|---|---|---|---|---|---|
| Code word | '10' | '11' | '10' | '10' | '010' | '000010' | '0000000001 0' | '0000000000 0000000000 0' | Total 47bits |

Level value : 1, -1, 1, 1, 1, 1, -2, 3 (QP is relatively large)

Fig.7 (a) When it is determined that QP is equal to or larger than threshold

| Level | 1 | -1 | 1 | 1 | 1 | 1 | -2 | 3 |
|---|---|---|---|---|---|---|---|---|
| Code word | '1' | '01' | '1' | '1' | '1' | '1' | '0001' | '00001' |

Total 15bits

Fig.7 (b) When it is determined that QP is smaller than threshold

| Level | 1 | -1 | 1 | 1 | 1 | 1 | -2 | 3 |
|---|---|---|---|---|---|---|---|---|
| Code word | '10' | '11' | '10' | '10' | '10' | '10' | '011' | '0010' |

Total 17bits

Fig.8 (a)  Run value : 0, 0, 0, 1, 3, 3, 2

| Run value | 0 | 0 | 0 | 1 | 3 | 3 | 2 |
|---|---|---|---|---|---|---|---|
| Code word | '000' | '000' | '000' | '001' | '011' | '011' | '010' |

Total 21bits

Fig.8 (b)  Run value : 2, 3, 3, 1, 0, 0, 0

| Run value | 2 | 3 | 3 | 1 | 0 | 0 | 0 |
|---|---|---|---|---|---|---|---|
| Number of not-yet-coded zero coefficients | 15 | 12 | 8 | 4 | 2 | 1 | 0 |
| Code word | '010' | '011' | '011' | '01' | '0' | '0' | no need |

Total 13bits

Fig.8 (c)  Run value : 0, 0, 0, 1, 3, 3, 2 (example without inverse reordering)

| Run value | 0 | 0 | 0 | 1 | 3 | 3 | 2 |
|---|---|---|---|---|---|---|---|
| Number of not-yet-coded zero coefficients | 15 | 14 | 13 | 12 | 10 | 6 | 2 |
| Code word | '000' | '000' | '000' | '001' | '011' | '100' | '11' |

Total 20bits

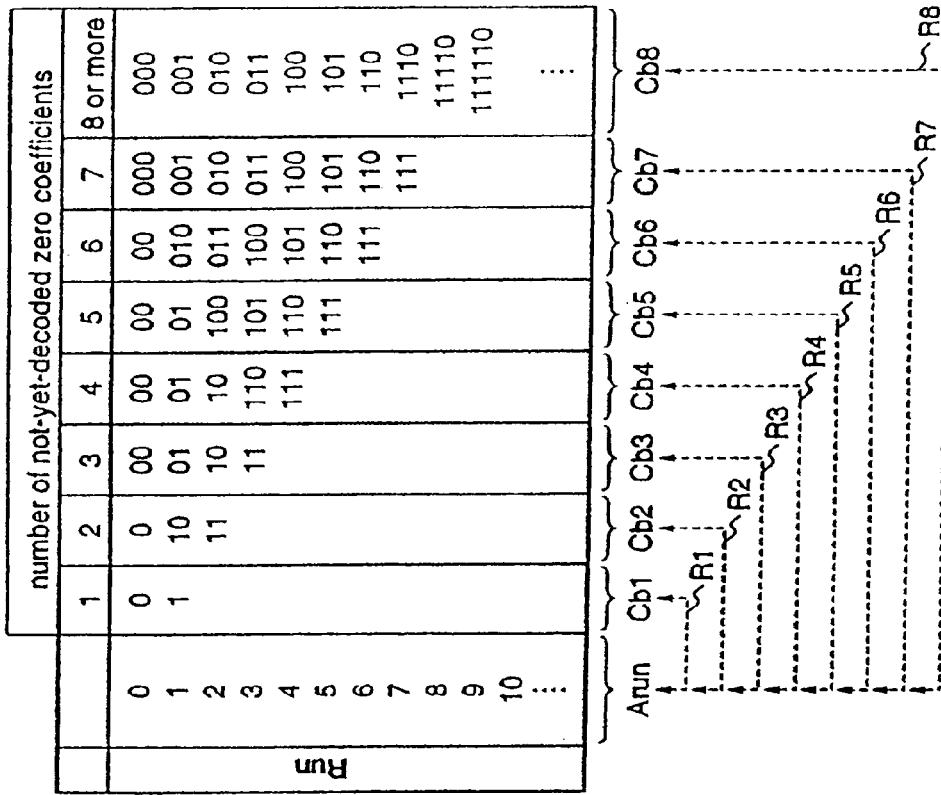
Fig.12 (b) Example of VLC change for Run
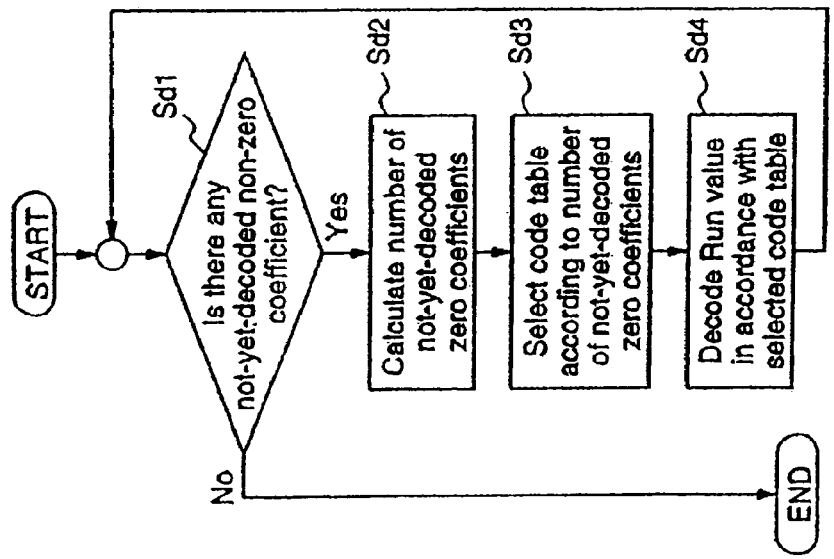
Fig.12 (a)

Fig.15 (a)

| code | level | run |
|---|---|---|
| 0 | EOB | – |
| 1 | 1 | 0 |
| 2 | -1 | 0 |
| 3 | 2 | 0 |
| 4 | -2 | 0 |
| 5 | 3 | 0 |
| 6 | -3 | 0 |
| 7 | 4 | 0 |
| 8 | -4 | 0 |
| 9 | 1 | 1 |
| 10 | -1 | 1 |
| 11 | 2 | 1 |
| 12 | -2 | 1 |
| 13 | 5 | 0 |
| 14 | -5 | 0 |
| 15 | 6 | 0 |
| 16 | -6 | 0 |
| 17 | 3 | 1 |
| ⋮ | ⋮ | ⋮ |

Rows 1–12: Table look up VLC
Rows 13–…: regularly build VLC

| code | level | run |
|---|---|---|
| 0 | EOB | – |
| 1 | 1 | 0 |
| 2 | -1 | 0 |
| 3 | 1 | 1 |
| 4 | -1 | 1 |
| 5 | 2 | 0 |
| 6 | -2 | 0 |
| 7 | 2 | 1 |
| 8 | -2 | 1 |
| 9 | 1 | 2 |
| 10 | -1 | 2 |
| 11 | 1 | 3 |
| 12 | -1 | 3 |
| 13 | 3 | 2 |
| 14 | -3 | 3 |
| 15 | 3 | 2 |
| 16 | -3 | 3 |
| 17 | 2 | 2 |
| ⋮ | ⋮ | ⋮ |

Rows 1–12: Table look up VLC
Rows 13–…: regularly build VLC

| code | level | run |
|---|---|---|
| 0 | EOB | — |
| 1 | 1 | 0 |
| 2 | -1 | 0 |
| 3 | 2 | 0 |
| 4 | -2 | 0 |
| 5 | 1 | 1 |
| 6 | -1 | 1 |
| 7 | 3 | 0 |
| 8 | -3 | 0 |
| 9 | 2 | 1 |
| 10 | -2 | 1 |
| 11 | 1 | 2 |
| 12 | -1 | 2 |
| 13 | 1 | 3 |
| ... | ... | ... |

~T2c

Table look up VLC (codes 0–6), regularly build VLC (codes 7–...)

Fig.16 (b)

| code | level | run |
|---|---|---|
| 0 | EOB | — |
| 1 | 1 | 0 |
| 2 | -1 | 0 |
| 3 | 2 | 0 |
| 4 | -2 | 0 |
| 5 | 1 | 1 |
| 6 | -1 | 1 |
| 7 | 3 | 0 |
| 8 | -3 | 0 |
| 9 | 2 | 1 |
| 10 | -2 | 1 |
| 11 | 4 | 0 |
| 12 | -4 | 0 |
| 13 | 3 | 1 |
| ... | ... | ... |

| code | level | run |
|---|---|---|
| 0 | EOB | — |
| 1 | 1 | 0 |
| 2 | -1 | 0 |
| 3 | 2 | 0 |
| 4 | -2 | 0 |
| 5 | 3 | 0 |
| 6 | -3 | 0 |
| 7 | 4 | 0 |
| 8 | -4 | 0 |
| 9 | 5 | 0 |
| 10 | -5 | 0 |
| 11 | 6 | 0 |
| 12 | -6 | 0 |
| 13 | 7 | 0 |
| ... | ... | ... |

| code | level | run |
|------|-------|-----|
| 0 | EOB | — |
| 1 | 1 | 0 |
| 2 | -1 | 0 |
| 3 | 2 | 0 |
| 4 | -2 | 0 |
| 5 | 3 | 0 |
| 6 | -3 | 0 |
| 7 | 4 | 0 |
| 8 | -4 | 0 |
| 9 | 1 | 1 |
| 10 | -1 | 1 |
| 11 | 1 | 2 |
| 12 | -1 | 2 |
| 13 | 1 | 3 |
| ... | ... | ... |

Ta

{ Table look up VLC } { regularly build VLC }

Fig.24 (b)

| code | level | run |
|------|-------|-----|
| 0 | EOB | — |
| 1 | 1 | 0 |
| 2 | -1 | 0 |
| 3 | 2 | 0 |
| 4 | -2 | 0 |
| 5 | 1 | 1 |
| 6 | -1 | 1 |
| 7 | 3 | 0 |
| 8 | -3 | 0 |
| 9 | 2 | 1 |
| 10 | -2 | 1 |
| 11 | 1 | 2 |
| 12 | -1 | 2 |
| 13 | 1 | 3 |
| ... | ... | ... |

| code | level | run |
|------|-------|-----|
| 0 | EOB | — |
| 1 | 1 | 0 |
| 2 | -1 | 0 |
| 3 | 1 | 1 |
| 4 | -1 | 1 |
| 5 | 1 | 2 |
| 6 | -1 | 2 |
| 7 | 2 | 0 |
| 8 | -2 | 0 |
| 9 | 2 | 1 |
| 10 | -2 | 1 |
| 11 | 2 | 2 |
| 12 | -2 | 2 |
| 13 | 1 | 3 |
| ... | ... | ... |

Tc

| code | level | run |
|------|-------|-----|
| 0 | EOB | – |
| 1 | 1 | 0 |
| 2 | -1 | 0 |
| 3 | 2 | 0 |
| 4 | -2 | 0 |
| 5 | 1 | 1 |
| 6 | -1 | 1 |
| 7 | 3 | 0 |
| 8 | -3 | 0 |
| 9 | 2 | 1 |
| 10 | -2 | 1 |
| 11 | 1 | 2 |
| 12 | -1 | 2 |
| ⋮ | ⋮ | ⋮ |

Table look up VLC: rows 0–6
regularly build VLC: rows 7–12...

T1

VARIABLE LENGTH CODING METHOD AND VARIABLE LENGTH DECODING METHOD

This application is a divisional of U.S. application Ser. No. 12/708,884, filed Feb. 19, 2010 now U.S. Pat. No. 7,956,774, which is a divisional of U.S. application Ser. No. 11/980,403, filed Oct. 31, 2007, now U.S. Pat. No. 7,714,752, which is a continuation of U.S. application Ser. No. 11/543,857, filed Oct. 6, 2006, now U.S. Pat. No. 7,312,731, which is a divisional of U.S. application Ser. No. 11/110,922, filed Apr. 21, 2005, now U.S. Pat. No. 7,161,508, which is a divisional of U.S. application Ser. No. 10/480,038, now U.S. Pat. No. 6,967,600, which is the National Stage of International Application No. PCT/JP02/12230, filed Nov. 22, 2002.

TECHNICAL FIELD

The present invention relates to a variable length coding method and a variable length decoding method and, more particularly, to a method for converting plural coefficients which are obtained by quantizing frequency components of image data (quantization coefficients) into coded data according to a variable length coding process, and a method for decoding the coded data according to a variable length decoding process to reconstitute plural coefficients.

BACKGROUND ART

In recent years, we have entered the age of multimedia in which audio, video and other data are integrally handled, and conventional information media (i.e., means for transmitting information to persons), such as newspapers, magazines, televisions, radios, and telephones have been adopted as subjects of multimedia. Generally, "multimedia" means to represent not only characters but also diagrams, speech and especially images simultaneously in relation with each other. In order to handle the conventional information media as the subjects of multimedia, it is essential to transform the information into digital format.

When the quantity of data processed by each information medium described above is estimated as the quantity of digital data, in the case of characters, the data quantity for each character is 1~2 bytes. However, in the case of speech, the data quantity is 64 kbits per second (quality for telecommunication) and, in the case of moving pictures, it is more than 100 Mbits per second (quality for current television broadcasting). So, as for the information media described above, it is not practical to handle such massive data as it is in the digital format. For example, visual telephones have already been put to practical use by ISDN (Integrated Services Digital Network) having a transmission rate of 64 kbps~1.5 Mbps, but it is impossible to transmit an output image of a television camera having a large quantity of data as it is by the ISDN.

So, data compression technologies are demanded. For example in the case of visual telephones, the moving picture compression technologies standardized as H.261 and H.263 by ITU-T (International Telecommunication Union-Telecommunication Sector) are employed. Further, according to the data compression technology based on MPEG-1, it is possible to record image data, together with audio data, in an ordinary music CD (compact disk).

Here, MPEG (Moving Picture Experts Group) is an international standard associated with digital compression for image signals of moving pictures. In MPEG-1, an image signal of a moving, picture is compressed to 1.5 Mbps, i.e., data of a television signal is compressed to about 1/100 of the original signal. Since the transmission rate to which MPEG-1 is directed is mainly restricted to about 1.5 Mbps, MPEG-2 is standardized to meet the demands for higher image quality. In MPEG-2, an image signal of a moving picture is compressed to 2~15 Mbps.

Under the existing circumstances, standardization of MPEG-4 having a higher compression rate has been realized by the working group for the standardization of MPEG-1 and MPEG-2 (ISO/IEC JTC1/SC29/WG11). MPEG-4 not only enables coding at a low bit rate with high efficiency but also realizes introduction of a strong error resistant technology that can reduce a subjective deterioration of image quality even when a transmission line error occurs. Further, ITU-T is developing standardization of H.26L as an image coding method of the next generation, and the latest coding method at this point of time is a method called "Test Model 8" (TML8).

FIG. 30 is a block diagram illustrating a conventional image coding apparatus.

This image coding apparatus 201a has a blocking unit Blk for blocking an inputted image signal Vin into unit areas (blocks) each comprising a predetermined number of pixels and outputting a blocked image signal BlkS, and a frequency transformation unit Trans for subjecting the output BlkS to frequency transformation to output frequency components TransS corresponding to respective blocks. Here, the block is an area of a predetermined size in a picture (image space), which is a unit for a coding process of an image signal, and it is composed of a predetermined number of pixels. Here, the image signal Vin corresponds to a moving image that is composed of plural pictures.

The image coding apparatus 201a further includes a quantization unit Q for quantizing the outputs (frequency components) TransS from the frequency transformation unit and outputting quantized components (quantization coefficients) QS corresponding to respective blocks, and a coding unit RLE0a for subjecting the outputs (quantized components) Qs from the quantization unit to a variable length coding process.

Next, its operation will be described.

When an image signal Vin is inputted to the image coding apparatus 201a, the blocking unit Blk divides the inputted image signal Vin into image signals corresponding to block units, to generate an image signal (blocked image signal) BlkS corresponding to each block. The frequency transformation unit Trans transforms the blocked image signal BlkS into frequency components TransS according to DCT (Discrete Cosine Transformation) or Wavelet transformation. The quantization unit Q quantizes the frequency components TransS in a predetermined quantization step on the basis of a quantization parameter QP to output quantized components QS, as well as outputs the quantization parameter QP. Then, the coding unit RLE0a subjects the quantized components QS to a variable length coding process, and outputs a coded steam Str0a.

FIG. 31 is a block diagram for explaining the coding unit RLE0a that constitutes the image coding apparatus 201a.

This coding unit RLE0a has a zigzag scanner Scan for transforming the outputs (quantized components) QS of the quantization unit Q in a two-dimensional array into quantized component Coef in a one-dimensional array (i.e., predetermined order), and a variable length coder VLC for subjecting the quantized components Coef outputted from the zigzag scanner Scan to a variable length coding process.

When the quantized components QS outputted from the quantization unit Q are inputted to the coding unit RLE0a, the zigzag scanner Scan transforms the quantized components QS in a two-dimensional array from the quantization unit Q into quantized components Coef in a one-dimensional array (predetermined order), and outputs the quantized components.

FIG. 43 is a diagram for specifically explaining the process for transforming the quantized components QS by the zigzag scanner Scan.

As shown in FIG. 43, the quantized components QS outputted from the quantization unit Q have a two-dimensional array, i.e., an array in which the quantized components QS are arranged in the form of a matrix on a two-dimensional frequency region Fr according to the height of the horizontal frequency component and the height of the vertical frequency component.

The zigzag scanner Scan carries out a process for scanning the quantized components QS in the two-dimensional array in a zigzag manner as shown by arrows Y1 to Y7, to transform the components into quantized components Coef in a one-dimensional array. That is, in this scan process, a predetermined order along the scanning course is set with respect to the plural quantized components QS in the two-dimensional array.

Then, the variable length coder VLC assigns codes to the quantized components Coef which are outputted from the zigzag scanner Scan, with using a code table that shows a correlation between numerical values indicating the sizes of the quantized components and codes (code words), to trans form the quantized components into a coded stream Str0a corresponding to each block.

FIG. 32 is a block diagram for explaining an image decoding apparatus 202a corresponding to the image coding apparatus 201a as shown in FIG. 30.

This image decoding apparatus 202a decodes the coded stream Str0a which is outputted from the conventional image coding apparatus 201a as shown in FIG. 30.

The image decoding apparatus 202a has a decoding unit RLD0a for decoding the coded stream Str0a which is outputted from the image coding apparatus 201a, and an inverse quantization unit IQ for subjecting outputs (decoded quantization components) DQS from the decoding unit RLD0a to an inverse quantization process.

The image decoding apparatus 202a further includes an inverse frequency transformation unit ITrans for subjecting outputs (decoded frequency components) ITransS from the inverse quantization unit IQ to an inverse frequency transformation process, and a deblocking unit Deblk for generating a decoded image signal Vout corresponding to each picture on the basis of outputs (decoded blocked image signals) DBlkS from the inverse frequency transformation unit ITrans.

Next, its operation will be described.

When the coded stream Str0a is inputted from the image coding apparatus 201a to the image decoding apparatus 202a, the decoding unit RLD0a decodes the coded stream Str0a and outputs decoded quantized components DQS. The operation of the decoding unit RLD0a is the inverse of the operation of the coding unit RLE0a.

The inverse quantization unit IQ carries out the inverse of the operation of the quantization unit Q, i.e., an operation of inversely quantizing the decoded quantized components DQS with referring to the quantization parameter QP, and outputs decoded frequency components ITransS. The inverse frequency transformation unit ITrans carries out the inverse of the operation of the frequency transformation unit Trans, i.e., an operation of subjecting the decoded frequency components ITransS to inverse DCT or inverse wavelet transformation, to reconstitute decoded image signals DBlkS corresponding to respective blocks. Then, the deblocking unit DeBlk integrates the decoded image signals DBlkS of the respective blocks to output a decoded image signal Vout corresponding to each picture (frame).

FIG. 33 is a block diagram for explaining the decoding unit RLD0a that constitutes the image decoding apparatus 202a.

The decoding unit RLD0a has a variable length decoder VLD for subjecting the coded stream Str0a to a variable length decoding process to decode the quantized component Coef corresponding to each code included in the coded stream Str0a, and an inverse zigzag scanner IScan for reconstituting quantized components DQS in a two-dimensional array from the decoded quantized components Coef in a one-dimensional array, which are outputted from the variable length decoder VLD.

In this decoding unit RLD0a, the variable length decoder VLD decodes the coded stream Str0a according to the inverse operation to the variable length coder VLC, and outputs quantized components Coef corresponding to codes (code words). Then, the inverse zigzag scanner IScan carries out the inverse operation to the zigzag scanner Scan, to reconstitute decoded quantized components DQS in a two-dimensional array from the quantized components Coef in a one-dimensional array, which are outputted from the variable length decoder VLD, and outputs the decoded quantized components DQS to the inverse quantization unit IQ.

Japanese Published Patent Application No. Hei. 6-311534 discloses a method in which an image signal is divided into a luminance signal and a color-difference signal to subject the obtained signals to a variable length coding process.

The plural quantized components corresponding to respective blocks, to which the predetermined order has been set, are data including a high redundancy, i.e., data in which plural coefficients whose, values are zero (zero coefficients) continue after a coefficient whose value is not zero (non-zero coefficient). To encode such quantized components, a method in which quantized components are encoded with its redundant information being deleted, for example, a run-length encoding method in which quantized components are encoded by using a run value that indicates the number of successive zero coefficients and a level value that indicates a value of a non-zero coefficient following the zero coefficients has been conventionally employed.

Hereinafter, a conventional image coding apparatus using the run-length encoding method will be described.

FIG. 34 is a block diagram illustrating a conventional image coding apparatus that carries out the run-length encoding.

This image coding apparatus 201b includes, in place of the coding unit RLE0a of the image coding apparatus 201a shown in FIG. 30, a run-length encoding unit RLE0b for subjecting outputs (quantized components) QS from the quantization unit Q to run-length encoding and outputting a coded stream Str0b. Other components are the same as those of the image coding apparatus 201a.

The operation of the image coding apparatus 201b is different from that of the image coding apparatus 201a only in the operation of the coding unit RLE0b.

FIG. 35 is a block diagram illustrating a specific construction of the coding unit RLE0b in the image coding apparatus 201b.

This run-length encoding unit RLE0b has, like the coding unit RLE0a, a zigzag scanner Scan for transforming outputs (quantized components) QS in a two-dimensional array from the quantization unit Q into quantized components Coef in a one-dimensional (i.e., a predetermined order).

Then, this run-length encoding unit RLE0b further includes a run calculator RunCal for calculating the number of successive quantized components whose values are zero (zero coefficients) Coef and outputting a run value Run indicating the number of successive zero coefficients, and a level calculator LevCal for calculating a value of a quantized component whose value is not zero (non-zero coefficient), following the zero coefficients, and outputting a level value Lev indicating the value of the non-zero coefficient.

The run-length encoding unit RLE0b further includes a variable length coder LevVLC for subjecting the level value Lev that is outputted from the level calculator LevCal to a variable length coding process and outputting a code string (level value code string) LStr, a variable length coder RunVLC for subjecting the run value Run that is outputted from the run calculator RunCal to a variable length coding process and outputting a code string (run value code string) RStr, and a multiplexer MUX for multiplexing the level value code string LStr and the run value code string RStr for each block and outputting a multiplexed coded stream Str0b.

Next, its operation will be described.

The zigzag scanner Scan transforms the quantized components QS in a two-dimensional array, which are outputted from the quantization unit Q, into quantized components Coef in a one-dimensional array (predetermined order), and outputs the quantized components Coef. The transformation process for the quantized components Qs by the zigzag scanner Scan is carried out in the same manner as that in the coding unit RLE0a of the image coding apparatus 201a.

The run calculator RunCal calculates the number of successive zero coefficients on the basis of the quantized components Coef which are outputted from the zigzag scanner Scan, and outputs a run value Run indicating the calculated number. The level calculator LevCal calculates a value of a non-zero coefficient that follows the successive zero coefficients, on the basis of the quantized components Coef outputted from the zigzag scanner Scan, and outputs a level value Lev indicating this value.

Here, the run calculator RunCal generates a special value EOB (End of Block) when detecting the highest frequency component (the last non-zero coefficient) in the target block to be processed, to inform that subsequent higher frequency components have all zero value.

Further, the variable length coder RunVLC subjects the run value Run which is outputted from the run calculator RunCal to a variable length coding process for assigning a code (code word) to the run value according to a code table or arithmetic operation, and outputs a code string RStr. The variable length coder LevVLC subjects the level value Lev which is outputted from the level calculator LevCal to a variable length coding process for assigning a code (code word) to the level value according to a code table or arithmetic operation, and outputs a code string LStr.

The multiplexer MUX multiplexes the code string LStr and the code string RStr for each block, and outputs a multiplexed coded stream Str0b.

Here, the process for multiplexing the code string LStr and the code string RStr is carried out for each block, for example, in such manner that the code string RStr corresponding to all run values for a target block is followed by the code string LStr corresponding to all level values for the target block, or the code string LStr corresponding to all level values for a target block is followed by the code string RStr corresponding to all run values for the target block.

The image coding apparatus as described above for encoding plural quantized coefficients in a predetermined order, by using the run value Run indicating the number of quantized components whose values are zero (zero coefficients) Coef, and the level value Lev indicating a value of a quantized component whose value is not zero (nail-zero coefficient) Coef, following the zero coefficients, can encode the plural quantized coefficients at a higher coding efficiency, while removing its redundant information.

FIG. 36 is a block diagram for explaining an image decoding apparatus 202b corresponding to the image coding apparatus 201b as shown in FIG. 34.

This image decoding apparatus 202b decodes the coded stream Str0 that is outputted from the conventional image coding apparatus 201b as shown in FIG. 34.

The image decoding apparatus 202b has, in place of the decoding unit RLD0a of the image decoding apparatus 202a shown in FIG. 32, a run-length decoding unit RLD0b for subjecting the coded stream Str0b that is outputted from the image coding apparatus 201b to a run-length decoding process. Other components are identical to those of the image decoding apparatus 202a.

The operation of the image decoding apparatus 202b is different from the image decoding apparatus 202a only in the operation of the decoding unit RLD0b.

FIG. 37 is a block diagram illustrating a specific construction of the run-length decoding unit RLD0b in the image decoding apparatus 202b.

This run-length decoding unit RLD0b has a demultiplexer DMUX for demultiplexing the multiplexed coded stream Str0b that is outputted from the image coding apparatus 201b to obtain the code string LStr corresponding to the level values and the code string RStr corresponding to the run values, a variable length decoder LevVLD for subjecting the code string LStr to a variable length decoding process to reconstitute the level values Lev, a variable length decoder RunVLC for subjecting the code string RStr to a variable length decoding process to reconstitute the run values Run, and an inverse zigzag scanner IScan for reconstituting decoded quantized components DQS in a two-dimensional array from decoded quantized components in a one-dimensional array, which are represented by the level values Lev and the run values Run.

Next, its operation will be described.

In the image decoding apparatus 202b, the run-length decoding unit RLD0b carries out the inverse operation to the run-length encoding unit RLE0b. That is, the run-length decoding unit RLD0b demultiplexes the multiplexed coded stream Str0b to obtain the code string Lstr corresponding to the level values and the code string RStr corresponding to the run values.

Then, the variable length decoder LevVLD decodes the code string LStr corresponding to the level values by the inverse operation to the variable length coder LevVLC, and outputs the level values Lev. The variable length decoder RunVLD decodes the code string RStr corresponding to the run values by the inverse operation to the variable length coder RunVLC, and outputs the run values Run.

The inverse zigzag scanner IScan reconstitutes decoded quantized components DQS in a two-dimensional array from the quantized components in a one-dimensional array, which are represented by the level values Lev and the run values Run, by the inverse operation to the zigzag scanner Scan, and outputs the decoded quantized components to the inverse quantization unit IQ. However, this inverse zigzag, scanner IScan (see FIG. 37) is different from the inverse zigzag scanner IScan as shown in FIG. 33 in that the level value Lev and the run value Run are inputted thereto. Thus, the inverse zigzag scanner IScan shown in FIG. 37 has a function of converting a coefficient that is represented by the level value Lev and the run value Run into a quantized components Coef.

According to the image decoding apparatus that carries out a decoding process for decoding plural quantized coefficients in a predetermined order, by using the run value Run indicating the number of quantized components whose values are zero (zero coefficients) Coef and the level value Lev indicating a value of a quantized component whose value is not zero (non-zero coefficient) Coef, following the zero coefficients, coded data which is obtained by coding plural quantized components according to run-length encoding with removing its redundant information at a higher coding efficiency is decoded satisfactorily.

Hereinafter, another example of the conventional image coding apparatus using the run-length encoding method will be described.

FIG. 38 is a block diagram illustrating another example of the image coding apparatus that employs the conventional run-length encoding unit. Almost all of the conventional image coding apparatuses which are compliant with standards such as MPEG, or H.261 and H.263 (ITU), or a draft H26L standard (TML8) that is now being planned have a construction as shown in FIG. 38.

This image coding apparatus 201c performs coding of quantized coefficients using the run value and the level value, like the image coding apparatus 201b shown in FIG. 34, while this image coding apparatus 201c does not perform a variable length coding process for the run value and the level value separately like the image coding apparatus 201b, but performs a variable length coding process for a pair of the run value and the level value (run-level pair).

To be more specific, the image coding apparatus 201c has, like the image coding apparatus 201b, a blocking unit Blk to which an image signal Vin is inputted, a frequency transformation unit Trans for subjecting an output BlkS from the blocking unit to frequency transformation, and a quantization unit Q for quantizing outputs (frequency components) TransS from the transformation unit. The image coding apparatus 201c further includes a run-length encoding unit RLE0c for subjecting outputs (quantized components) QS from the quantization unit to a run-length encoding process for transforming a run-level pair comprising a run value and a level value into a variable length code.

Next, its operation will be described.

The blocking unit Blk divides the image signal Vin into image signals corresponding to block units to generate pixel value components (blocked image signals) BlkS. The frequency transformation unit Trans transforms the pixel value components BlkS into frequency components TransS according to DCT (Discrete Cosine Transformation) or Wavelet transformation. The quantization unit Q quantizes the frequency components TransS on the basis of a quantization parameter QP to output quantized components QS, as well as outputs the quantization parameter Q. The run-length encoding unit RLE0c subjects the quantized components QS to run-length encoding, and outputs a coded stream Str0c.

Here, the block is an area of a predetermined size in the picture (image space), which is a unit in a coding process for an image signal, and composed of a predetermined number of pixels. The run-length encoding is a process for transforming a pair comprising a run value that indicates the number of successive quantized components whose values are zero (zero coefficients) and a level value that indicates a value of a quantized component whose value is not zero (non-zero coefficient), following the zero coefficients, into a variable length code, in other words, a process for assigning one variable length code (code word) to a pair of a run value and a level value (run-level pair).

Next, the run-length encoding unit RLE0c will be specifically described.

FIG. 39 is a block diagram illustrating a conventional run-length encoding unit RLE0c.

This run-length encoding unit RLE0c has, like the run-length encoding unit RLE0b as shown in FIG. 35, a zigzag scanner Scan for transforming the outputs (quantized components) QS in a two-dimensional array from the quantization unit Q, into quantized components Coef in a one-dimensional array (i.e., a predetermined order); a run calculator RunCal for calculating the number of successive quantized components whose values are zero (zero coefficients) Coef and outputting a run value Run; and a level calculator LevCal for calculating a value of a quantized component whose value is not zero (non-zero coefficient) Coef, following the zero coefficients, and outputting a level value Lev.

The run-length encoding unit RLE0c further includes a run-level encoder RunLevEnc for obtaining a code number Code corresponding to a pair of the level value Lev and the run value Run according to a code table or arithmetic operation on the basis of the outputs from the run calculator RunCal and the level calculator LevCal; and a variable length coder VLC for assigning a code word to the code number Code to generate a coded stream Str0c corresponding to the image signal Vin.

Next, its operation will be described.

In the run-length encoding unit RLE0c, like in the run-length encoding unit RLE0b, the zigzag scanner Scan transforms quantized components QS in a two-dimensional array, which are outputted from the quantization unit Q, into quantized components Coef in a one-dimensional array (predetermined order), and outputs the obtained quantized components.

FIG. 43 is a diagram for specifically explaining a process for transforming the quantized components QS by the zigzag scanner Scan.

The quantized components QS outputted from the quantization unit Q have a two-dimensional array as shown in FIG. 43, i.e., an array in which the quantized components QS arranged in the form of matrix on a two-dimensional frequency region Fr according to the size of the horizontal frequency component and the size of the vertical frequency component.

The zigzag scanner Scan carries out the process for scanning the quantized components QS in the two-dimensional array in a zigzag manner, as shown by arrows Y1 to Y7, to transform the quantized components QS into quantized components Coef in a one-dimensional array. That is, this scanning process sets a predetermined order along the scanning course, with respect to the plural quantized components QS in the two-dimensional array.

The run calculator RunCal calculates the number of successive zero coefficients on the basis of the quantized components Coef outputted from the zigzag scanner Scan, and outputs a run value Run indicating the calculated number. The level calculator LevCal calculates a value of a non-zero coefficient following the successive zero coefficients, on the basis of the quantized components Coef outputted from the zigzag scanner Scan, and outputs a level value indicating the calculated value. Here, the run calculator RunCal outputs a specific value EOB (End of Block) when detecting the highest frequency component (the last non-zero coefficient) in a target block to be processed, to inform that subsequent higher frequency components have all zero value.

Further, the run-level encoder RunLevEnc obtains a code number Code corresponding to a pair of the level value Lev and the run value Run on the basis of the outputs from the run calculator RunCal and the level calculator LevCal, according to a code table or arithmetic operation. The variable length coder VLC encodes the code number Code that is obtained by the converter RunLevEnc, i.e., assigns a code word (bit string) to the code number to generate a coded stream Str0.

FIG. 42 shows an example of a code table that is employed by the run-length encoding unit RLE0c. The code table (first coding table) T1 shown in FIG. 42 shows a code table corresponding to DC components of a color-difference signal that is compliant with a draft H.26L standard (TML8) that is now being planned.

This code table T is composed of a regularly generable part including code numbers corresponding to pairs of level values and run values which can be calculated according to an arithmetic operation using level values and run values (regularly build VLC), and an irregular part including code numbers corresponding to pairs of level values and run values which cannot be calculated by the arithmetic operation (table look up VLC). Further, a bit string (not shown) is assigned to each code number Code as a code word in a one-to-one relationship. A shorter code word is assigned to a code number Code having a smaller value.

Next, a conventional decoding apparatus corresponding to the image coding apparatus 201c will be described.

FIG. 40 is a block diagram illustrating an image decoding apparatus 202c that employs a conventional run-length decoding unit RLD0.

This image decoding apparatus 202c decodes the coded stream Str0c that is outputted from the conventional image coding apparatus 201c shown in FIG. 39.

The image decoding apparatus 202c decodes quantized coefficients using the run value and the level value, as the image decoding apparatus 202b in FIG. 36, while this image decoding apparatus 202c does not carry out variable length decoding of the run value and the level value separately like the image decoding apparatus 202b, but carries out variable length decoding of a pair comprising the run value and the level value (run-level pair).

To be more specific, the image decoding apparatus 202c has a run-length decoding unit RLD0c that subjects the coded stream Str0c outputted from the image coding apparatus 201c to a run-length decoding process using a run-level pair comprising a run value and a level value. The image decoding apparatus 202c further has, as the image decoding apparatus 202b, an inverse quantization unit IQ for subjecting outputs (decoded quantized components) DQS from the run-length decoding unit RLD0c to an inverse quantization process; a inverse frequency transformation unit ITrans for subjecting outputs (decoded frequency components) ITransS from the inverse quantization unit IQ to an inverse frequency trans formation process; and a deblocking unit DeBlk for generating a decoded image signal Vout corresponding to each picture on the basis of outputs (decoded pixel value components) DBlkS from the inverse frequency transformation unit ITrans.

Next, its operation will be described.

In the image decoding apparatus 202c, the run-length decoding unit RLD0c carries out the inverse of the operation of the run-length encoding unit RLE0c. To be more specific, the run-length decoding unit RLD0c subjects the coded stream Str0c to a run-length decoding process to output decoded quantized components DQS. The inverse quantization unit IQ carries out the inverse operation to the quantization unit Q, i.e., an operation of inversely quantizing the decoded quantized components DQS with referring to a quantization parameter QP to output decoded frequency components ITransS. The inverse frequency transformation unit ITrans carries out the inverse operation to the frequency transformation unit Trans, i.e., an operation of subjecting the decoded frequency components ITransS to inverse DCT or inverse Wavelet transformation, to reconstitute a decoded pixel value signal (decoded blacked image signal) DBlkS corresponding to each block. The deblocking unit DeBlk integrates the image pixel value components for the respective blocks, and outputs a decoded image signal Vout corresponding to each picture (frame).

Next, the run-length decoding unit RLD0c will be specifically described.

FIG. 41 is a block diagram for explaining a specific construction of the run-length decoding unit RLD0c.

This run-length decoding unit RLD0c has a variable length decoder VLD for subjecting the coded stream Str0c to a variable length decoding process to obtain a code number Code corresponding to each code (code word) included in the coded stream Str0c; a run-level detector RunLevDec for detecting a pair of a level value Lev and a run value Run, corresponding to the code number Code; and an inverse zigzag scanner IScan for reconstituting decoded quantized Components DQS in a two-dimensional array from decoded quantized components in a one-dimensional array, which are represented by the level values Lev and the run values Run, on the basis of the pairs of the level values Lev and the run values Run.

Next, its operation will be described.

In this run-length decoding unit RLD0c, the variable length decoder VLD decodes the coded stream Str0c, and outputs a code number Code corresponding to a code word (bit string) according to the inverse operation to the variable length coder VLC. The run-level detector RunLevDec refers to a code table or performs an arithmetic operation to output a pair of a level value Lev and a run value Run, corresponding to the code number Code, according to the inverse operation to the run-level encoder RunLevEnc. The inverse zigzag scanner IScan reconstitutes decoded quantized components DQS in a two-dimensional array from quantized components in a one-dimensional array which are represented by the pairs of the level values Lev and the run values Run according to the inverse operation to the zigzag scanner Scan, and outputs the decoded quantized components DQS to the inverse quantization unit IQ.

Japanese Published Patent Application No. Hei. 6-237184 discloses a run-length encoding method in which plural coefficients in a predetermined order are coded using a run value Run that indicates the number, of quantized components whose values are zero (zero coefficients) Coef, and a level value Lev that indicates a value of a quantized component whose value is not zero (non-zero coefficient) Coef, following the zero coefficients.

Japanese Patent No. 3144456 (corresponding to Japanese Published Patent Application No. Hei. 8-79088) discloses a method by which a variable length coding table (VLC table) is changed according to the value of a differential motion vector value when the differential motion vector value is coded using a variable length coding table in a method for predictively coding digital video data.

Further, an arithmetical coding is known as another method by which the pixel values are variable-length coded, in which variable length coding is performed according to an arithmetic operation by using probability in which the pixel value may take a predetermined value. According to the arithmetical coding, a code is derived from the probability, so that a probability table in which probabilities corresponding to individual situations are described corresponds to the VLC table. Here, "All about MPEG-4" (first edition, first print, published Sep. 30, 1998, written and edited by Miki Sukeichi, pp. 69-73, Kogyo Chosakai Publishing Co., Ltd.) describes a method by which pixel values of pixels corresponding to a coding target are subjected to arithmetic coding by changing a probability table on the basis of a prediction method (context) for a coding target pixel which are predicted from pixel values of the surrounding pixels.

The above-mentioned coding unit RLE0a of the conventional image coding apparatus 201a performs variable length coding for plural quantized coefficients which are obtained by quantizing frequency components of image data, for each predetermined processing unit (block). This coding unit employs a predetermined code table that indicates correspondences between numerical value information showing the size of each quantized coefficient and a code (code word). In the variable length coding process by the coding unit, redundant information included in the quantized coefficient (data to be processed) cannot be removed sufficiently and, thus, the compression rate may be further improved.

Also in the run-length encoding unit that carries out variable length coding of plural quantized coefficients using a run value that indicates the number of quantized components whose values are zero (zero coefficients) Coef, and a level value that indicates a value of a quantized component whose value is not zero (non-zero coefficient) Coef, following the zero coefficients, like the coding units RLE0b or RLE0c in the conventional image coding apparatus 201b or 201c, redundant information included in the quantized coefficients in the variable length coding process is not sufficiently removed.

Further, the decoding unit RLD0a of the conventional image decoding apparatus 202a or the run-length decoding unit RLD0b or RLD0c of the conventional image decoding apparatus 202b or 202c corresponds to a coding unit which cannot sufficiently remove redundant information included in the quantized coefficients in the variable length coding process for the quantized coefficients.

Further, as for the method by which a variable length coding table (VLC table) is changed according to the value of a differential motion vector value when the differential motion vector value is coded using a variable length coding table in a method for predictively coding digital video data, an effective change of the coding table in a variable length coding process for data having characteristics that plural zero coefficients successively follow, like the quantized coefficients which are obtained by quantizing frequency components of an image signal has not been known.

The present invention is made to solve the above-mentioned problems, and this invention has for its object to provide a variable length coding method and a variable length decoding method, which can remove redundant information included in target data (quantized coefficients) for a variable length coding process, more effectively according to characteristics of the quantized coefficients and states of a coding process for the quantized components, thereby further increasing a compression rate of an image signal or the like.

SUMMARY OF THE INVENTION

According to the present invention, there is provided a variable length coding method for coding coefficient data which is composed of plural coefficients including: a coding step for subjecting the respective coefficients to a coding process of transforming the coefficient data into coded data which is composed of plural codes, by using plural code tables indicating correspondences between the values of the coefficients and codes, and this coding step includes: a code table selection step for selecting the code table in accordance with at least one of information about an coded coefficient which has been coded, and a parameter relating to encoding process of the coefficients; and a code assignment step for assigning a code to a uncoded coefficient which has not yet been coded, using the selected code table. Therefore, redundant information included in coefficient data which are to be subjected to the variable length coding process is effectively deleted by selection of a code table according to characteristics of coefficients that constitute the coefficient data or states of a coding process for the coefficients, thereby greatly increasing a coding efficiency of the variable length coding process for image signals or the like.

According to the present invention, in the above-mentioned variable length coding method, the coefficients are obtained by quantizing frequency components of image data in accordance with a quantization step corresponding to the image data, and in the code table selection step, the code table that is used in the code assignment step is selected according to a value of the quantization step. Therefore, a code table that is adapted to the value of the quantization step and maximizes the coding efficiency can be always employed.

According to the present invention, in the above-mentioned variable length coding method, according to the coding process for the coefficients, a run value that indicates a number of successive zero coefficients whose values are zero, and a level value that indicates a value of a non-zero coefficient following the zero coefficients are each transformed into a code, in the code table selection step, at least one of a first selection process for selecting a code table from plural code tables that indicate correspondences between the run value and the code according to the value of the quantization step, and a second selection process for selecting a code table from plural code tables that indicate correspondences between the level value and the code according to the value of the quantization step is carried out, and in the code assignment step, a code is assigned to at least one of a run value and a level value corresponding to an uncoded coefficient which has not been coded yet, on the basis of the selected code table. Therefore, the assignment of codes to at least one of run values and level values can be performed always by using a code table that is adapted to the value of the quantization step and minimizes the total number of bits corresponding to the assigned codes.

According to the present invention, in the above-mentioned variable length coding method, according to the coding process for the coefficients, a run-level pair comprising a run value that indicates a number of successive zero coefficients whose values are zero and a level value that indicates a value of a non-zero coefficient following the zero coefficients is transformed into a code, in the code table selection step, a code table is selected from plural code tables that indicate correspondences between the run-level pair and the code according to the value of the quantization step, and in the code assignment step, a code is assigned to a run-level pair corresponding to an uncoded coefficient which has not yet been coded, on the basis of the selected code table. Therefore, the assignment of codes to run-level pairs can be performed always by using a code table that is adapted to the value of the quantization step and minimizes the total number of bits corresponding to the assigned codes.

According to the present invention, in the above-mentioned variable length coding method, in the code table selection step, the code table that is used in the code assignment step is selected in accordance with the information about the already-processed coefficient which has been coded. Therefore, the coding process for quantized coefficients can be carried out always by using a code table that is adapted to the number of uncoded coefficients and maximizes the coding efficiency.

According to the present invention, in the above-mentioned variable length coding method, according to the coding process for the coefficients, a run value that indicates a number of successive zero coefficients whose values are zero, and a level value that indicates a value of a non-zero coefficient following the zero coefficients are transformed into a code respectively, in the code table selection step, at least one of a first selection process for selecting a code table from plural code tables that indicate correspondences between the run value and the code in accordance with information about a run value corresponding to the coded, and a second selection process for selecting a code table from plural code tables that indicate correspondences between the level value and the code in accordance with information about a level value corresponding to the coded coefficients is carried out, and in the code assignment step, a code is assigned to at least one of a run value and a level value corresponding to an uncoded coefficient, on the basis of the selected code table. Therefore, the assignment of codes to at least one of run values and level values can be performed always by using a code table that is adapted to the number of uncoded coefficients and maximizes the coding efficiency.

According to the present invention, in the above-mentioned variable length coding method, in the code table selection step, a code table is selected from plural code tables that indicate correspondences between the run value and the code according to a number of coded run values which have been coded, and in the code assignment step, a code is assigned to an uncoded run value which has not been coded yet, on the basis of the selected code table. Therefore, the assignment of codes to run values can be performed always by using a code table that is adapted to the number of not-yet-processed run values and maximizes the coding efficiency.

According to the present invention, in the above-mentioned variable length coding method, according to the coding process for the coefficients, a run-level pair comprising a run value that indicates a number of successive zero coefficients whose values are zero, and a level value that indicates a value of a non-zero coefficient following the zero coefficients is transformed into a code, in the code table selection step, a code table is selected from plural code tables that indicate correspondences between the run-level pair and the code in accordance with information about a run-level pair corresponding to a coded coefficient which has been coded, and in the code assignment step, a code is assigned to a run-level pair corresponding to an uncoded coefficient which has not yet been coded, on the basis of the selected code table. Therefore, the assignment of codes to run-level pairs can be performed always by using a code table that is adapted to the number of not-yet-processed coefficients and maximizes the coding efficiency.

According to the present invention, in the above-mentioned variable length coding method, the coefficients are obtained by quantizing frequency components of image data in accordance with a quantization step corresponding to the image data, and in the coding step, the coding process for the coefficients is carried out such that codes are assigned to plural coefficients that constitute the coefficient data from high frequency component of corresponding image data to low frequency component. Therefore, the total number of bits corresponding to codes which are assigned to the coefficients can be further reduced.

According to the present invention, in the above-mentioned variable length coding method, according to the coding process for the coefficients, a run-level pair comprising a run value that indicates a number of successive zero coefficients whose values are zero and a level value that indicates a value of a non-zero coefficient following the zero coefficients is transformed into a code, for each block that is composed of a predetermined number of coefficients, and in the code table selection step, a code table is selected front plural code tables that indicate correspondences between the run-level pair and the code according to a sum of a number of already-processed coefficients which have been subjected to the coding process in a target block that is an object of the coding process, and a number of uncoded non-zero coefficients which have not yet been coded in the target block, and in the code assignment step, a code is assigned to a run-level pair corresponding to an uncoded coefficient in the target block, on the basis of the selected code table. Therefore, a code table that does not include pairs of run values and level values which will never occur can be employed, thereby increasing the variable length coding efficiency.

According to the present invention, in the above-mentioned variable length coding method, according to the coding process for the coefficients, a run-level pair comprising a run value that indicates a number of successive zero coefficients whose values are zero and a level value that indicates a non-zero coefficient following the zero coefficients is transformed into a code, the coding step includes a code table processing step for regularly changing the correspondences between the run-level pair and the code in a first code table that indicates correspondence between the run-level pair and the corresponding code according to combinations of the run value and the level value which compose the run-level pair, on the basis of the first code table, thereby to form a second code table having different correspondences between the run-level pair and the code from the first code table, and in the code table selection step, one of the first and second code tables is selected in accordance with at least one of the information about the already-processed coefficient and the parameter relating to the generation of the coefficients. Therefore, one of the first and second code tables is adaptively selected as an optimum code table that is to be used when codes are assigned to pairs of run values and level values, whereby redundant information included in the target data to be processed can be effectively deleted. Accordingly, the compression rate for image signals or the like can be further improved, so that this variable length coding method is highly useful.

According to the present invention, in the above-mentioned variable length coding method, in the first and second code tables, shorter codes are made correspond adaptively to respective run-level pairs having smaller level values that compose the run-level pairs, and in the second code table, level values of run-level pairs to which shorter codes are made correspond are small on average as compared to the first code table. Therefore, this variable length coding method is useful when the quantization parameter for coefficients that constitute the target data to be processed is large.

According to the present invention, in the above-mentioned variable length coding method, in the first and second code tables, shorter codes are made correspond adaptively to respective run-level pairs having smaller run values that compose the run-level pairs, and in the second code table, run values of run-level pairs to which shorter codes are made correspond are small on average as compared to the first code table. Therefore, this variable length coding method is useful when the quantization parameter for the coefficients that constitute the target data to be processed is small.

According to the present invention, in the above-mentioned variable length coding method, according to the coding process for the coefficients, the transformation of run-level pairs into codes is carried out for each block that is composed of a predetermined number of coefficients, and in the code table processing step, the second code table is formed according to a number of already-processed coefficients which have been subjected to the coding process in a target block that is an object of the coding process. Therefore, a code table that does not include pairs comprising run values and level values which will never occur can be employed as the second code table, thereby further increasing the variable length coding efficiency.

According to the present invention, in the above-mentioned variable length coding method, in the code assignment step, the assignment of codes to run-level pairs is carried out from a run-level pair corresponding to a coefficient having a highest frequency component of image data, from high frequency component to low frequency component. Therefore, the increase in the variable length coding efficiency, obtained by using the code table that does not include pairs comprising run values and level values which will never occur as the second code table, can be made larger.

According to the present invention, in the above-mentioned variable length coding method, the second code table is formed by changing only correspondences which can be regularly operated, among the correspondences between the run-level pair and the code included in the first code table. Therefore, an arithmetic operation that is required for the formation of the second code table can be reduced.

According to the present invention, in the above-mentioned variable length coding method, the coefficients constituting the coefficient data are obtained by quantizing frequency components of image data, in accordance with a quantization step corresponding to the image data, and the code table selection step is a code table switching step for switching between the first code table and the second code table according to a value of the quantization step. Therefore, a code table that is adapted to the quantization step can be employed as the code table to be used in a variable length coding process for the coefficients that constitute the target data to be processed.

According to the present invention, in the above-mentioned variable length coding method, the code table selection step is a code table switching step for switching between the first code table and the second code table in accordance with a switch instruction signal, and in the coding step, coding of the switch instruction signal is carried out. Therefore, the code table to be used in the variable length coding process for the coefficients can be changed according to characteristics of the target data or the like.

According to the present invention, in the above-mentioned variable length coding method, according to the coding process for the coefficients, the transformation of run-level pairs into codes is carried out for each block that is composed of a predetermined number of coefficients, and in the code table processing step, the second code table is formed on the basis of a sum of a number of already-processed coefficients which have been subjected to the coding process in a target block that is an object of the coding process, and a number of uncoded non-zero coefficients which have not been coded yet in the target block. Therefore, a code table that does not include pairs of run values and level values which will never occur can be used as the second code table, thereby further increasing the variable length coding efficiency.

According to the present invention, there is provided a variable length coding apparatus that encodes coefficient data that is composed of plural coefficients including: a coding unit for subjecting the respective coefficients to a coding process of transforming the coefficient data into coded data which is composed of plural codes, by using plural code tables indicating correspondences between the values of the coefficients and codes, and this coding unit includes: a code table selection unit for selecting the code table in accordance with at least one of information about a coded coefficient which has been coded, and a parameter relating to encoding process of the coefficients; and a code assignment unit for assigning a code to an uncoded coefficient which has not yet been coded, using the selected code table. Therefore, redundant information included in coefficient data which are to be subjected to the variable length coding process is effectively deleted by selection of a code table according to characteristics of coefficients that constitute the coefficient data or states of the coding process for the coefficients, thereby greatly increasing the coding efficiency in the variable length coding process for image signals or the like.

According to the present invention, in the above-mentioned variable length coding apparatus, the coefficients are obtained by quantizing frequency components of image data in accordance with a quantization step corresponding to the image data, and the code table selection unit selects the code table that is to be used by the code assignment unit, according to a value of the quantization step. Therefore, a code table that is adapted to the value of the quantization step and maximizes the coding efficiency can be always used.

According to the present invention, in the above-mentioned variable length coding apparatus, the code table selection unit selects the code table that is to be used by the code assignment unit, in accordance with the information about the coded coefficient. Therefore, the coding process for quantized coefficients can be carried out always by using a code table is adapted to the number of not-yet-processed coefficients and maximizes the coding efficiency.

According to the present invention, in the above-mentioned variable length coding apparatus, according to the coding process for the coefficients, a run value that indicates a number of successive zero coefficients whose values are zero, and a level value that indicates a value of a non-zero coefficient following the zero coefficients are each transformed into a code, the code table selection unit selects a code table from plural code tables that indicate correspondences between the run value and the code, according to a number of coded run values to which codes have been assigned, and the code assignment unit assigns a code to an uncoded run value which has not been coded yet, on the basis of the selected code table. Therefore, the assignment of codes to run values can be performed always by using a code table that is adapted to the number of not-yet-processed run values and maximizes the coding efficiency.

According to the present invention, in the above-mentioned variable length coding apparatus, the coefficients are obtained by quantizing frequency components of image data, in accordance with a quantization step corresponding to the image data, and the coding unit carries out the coding process for the coefficients such that codes are assigned to the plural coefficients that constitutes the coefficient data from high frequency component to low frequency component. Therefore, the total number of bits corresponding to codes that are assigned to the coefficients can be further reduced.

According to the present invention, there is provided a storage medium that contains a program for executing a variable length coding process for coding coefficient data that is composed of plural coefficients, by a computer, and this program includes: a coding step for subjecting the respective coefficients to a coding process of trans forming the coefficient data into coded data which is composed of plural codes, by using plural code tables indicating correspondences between the values of the coefficients and codes, and further this coding step includes: a code table selection step for selecting the code table in accordance with at least one of information about a coded coefficient which has been coded, and a parameter relating to encoding process of the coefficients; and a code assignment step for assigning a code to an uncoded coefficient which has not yet been coded, using the selected code table. Therefore, a variable length coding process having a higher coding efficiency, which can effectively delete redundant information included in coefficient data as an object to be subjected to the variable length coding process by selection of a code table according to characteristics of coefficients constituting the coefficient data or states of the coding process for the coefficients, can be implemented by software.

According to the present invention, there is provided a variable length decoding method for decoding coded data that is composed of plural codes, obtained by performing variable length coding to coefficient data that is composed of plural coefficients, including: a decoding step for subjecting the respective codes to a decoding process of decoding the coded data to reconstitute the coefficient data which is composed of the plural coefficients, using plural code tables indicating correspondences between the values of the coefficients and the codes, and this decoding step includes: a code table selection step for selecting the code table in accordance with at least one of information about a decoded coefficient which has been decoded and a parameter relating to decoding process; and a value detection step for detecting the value corresponding to an undecoded code which has not yet been decoded, by using the selected code table. Therefore, a variable length decoding process corresponding to a variable length coding process having a higher coding efficiency, which can effectively delete redundant information included in coefficient data by changing a code table, to encode the coefficient data can be carried out.

According to the present invention, in the above-mentioned variable length decoding process, the coefficients are obtained by quantizing frequency components of image data in accordance with a quantization step corresponding to the image data, and in the code table selection step, the code table that is used in the valine detection step is selected according to a value of the quantization step. Therefore, a variable length decoding process corresponding to a variable length coding process that always employs a code table which is adapted to the value of the quantization step and maximizes the coding efficiency can be carried out.

According to the present invention, in the above-mentioned variable length decoding process, in the decoding process for the codes, a code is decoded to reconstitute to a run value that indicates a number of successive zero coefficients whose values are zero, and a level value that indicates a value of a non-zero coefficient following the zero coefficients, in the code table selection step, at least one of a first selection process for selecting a code table from plural code table that indicate correspondences between the run value and the code, according to the value of the quantization step, and a second selection process for selecting a code table from plural code tables that indicate correspondences between the level value and the code according to the value of the quantization step is carried out, and in the numerical value detection step, at least one of a run value and a level value corresponding to an undecoded which has not yet been decoded is detected, on the basis of the selected code table. Therefore, a variable length decoding process corresponding to a variable length coding process that performs the assignment of codes to at least one of run values and level values always by using a code table that is adapted to the value of the quantization step and minimizes the total number of bits corresponding to the assigned codes can be carried out.

According to the present invention, in the above-mentioned variable length decoding process, according to the decoding process for codes, a code is decoded to reconstitute a run-level pair comprising a run value that indicates a number of successive zero coefficients whose values are zero, and a level value that indicates a value of a non-zero coefficient following the zero coefficients, in the code table selection step, a code table is selected from plural code tables that indicate correspondences between the run-level pair and the code according to the value of the quantization step, and in the numerical value detection step, a run-level pair corresponding to an undecoded code which has undecoded is detected on the basis of the selected code table. Therefore, a variable length decoding process corresponding to a variable length coding process that performs the assignment of codes to run-level pairs always by using a code table that is adapted to the value of the quantization step and minimizes the total number of bits corresponding to the assigned codes can be carried out.

According to the present invention, in the above-mentioned variable length decoding process, in the code table selection step, the code table that is used in the numerical value detection step is selected in accordance with information about a decoded coefficient. Therefore, a variable length decoding process corresponding to a variable length coding process that encodes quantized coefficients always by using a code table that is adapted to the number of not-yet-processed coefficients and maximizes the coding efficiency can be carried out.

According to the present invention, in the above-mentioned variable length decoding method, according to the decoding process for the codes, the code is decoded to reconstitute a run value that indicates a number of successive zero coefficients whose values are zero, and a level value that indicates a value of a non-zero coefficient following the zero coefficients, respectively, in the code table selection step, at least one of a first selection process for selecting a code table from plural code tables that indicate correspondences between the run value and the code in accordance with information about an decoded run value, and a second selection process for selecting a code table from plural code tables that indicate correspondences between the level value and the code in accordance with information about an decoded level value is carried out, and in the value detection step, at least one of a run value and a level value corresponding to an undecoded code is detected on the basis of the selected code table. Therefore, a variable length decoding process corresponding to a variable length coding process that performs the assignment of codes to at least one of run values and level values always by using a code table that is adapted to the number of not-yet-processed coefficients and maximizes the coding efficiency can be carried out.

According to the present invention, in the above-mentioned variable length decoding method, in the code table selection step, a code table is selected from plural code tables that indicate correspondences between the run value and the code according to a number of decoded run values which have been already decoded, and in the value detection step, a run value corresponding to an undecoded code which has not yet been decoded is detected on the basis of the selected code table. Therefore, a variable length decoding process corresponding to a variable length coding process that performs the assignment of codes to run values always by using a code table that is adapted to the number of not-yet-processed run values and maximizes the coding efficiency can be carried out.

According to the present invention, in the above-mentioned variable length decoding method, according to the decoding process for codes, a code is decoded to reconstitute a run-level pair comprising a run value that indicates a number of successive zero coefficients whose values are zero, and a level value that indicates a number of non-zero coefficient following the zero coefficients, in the code table selection step, a code table is selected from plural code tables that indicate correspondences between the run-level pair and the code in accordance with information about a run-level pair that has been obtained by the decoding process, and in the numerical value detection step, a run-level pair corresponding to an undecoded code which has not been decoded yet is detected on the basis of the selected code table. Therefore, a variable length decoding-process corresponding to a variable length coding process that performs the assignment of codes to run-level pairs always by using a code table that is adapted to the number of not-yet-processed coefficients and maximizes the coding efficiency can be carried out.

According to the present invention, in the above-mentioned variable length decoding method, the coefficients are obtained by quantizing frequency components of image data in accordance with a quantization step corresponding to the image data, and in the decoding step, the decoding process for codes is carried out such that values corresponding to the codes are obtained from high frequency component to low frequency component. Therefore, a variable length decoding process corresponding to a variable length coding process that can further reduce the total number of bits corresponding to codes which are assigned to the coefficients can be carried out.

According to the present invention, in the above-mentioned variable length decoding method, according to the decoding process for the codes, a code is decoded to reconstitute a run-level pair comprising a run value that indicates a number of successive zero coefficients whose values are zero, and a level value that indicates a value of a non-zero coefficient following the zero coefficients, for each block that is composed of a predetermined coefficients comprising the coefficient data, in the code table selection step, a code table is selected from plural code tables that indicate correspondences between the run-level pair and the code according to a sum of a number of already-processed coefficients in a target block that is an object of the decoding process, which have been obtained by the decoding process for the target block, and a number of undecoded non-zero coefficient in the target block, which have not yet been obtained by the decoding process for the target block, and in the numerical value detection step, a run-level pair corresponding to an undecoded coefficient in the target block is detected on the basis of the selected code table. Therefore, a variable length decoding process corresponding to a variable length coding process that has a higher efficiency can be implemented by using a code table which does not include pairs comprising run values and level values which will never occur.

According to the present invention, in the above-mentioned variable length decoding method, according to the decoding process for the codes, a code that constitutes the coded data is decoded to reconstitute a run-level pair comprising a run value that indicates a number of successive zero coefficients whose values are zero, and a level value that indicates a value of a non-zero coefficient following the zero coefficients, the decoding step includes a code table processing step for regularly changing correspondences between the run-level pair and the code in a first code table that indicates correspondence between the run-level pair and the corresponding code according to combinations of a run value and a level value which compose the run-level pair, on the basis of the first code table, thereby to form a second code table having different correspondences between the run-level pair and the code from the first code table, and in the code table selection step, one of the first and second code tables is selected in accordance with at least one of the information about the already-processed coefficient and the parameter relating to the generation of the coefficients. Therefore, one of the first and second code tables is adaptively selected as an optimum code table that is to be used when codes are transformed into pairs of run values and level values. Accordingly, a variable length decoding process corresponding to a variable length coding process that effectively delete redundant information included in target data to be processed is satisfactorily carried out, so that this variable length decoding method is highly useful.

According to the present invention, in the above-mentioned variable length decoding method, in the first and second code tables, shorter codes are made adaptively correspond to respective run-level pairs having smaller level values that compose the run-level pairs, and in the second code table, level values of run-level pairs to which shorter codes are made correspond are small on average as compared to the first code table. Therefore, this variable length decoding method is effective in cases where a quantization parameter relating to coefficients that constitute the target data to be processed is large.

According to the present invention, in the above-mentioned variable length decoding method, in the first and second code tables, shorter codes are made adaptively correspond to respective run-level pairs having smaller run values that compose the run-level pairs, and in the second code table, run values of run-level pairs to which shorter codes are made correspond are small on average as compared to the first code table. Therefore, this variable length decoding method is effective in cases where the quantization parameter relating to coefficients that constitute the target data to be processed is small.

According to the present invention, in the above-mentioned variable length decoding method, according to the decoding process for the codes, the reconstitution of a run-level pair from a code is performed for each block that is composed of a predetermined number of coefficients which compose the coefficient data, and in the code table processing step, the second code table is formed according to a number of already-processed coefficients which have been obtained by the decoding process in a target block that is an object of the decoding process. Therefore, a code table that does not include pairs of run values and level values which will never occur can be employed as the second code table, whereby a variable length decoding process corresponding to a variable length coding process that has a higher efficiency can be implemented.

According to the present invention, in the above-mentioned variable length decoding method, in the numerical value detection step, the detection of a run-level pair corresponding to the code is performed from a run-level pair having a highest frequency component of image data, from high frequency component to low frequency component. Therefore, a code table that does not include pairs of run values and level values which will never occur can be employed as the second code table, whereby a variable length decoding process corresponding to a variable length coding process that increases the compression rate more effectively can be implemented.

According to the present invention, in the above-mentioned variable length decoding method, the second code table is formed by changing only correspondences which can be regularly operated, among correspondences between the run-level pair and the code included in the first code table. Therefore, an arithmetic operation that is required for formation of the second code table can be reduced.

According to the present invention, in the above-mentioned variable length decoding method, the coefficients constituting the coefficient data are obtained by quantizing frequency components of image data, in accordance with a quantization step corresponding to the image data, and in the code table selection step, switching between the first code table and the second code table is performed according to a value of the quantization step. Therefore, a code table that is suitable for the quantization step can be employed as the code table which is to be used in the variable length decoding process for coefficients constituting the target data to be processed.

According to the present invention, in the above-mentioned variable length decoding method, the code table selection step includes a code table switching step for switching between the first code table and the second code table in accordance with a switch instruction signal, and in the decoding step, decoding of the switch instruction signal is carried out. Therefore, a code table to be employed in the variable length decoding process can be switched according to characteristics of target data to be processed or the like.

According to the present invention, in the above-mentioned variable length decoding method, according to the decoding process for the codes, the reconstitution of a run-level pair from a code is performed for each block that is composed of a predetermined number of coefficients which compose the coefficient data, and in the code table processing step, the second code table is formed according to a sum of a number of already-processed coefficients in a target block that is an object of the decoding process, which have been obtained by the decoding process for the target block, and a number of undecoded non-zero coefficients in the target block, which have not yet been obtained by the decoding process for the block. Therefore, a code table that does not include pairs of run values and level values which will never occur is employed as the second code table, whereby a variable length decoding process corresponding to a variable length coding process having a much higher efficiency can be implemented.

According to the present invention, there is provided a variable length decoding apparatus that decodes coded data that is composed of plural codes, obtained by performing variable length coding to coefficient data that is composed of plural coefficients, including: a decoding unit for subjecting the respective codes to a decoding process for decoding the coded data to reconstitute the coefficient data that is composed of the plural coefficients, using plural code tables indicating correspondences between the values of the coefficients and codes, and this decoding unit includes: a code table selection unit for selecting a code table from plural code tables in accordance with at least one of information about a decoded coefficient which has been decoded and a parameter relating to decoding process of the coefficients; and a value detection unit for detecting the value corresponding to an undecoded code which has not yet been decoded, by using the selected code table. Therefore, a variable length decoding process corresponding to a variable length coding process having a higher coding efficiency, which effectively deletes redundant information in coefficient data by changing a code table, to encode the coefficient data can be carried out.

According to the present invention, in the above-mentioned variable length decoding apparatus, the coefficients are obtained by quantizing frequency components of image data in accordance with a quantization step corresponding to the image data, and the code table selection unit selects the code table that is used by the numerical value detection unit, according to a value of the quantization step. Therefore, a variable length decoding process corresponding to a variable length coding process that always employs a code table which is adapted to the value of the quantization step and maximizes the coding efficiency can be carried out.

According to the present invention, in the above-mentioned variable length decoding apparatus, the code table selection unit selects the code table that is used by the numerical value detection unit, in accordance with information about a decoded coefficient. Therefore, a variable length decoding process corresponding to a variable length coding process which encodes quantized coefficients always by using a code table that is adapted to the number of undecoded coefficients and maximizes a coding efficiency can be carried out.

According to the present invention, in the above-mentioned variable length decoding apparatus, according to the decoding process for the codes, the code is decoded to reconstitute a run value that indicates a number of successive zero coefficients whose values are zero, and a level value that indicates a value of a non-zero coefficient following the zero coefficients, respectively, the code table selection unit selects a code table from plural code tables that indicate correspondences between the run value and the code, according to a number of decoded run values, and the value detection unit detects a run value corresponding to a decoded code, on the basis of the selected code table. Therefore, a variable length decoding process corresponding to a variable length coding process which performs the assignment of codes to run values always by using a code table that is adapted to the number of not-yet-processed run values and maximizes the coding efficiency can be carried out.

According to the present invention, in the above-mentioned variable length decoding apparatus, the coefficients are obtained by quantizing frequency components of image data in accordance with a quantization step corresponding to the image data, and the decoding unit carries out the decoding process for the codes such that the value corresponding to the codes is obtained from high frequency component to low frequency component. Therefore, a variable length decoding process corresponding to a variable length coding process that can further reduce the total number of bits corresponding to codes assigned to the coefficients can be carried out.

According to the present invention, there is provided a storage medium that contains a program for executing a variable length decoding process for decoding coded data that is composed of plural codes, obtained by performing variable length coding to coefficient data that is composed of plural coefficients, by a computer, and this program includes a decoding step for subjecting the respective codes to a decoding process of decoding the coded data to reconstitute the coefficient data which is composed of the plural coefficients, using plural code tables indicating correspondences between the value of the coefficients and codes, and further this decoding step includes: a code table selection step for selecting the code table in accordance with at least one of information about a decoded coefficient which has been decoded and a parameter relating to decoding process of the coefficients; and a value detection step for detecting the value corresponding to an undecoded code which has not yet been decoded, by using the selected code table. Therefore, a variable length decoding process corresponding to a variable length coding process having a higher coding efficiency, which can effectively delete redundant information included in coefficient data by changing a code table, to encode the coefficient data can be implemented by software.

BRIEF DESCRIPTION OF THE DRAWINGS

FIG. 4(a) is a flowchart showing a variable length coding process for a level value, and FIG. 4(b) is a code table that is used in the variable length coding process for the level value.

FIG. 5(a) is a flowchart showing a variable length coding process for a run value, and FIG. 5(b) is a code table that is used in the variable length coding process for the ran value.

FIGS. 6(a) and 6(b) are diagrams showing the total number of bits corresponding to codes which are assigned to level values (a quantization parameter is relatively small) by the variable length coder LevVLC in a case where a code table L2 is employed (FIG. 6(a)), and in a case where a code table L1 is employed (FIG. 6(b)), respectively.

FIGS. 7(a) and 7(b) are diagrams showing the total number of bits corresponding to codes which are assigned to level values (a quantization parameter is relatively large) by the variable length coder LevVLC in a case where the code table L2 is employed (FIG. 7(a)), and in a case where the code table L1 is employed (FIG. 7(b)), respectively.

FIGS. 8(a)-8(c) are diagrams showing the total number of bits corresponding to codes which are assigned to run values by the variable length coder RVLC in a case where a specific code table is employed (FIG. 8(a)), a case where change of a code table and reordering of run values are performed (FIG. 8(b)), and a case where only change of a code table is performed (FIG. 8(c)); respectively.

FIG. 11(a) is a flowchart showing a variable length decoding process for reconstituting a level value, and FIG. 11(b) is a code table that is employed in the variable length decoding process.

FIGS. 12(a) and 12(b) are diagrams for explaining a variable length decoding process by a variable length decoder RVLD: FIG. 12(a) is a flowchart showing a variable length decoding process for reconstituting a run value, and FIG. 12(b) is a code table that is employed in the variable length decoding process.

FIGS. 15(a) and 15(b) are diagrams showing examples T2a (FIG. 15(a)) and T2b (FIG. 15(b)) of a code table (second code table) that is formed by the run-length encoding unit RLE2 according to the third embodiment.

FIGS. 16(a)-16(c) are diagrams showing other examples T2c (FIG. 16(a)), T2d (FIG. 16(b)), T2e (FIG. 16(c)) of the code table (second code table) that is formed by the run-length encoding unit RLE2 according to the third embodiment.

FIGS. 24(a)-24(c) are diagrams showing examples Ta (FIG. 24(a)), Tb (FIG. 24(b)), and Tc (FIG. 24(c)) of a variable-length code table that is employed by the run-length encoding unit RLE3 according to the fifth embodiment and the run-length decoding unit RLD3 according to the sixth embodiment.

FIG. 30 is a block diagram illustrating a conventional image coding apparatus 201a.

FIG. 31 is a block diagram for explaining a coding unit RLE0a that constitutes the conventional image coding apparatus 201a.

FIG. 32 is a block diagram for explaining conventional decoding apparatus 202a corresponding to the conventional image coding apparatus 201a.

FIG. 33 is a block diagram for explaining a decoding unit RLD0a that constitutes the conventional image decoding apparatus 202a.

BEST MODE FOR CARRYING OUT THE INVENTION

Initially, fundamental principles of the present invention will be described.

Generally, when the quantization step is rough, quantized components have smaller absolute values. Then, the run (the length of successively continuing zero coefficients) gets longer, and accordingly the level value (the value of a non-zero coefficient) has a smaller absolute value. On the contrary, when the quantization step is fine, the quantized components have larger absolute values. Therefore, the run gets shorter and accordingly the level value has a larger absolute value.

Further, when variable length coding of many quantized components has been already completed in an object block to be processed and the number of quantized components which are uncoded is small, a run value that exceeds the number of uncoded quantized components never occurs. Thus, when pairs of these run values and level values are removed, the coding efficiency is increased.

From this point of view, the present invention changes a code table indicating correspondences between numerical value information that shows the size of a quantized coefficient and a code, according to a state of a variable length coding process or a variable length decoding process for quantized coefficients and a parameter associated with generation of quantized coefficients (quantization parameter), thereby effectively removing redundant information included in target data (quantized coefficient) of the variable length coding process.

For example, the change of the code table is carried out by selecting either a code table (first code table) that is employed in the conventional variable length coding or decoding process, or a second code table that is formed on the basis of the first code table and optimized for the data to be processed, on the basis of a processing state of quantized coefficients. It is unnecessary to form the second code table always on the basis of the first code table, but any code table that is adapted for processing target data may be selected as a code table.

Hereinafter, embodiments of the present invention will be described with reference to FIGS. 1 to 25.

Embodiment 1

Figure 1:
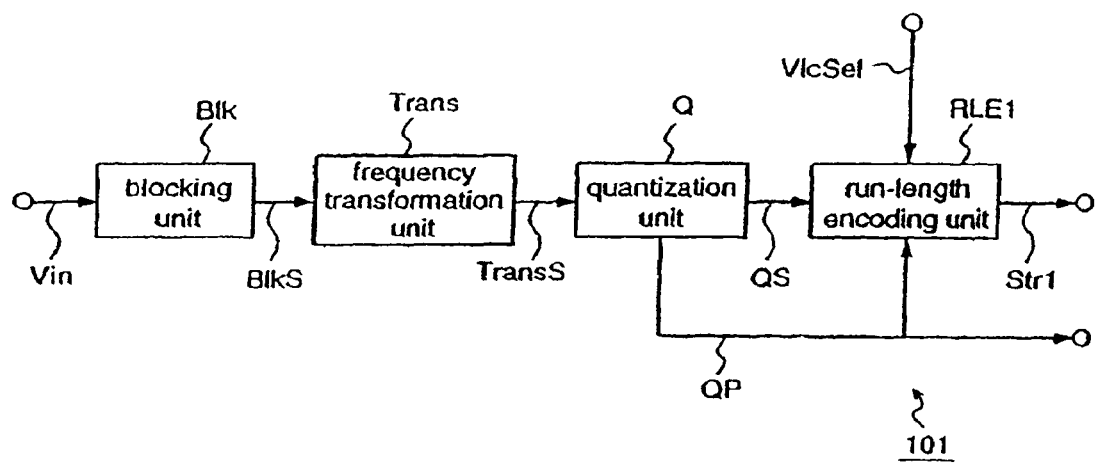
FIG. 1 is a block diagram for explaining an image coding apparatus 101 according to a first embodiment of the present invention.

FIG. 1 is a block diagram for explaining an image coding apparatus according to a first embodiment of the present invention.

Figure 34:
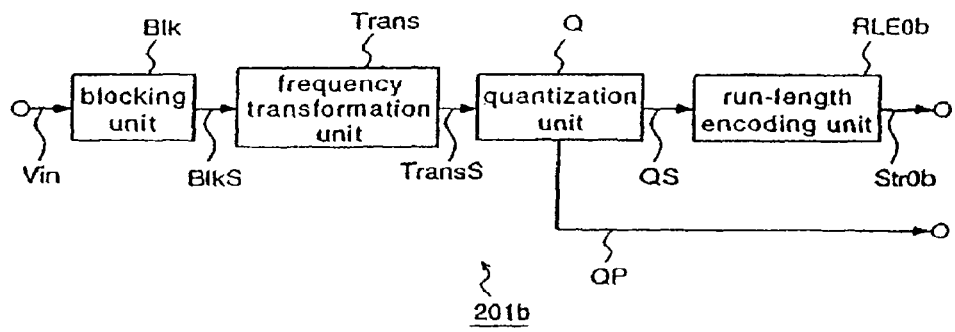
FIG. 34 is a block diagram illustrating an image coding apparatus 201b that performs conventional run-length encoding.

This image coding apparatus 101 according to the first embodiment has, in place of the run-length encoding unit RLE0b in the conventional image coding apparatus 201b shown in FIG. 34 which subjects an output (quantized components) QS from the quantization unit Q to a variable length coding process and outputs a coded stream Str0b, a run-length encoding unit RLE1 for subjecting the output QS from the quantization unit Q to a variable length coding process on the basis of a quantization parameter QP and a VLC selection signal VlcSel, and outputs a coded stream Str1.

Here, the quantization parameter QP is a parameter that indicates a value of a quantization step, and the quantization step is approximately proportional to the quantization parameter QP. To be more specific, when the quantization parameter QP is larger, quantized components have smaller absolute values, then zero run of the quantized components (the length of successively continuing components whose values are zero) gets longer, and a level value has a smaller absolute value.

Figure 2:
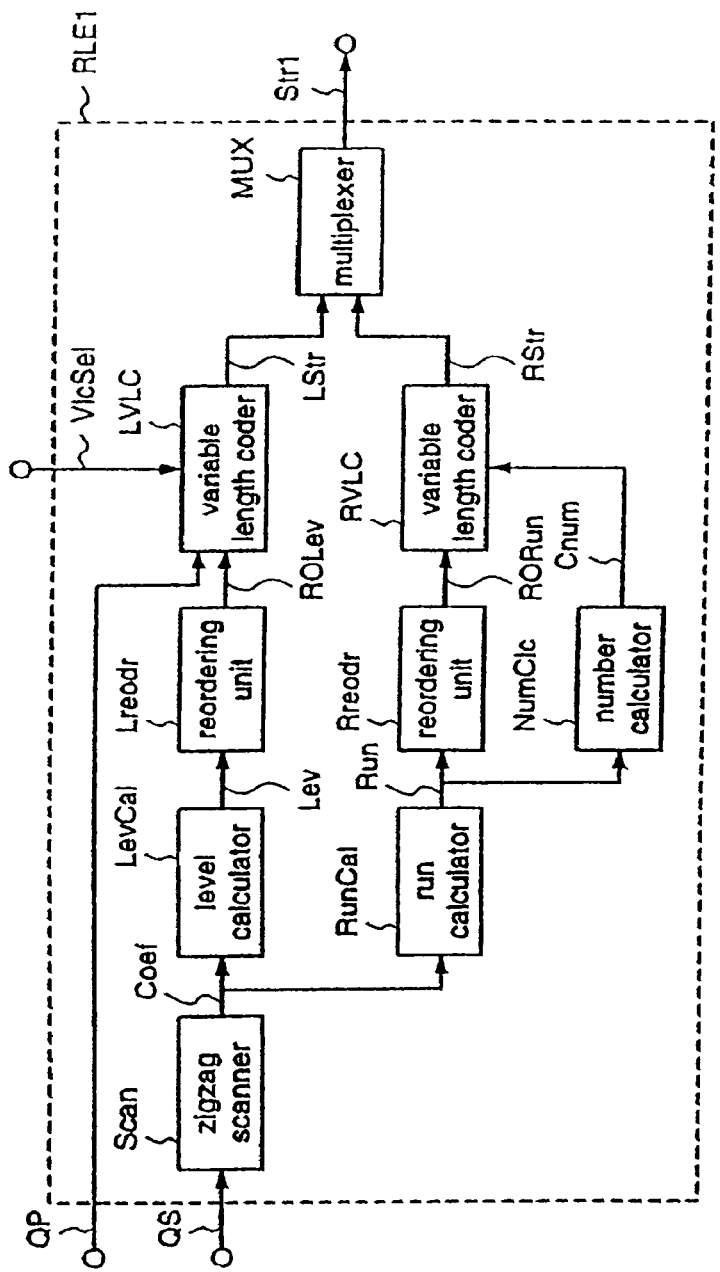
FIG. 2 is a block diagram illustrating a run-length encoding unit RLE1 that constitutes the image coding apparatus 101 according to the first embodiment.
Figure 3:
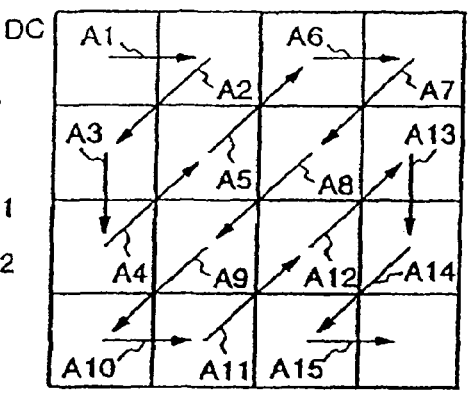
FIGS. 3(a)-3(d) are diagrams for explaining zigzag scanning by the run-length encoding unit RLE1.
FIGS. 3(e) and 3(f) are diagrams for explaining reordering of run values and level values.
Figure 4:
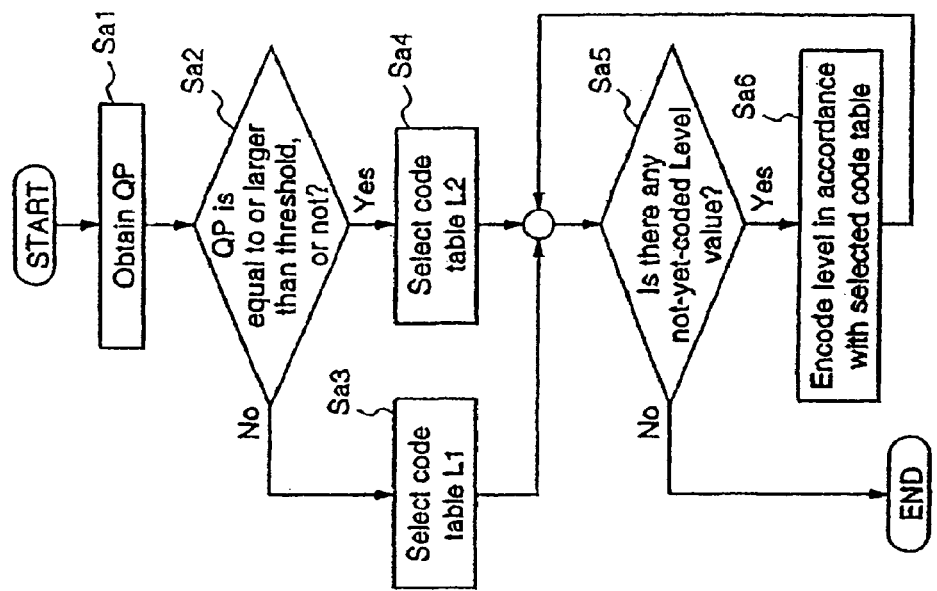
FIGS. 4(a) and 4(b) are diagrams for explaining processing in a variable length coder LVLC of the run-length encoding unit RLE1.
Figure 5:
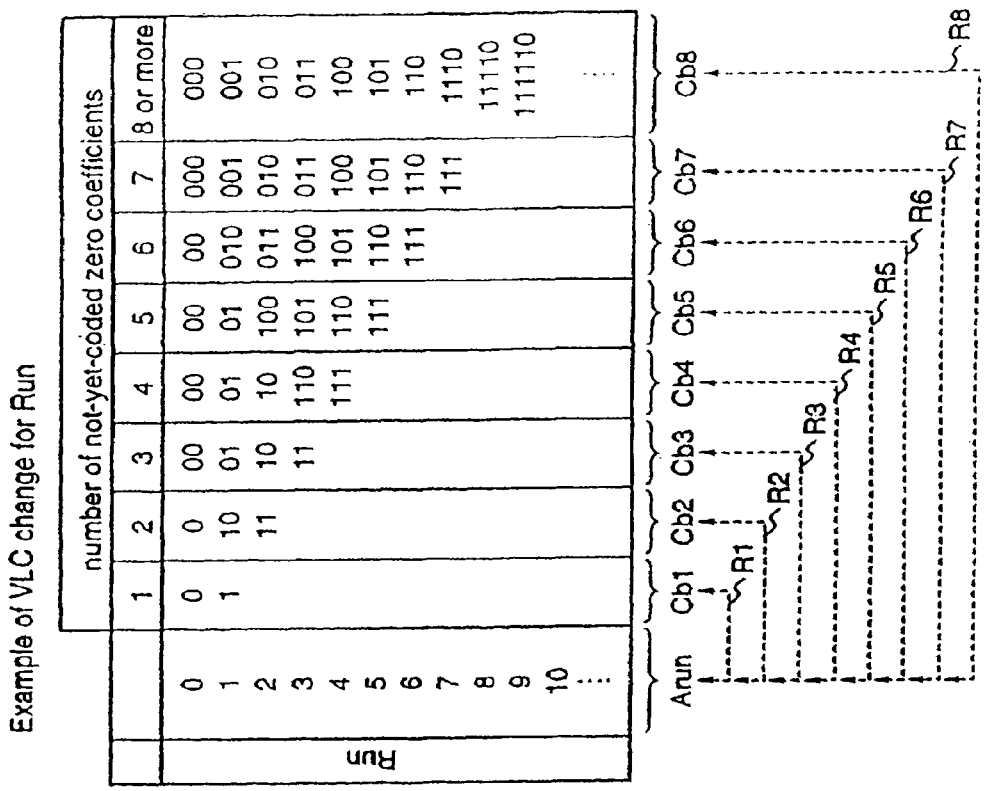
FIGS. 5(a) and 5(b) are diagrams for explaining processing in a variable length coder RVLC of the run-length encoding unit RLE1.
Figure 5:
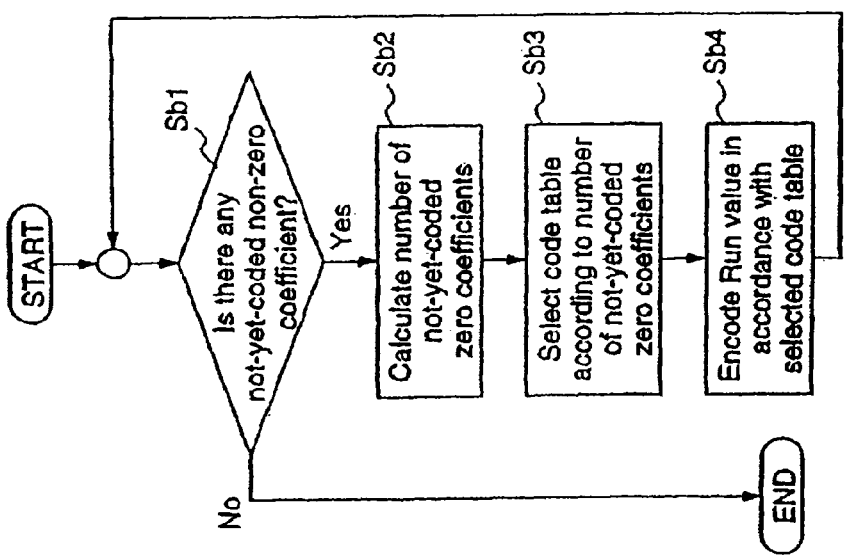

FIG. 2 is a block diagram for explaining a specific construction of the run-length encoding unit RLE1.

Figure 35:
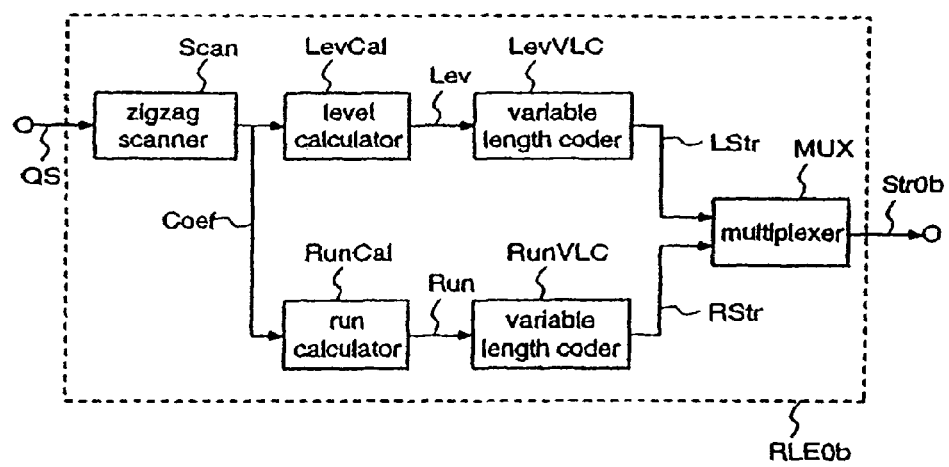
FIG. 35 is a block diagram for explaining a run-length encoding unit RLE0b that constitutes the conventional image coding apparatus 201b.

This run-length encoding unit RLE1 has, like the conventional run-length encoding unit RLE0b shown in FIG. 35, a zigzag scanner Scan for transforming an output from the quantization unit Q (quantized components) QS in a two-dimensional array, into quantized coefficients Coef in a one-dimensional array (i.e., a predetermined order); a run calculator RunCal for calculating the number of successive quantized components whose values are zero (zero coefficients) Coef and outputting a run value Run that indicates the number of successive zero coefficients; and a level calculator LevCal for calculating a value of a quantized component whose value is not zero (non-zero coefficient) Coef, following the zero coefficients, and outputting a level value Lev that indicates the value of the non-zero coefficient.

FIG. 3(a) shows a two-dimensional array of quantized components Q1 to Q16 corresponding to one block, and FIG. 3(b) shows a scanning course of the quantized components Q1 to Q16 in the zigzag scanner Scan by arrows A1 to A15. Here, a quantized component Q1 is obtained by quantizing DC components of frequency components corresponding to an image signal, and quantized components Q2 to Q16 are obtained by quantizing AC components of the frequency components corresponding to the image signal. FIG. 3(c) shows a one-dimensional array (coding order) of the quantized components Q1 to Q16, which is obtained by the zigzag scanning in the zigzag scanner Scan, and FIG. 3(d) shows a one-dimensional array of concrete numerical values which indicate the values of the quantized components Q1 to Q16.

The run-length encoding unit RLE1 further includes a reordering unit Lreodr for reordering level values Lev which are outputs from the level calculator LevCal; a reordering unit Rreodr for reordering run values Run which are outputs from the run calculator RunCal; and a number calculator NumClc for calculating the number Cnum of uncoded coefficients in a target block on the basis of the outputs from the run calculator RunCal and outputting the calculated number. FIG. 3(e) shows orders of run values and level values which are obtained from the numerical values of the quantized components having the arrangements as shown in FIGS. 3(c) and 3(d). FIG. 3(f) shows orders of the run values and the level values after the reordering.

The run-length encoding unit RLE1 further includes a variable length coder LVLC for subjecting an output ROLev from the reordering unit Lreodr to a variable length coding process on the basis of the quantization parameter QP and a selection signal VlSel, and outputting a code string (level value code string) LStr; a variable length coder RVLC for subjecting an output RORun from the reordering unit Rreodr to a variable length coding process on the basis of the number Cnum of the uncoded coefficients, and outputting a code string (run value code string) RStr; and a multiplexer MUX for multiplexing the code string LStr and the code string RStr for each block and outputting a multiplexed coded stream Str1.

FIGS. 4(a) and 4(b) are diagrams for explaining the variable length coding process by the variable length coder LVLC. FIG. 4(a) is a flowchart explaining the variable length coding process for a level value, and FIG. 4(b) is an explanatory diagram showing code tables which are employed in the variable length coding process for the level value.

FIG. 4(b) shows an arrangement Alev of level values (Level), an arrangement Ca1 of codes (code words) in a case where the quantization parameter QP is smaller than a threshold, and an arrangement Ca2 of codes (code words) in a case where the quantization parameter QP is equal to or larger than the threshold.

Here, a code table L1 is constituted by the arrangement Alev of the level values (Level) and the arrangement Ca1 of the codes (code words) in the case where the quantization parameter QP is smaller than the threshold. This code table L1 shows correspondence between the level value (Level) and the code in the case where the quantization parameter QP is smaller than the threshold. A code table L2 is constituted by the arrangement Alev of the level values (Level) and the arrangement Ca2 of the codes (code words) in the case where the quantization parameter QP is equal to or larger than the threshold. This code table L2 shows correspondence between the level value (Level) and the code in the case where the quantization parameter QP is equal to or larger than the threshold.

FIGS. 5(a) and (b) are diagrams for explaining the variable length coding process by the variable length coder RVLC. FIG. 5(a) is a flowchart for explaining a variable length coding process for a run value, and FIG. 5(b) is an explanatory diagram showing code tables which are employed in the variable length coding process for the run value.

FIG. 5(b) shows an arrangement Arun of run values (Run), an arrangement Cb1 of codes (code words) in a case where the number of uncoded zero coefficient is one, an arrangement Cb2 of codes (code words) in a case where the number of uncoded zero coefficients is two, an arrangement Cb3 of codes (code words) in a case where the number of uncoded zero coefficients is three, an arrangement Cb4 of codes (code words) in a case where the number of uncoded zero coefficients is four, an arrangement Cb5 of codes (code words) in a case where the number of uncoded zero coefficients is five, an arrangement Cb6 of codes (code words) in a case where the number of uncoded zero coefficients is six, an arrangement Cb7 of codes (code words) in a case where the number of uncoded zero coefficients is seven, and an arrangement Cb8 of codes (code words) in a case where the number of uncoded zero coefficients is eight or more.

Here, a code table R1 is constituted by the arrangement Arun of the run values (Run) and the arrangement Cb1 of codes (code words) in the case where the number of uncoded zero coefficients is one, and this code table R1 shows correspondences between the run value (Run) and the code in the case where the number of uncoded zero coefficients is one. Similarly, code tables R2, R3, R1, R5, R6, and R7 are constituted by the arrangement Arun of the run values (Run), and the arrangements Cb2, Cb3, Cb4, Cb5, Cb6, and Cb7 of codes (code words) in the cases where the numbers of uncoded zero coefficients are two, three, four, six, and seven, respectively, and show correspondence between the run value (Run) and the code in the cases where the numbers of uncoded zero coefficients are two, three, four, five, six, and seven, respectively. Further, a code table R8 is constituted by the arrangement Arun of the run values (Run), and the arrangement Cb8 of codes (code words) in the case where the number of uncoded zero coefficients is eight or more, and shows correspondence between the run value (Run) and the code in the case where the number of uncoiled zero coefficients is eight or more.

Next, its operation will be described.

Figure 30:
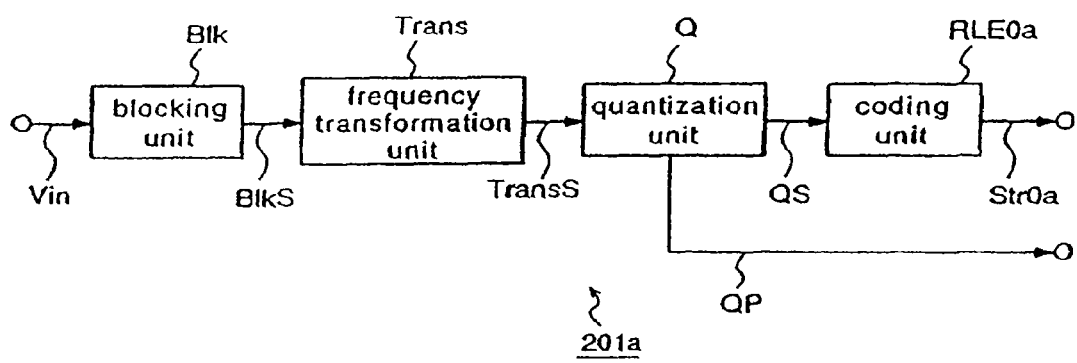
Figure 31:
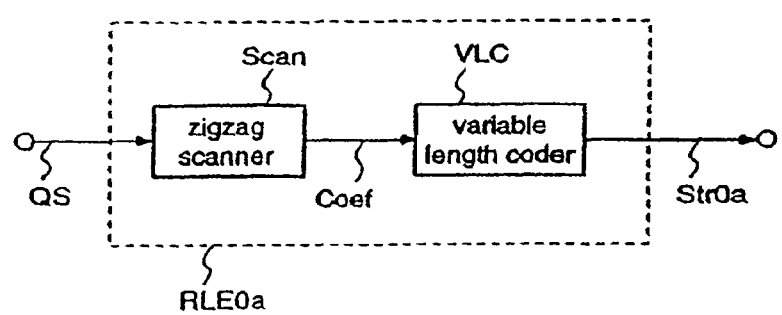

In the image coding apparatus 101 according to the first embodiment, the blocking unit Blk, the frequency transformation unit Trans, and the quantization unit Q operate in the same manners as those in the conventional image coding apparatus 201a (see FIG. 30) or image coding apparatus 201b (see FIG. 34).

More specifically, when an image signal Vin is inputted to the image coding apparatus 101a, the blocking unit Blk divides the inputted image signal Vin in block units, to generate image signals (pixel value components) BlkS corresponding to respective blocks. The frequency transformation unit Trans transforms the pixel value components BlkS into frequency components TransS according to DCT (Discrete Cosine Transformation) or Wavelet transformation. The quantization unit Q quantizes the frequency components TransS in a predetermined quantization step on the basis of a quantization parameter QP to output quantized components QS, as well as outputs the quantization parameter QP. The run-length encoding unit RLE1 subjects the quantized components QS to a variable length coding process, and outputs a coded stream Str1.

Hereinafter, the operation of the run-length encoding unit RLE1 will be specifically described.

The zigzag scanner Scan carries out zigzag scanning of the quantized components QS which are outputted from the quantization unit Q (i.e., plural quantized coefficients Q1 to Q16 in a two-dimensional array as shown in FIG. 3(a)), to transform the quantized components QS into quantized coefficients Coef. Here, the zigzag scanning of the quantized components QS is carried out by scanning the plural quantized components Q1 to Q16 in a two-dimensional array as shown in FIG. 3(a) along a course indicated by the arrows A1 to A15 in FIG. 3(b), to transform the array of the plural quantized coefficients Q1 to Q16 into a one-dimensional array (processing order) as shown in FIG. 3(c). Here, FIG. 3(d) shows an arrangement of concrete numerical values of the plural quantized coefficients Q1 to Q16 which has been subjected to the zigzag scanning (20, −10, 5, 0, 2, 0, 0, 0, 1, 0, 0, 0, −1, 0, 0, 1).

The run calculator RunCal calculates the number of successive zero coefficients on the basis of the quantized components Coef which are outputted from the zigzag scanner Scan, and outputs a run value Run indicating the calculated number. FIG. 3(e) shows specific run values which are successively outputted from the run calculator RunCal, according to an order in which the run values are outputted: (0, 0, 0, 1, 3, 3, 2). On the other hand, the level calculator LevCal calculates a value of a non-zero coefficient following the successive zero coefficients on the basis of the quantized components Coef outputted from the zigzag scanner Scan, and outputs a level value Lev indicating the calculated value. FIG. 3(e) shows specific level values which are successively outputted from the level calculator LevCal, according to an order in which the level values are outputted: (20, −10, 5, 2, 1, −1, 1).

The reordering unit Rreodr reorders the run values which have successively been outputted from the run calculator RunCal in a reverse order to how the run values have been outputted. FIG. 3(f) shows a changed order of the specific run values which have been reordered by the reordering unit Rreodr: (2, 3, 3, 1, 0, 0, 0). The number calculator NumClc calculates the number of uncoded coefficients on the basis of the run values Run which are outputted from the run calculator RunCal, and outputs the calculated number of uncoded coefficients (hereinafter, also referred to as uncoded coefficient number) Cnum. On the other hand, the reordering unit Lreodr reorders the level values which have successively been outputted from the level calculator LevCal in a reverse order to how the level values have been outputted. FIG. 3(f) shows a change order of the specific level values which have been reordered by the reordering unit Lreodr: (1, −1, 1, 2, 5, −10, 20).

The variable length coder RVLC subjects the run values RORun which have been reordered as the output from the reordering unit Rreodr, to a variable length coding process for assigning codes (code words) to the run values RORun with using plural code tables indicating correspondences between the run value and the code (code word), on the basis of the uncoded zero coefficient number Cum outputted from the number calculator NumClc, and outputs a run value code string RStr. On the other hand, the variable length coder LVLC subjects the level values ROLev which have been reordered as the output from the reordering unit Lreodr to a variable length coding process for assigning codes (code words) to the level values ROL, by using plural code tables indicating correspondences between the level value and the code (code word) on the basis the quantization parameter QP from the quantization unit Q and a selection signal VlcSel from the outside instructing selection of variable length coding, and outputs a level value code string LStr.

Then, the multiplexer MUX multiplexes the level value code string Lstr and the run value code string Rstr, block by block, and outputs a multiplexed coded stream Str1.

Here, the process for multiplexing the level value code string LStr and the run value code string RStr is carried out block by block, for example, in such manner that the code string RStr corresponding to all run values of a target block is followed by the code string LStr corresponding to all level values of the target block, or the code string LStr corresponding to all level values of the target block is followed by the code string RStr corresponding to all run values of the target block.

Hereinafter, the operation of the variable length coder LVLC will be specifically described with reference to FIGS. 4(a) and 4(b).

The variable length coder LVLC obtains the quantization parameter QP from the quantization unit Q (step Sa1), and determines whether the value of the obtained quantization parameter QP is equal to or larger than a threshold of the quantization parameter QP, which is held in the variable length coder LVLC (step Sa2).

When a result of this determination indicates that the value of the obtained quantization parameter QP is smaller than the threshold of the quantization parameter QP, the variable length coder LVLC selects the code table L1 that is constituted by the arrangement Alev of level values and the arrangement Ca1 of codes (code words) (see FIG. 4(b)) (step Sa3), while when the value of the obtained quantization parameter QP is equal to or larger than the threshold of the quantization parameter QP, selecting the code table L2 that is constituted by the arrangement Alev of level values and the arrangement Ca2 of codes (code words) (see FIG. 4(b)) (step Sa4).

Then, the variable length coder LVLC determines whether there is any uncoded level value Lev in a target block (step Sa5). When a uncoded level value Lev is included in the target block, the variable length coder LVLC carries out a process for coding the level value using the selected code table, i.e., a process for assigning a corresponding code to the level value (step Sa6), and thereafter carries out the process of step Sa5. On the other hand, when the result of the decision in step Sa5 indicates that there is no uncoded level value Lev in the target block, the variable length coder LVLC finishes the variable length coding process for the level values Lev.

Here, when the VLC selection signal VlcSel previously designates a variable length coding process using a specific code table, the variable length coder LVLC carries out a variable length coding process for the level values by using the specific code table, regardless of the value of the quantization parameter QP.

Next, the operation of the variable length coder RVLC will be specifically described with reference to FIGS. 5(a) and 5(b).

The variable length coder RVLC determines whether there is any uncoded non-zero coefficient in the target block on the basis of the output (the number of uncoded coefficients) Cnum from the number calculator NumClc (step Sb1). When a result of the determination indicates that there is a uncoded non-zero coefficient, the variable length coder RVLC calculates the number of uncoded zero coefficients in the target block on the basis of the output Cnum from the number calculator NumClc (step Sb2).

Then, the variable length coder RVLC selects a code table according to the calculated number of uncoded zero coefficients (step Sb3). To be more specific, the variable length coder RVLC selects the code table R1 that is constituted by the arrangement Arun of run values and the arrangement Cb1 of codes (code words) (see FIG. 5(b)) when the number of uncoded zero coefficients is one. Similarly, the variable length coder RVLC selects the code table R2 when the number of uncoded zero coefficients is two, the code table R3 when the number of the coefficients is three, and the code table R4 when the number of the coefficients is four. Further, the variable length coder RVLC selects the code table R5 when the number of the uncoded zero coefficients is five, the code table R6 when the number of the coefficients is six, and the code table R7 when the number of the coefficients is seven, respectively. Further, when the number of uncoded zero coefficients is eight or more, the variable length coder RVLC selects the code table R8.

Next, the variable length coder RVLC carries out a process for coding run values Run using the selected code table, i.e., a process for assigning corresponding codes to the run values (step Sb4), and then carries out the determination process of step Sb1.

Here, when the result of the determination in step Sb1 indicates that there is no uncoded non-zero coefficient, the variable length coder RVLC finishes the variable length coding process for the run values.

Next, a specific example in which a code table is selected on the basis of the quantization parameter in the variable length coding of the level values as described above, thereby to increase a coding efficiency will be described.

FIGS. 6(a) and 6(b) show the total number of bits corresponding to codes which are assigned to level values when the quantization parameter QP is relatively smaller, i.e., when outputs (level values) from the level calculator LevCal which have been reordered and are outputted from the reordering unit Lreodr are 1, −1, 1, 2, 5, −10, 20 as shown in FIG. 3(f).

When the quantization parameter QP is determined to be equal to or larger than a threshold and the code table L2 is employed, codes (code words) are assigned to respective level values as shown in FIG. 6(a), and the total number of bits corresponding to the assigned codes is 75 bits.

On the other hand, when the quantization parameter QP is determined to be smaller than the threshold and the code table L1 is employed, codes (code words) are assigned to respective level values as shown in FIG. 6(b), and the total number of bits corresponding to the assigned codes is 47 bits.

When the quantization parameter QP is relatively smaller, the frequency of occurrence of quantized components having larger values is higher. Thus, it is effective to select the code table L1 in which shorter codes are made correspond on average also to level values whose absolute values are relatively larger as compared to the code table L2 to increase the coding efficiency.

FIGS. 7(a) and 7(b) show the total number of bits corresponding to codes which are assigned to level values when the quantization parameter QP is relatively larger, i.e., when outputs (level values) from the level calculator LevCal which have been reordered and are outputted from the reordering unit Lreodr are 1, −1, 1, 1, 1, −2, 3, unlike in the case shown in FIG. 3(f).

When it is determined that the quantization parameter QP is equal to or larger than the threshold and the code table L2 is employed, codes (code words) are assigned to respective level values as shown in FIG. 7(a), and the total number of bits corresponding to the assigned codes is 15 bits.

On the other hand, when it is determined that the quantization parameter QP is smaller than the threshold and the code table L1 is employed, codes (code words) are assigned to the respective level values as shown in FIG. 7(b), and the total number of bits corresponding to the assigned codes is 17 bits.

As described above, when the value of the quantization parameter QP is relatively larger, the frequency of occurrence of quantization coefficients having larger values is lower. Thus, it is effective to select the code table L2 in which shorter codes are made intensively correspond to level values whose absolute values are relatively smaller as compared to the code table L1, to increase the coding efficiency.

FIGS. 8(a)-8(c) show the total number of bits corresponding to codes which are assigned to run values outputted from the run calculator RunCal when the run values are 0, 0, 0, 1, 3, 3, 2 as shown in FIG. 3(e).

When the reordering of run values as in the run-length encoding unit RLE1 and the change of the code table is not performed but the code table R8 shown in FIG. 5(b) is always employed, codes (code words) are assigned to the respective run values as shown in FIG. 8(a), and the total number of bits corresponding to the assigned code is 21 bits.

When the reordering of run values and the change of the code table according to the number of uncoded zero coefficients is performed as in the run-length encoding unit RLE1, codes (code words) are assigned to the respective run values as shown in FIG. 8(b), and the total number of bits corresponding to the assigned codes is 13 bits. Here, every time a code is assigned to a run value, the number of uncoded coefficients is reduced by a value that is obtained by adding one to a run value that has been coded immediately before. This is because a single or successive zero coefficients are always followed by one non-zero coefficient. In addition, the number of uncoded zero coefficients obtained from plural reordered run values corresponding to one block, which are outputted from the reordering unit Rreodr, is 15. This is because a block to be processed always has at least one non-zero coefficient.

When the reordering of run values like in the run-length encoding unit RLE1 is not performed but only the change of the code table according to the number of uncoded zero coefficients is performed, codes (code words) are assigned to the respective run values as shown in FIG. 8(c), and the total number of bits corresponding to the assigned codes is 20 bits.

As described above, the image coding apparatus 101 according to the first embodiment includes the run-length encoding unit RLE1 that encodes quantized coefficients which are obtained by quantizing frequency components of an image signal, using a run value Run indicating the number of successive quantized components whose values are zero (zero coefficients) Coef and a level value Lev indicating a value of a quaritized component Coef whose value is not zero (non-zero coefficient), following the zero coefficients. Therefore, the quantized coefficients can be coded at a higher coding efficiency, with its redundant information being removed.

Further, the run-length encoding unit RLE1 according to the first embodiment includes the variable length coder LVLC that selects a code table according to the value of the quantization parameter QP and carries out a variable length coding of level values by using the selected code table, thereby reducing the total number of bits corresponding to codes which are assigned to the level values. The run-length encoding unit RLE1 further includes the reordering unit Rreodr that reorders plural run values which are obtained from quantized coefficients to which a predetermined processing order has been given, from high frequency component to low frequency component; and the variable length coder RVLC that selects a code table according to the number of uncoded zero coefficients in the target block, and carries out variable length coding of the reordered-run values using the selected code table. Therefore, the total number of bits corresponding to codes which are assigned to the run values is effectively reduced, thereby increasing the coding efficiency.

In this first embodiment, the variable length coder RVLC selects a code table according to the number of uncoded zero coefficients in the target block (i.e., the output Cnum from the number calculator NumClc). However, the variable length coder RVLC may select a code table on the basis of not-only the output Cnum from the number calculator NumClc but also the VLC selection signal VlcSel. For example, when a variable length coding process using a specific code table is previously indicated by the VLC selection signal VlcSel, the variable length coder RVLC carries out a variable length coding process for the run value by using the specific code table, regardless of the number of uncoded zero coefficients in the target block.

Embodiment 2

Figure 9:
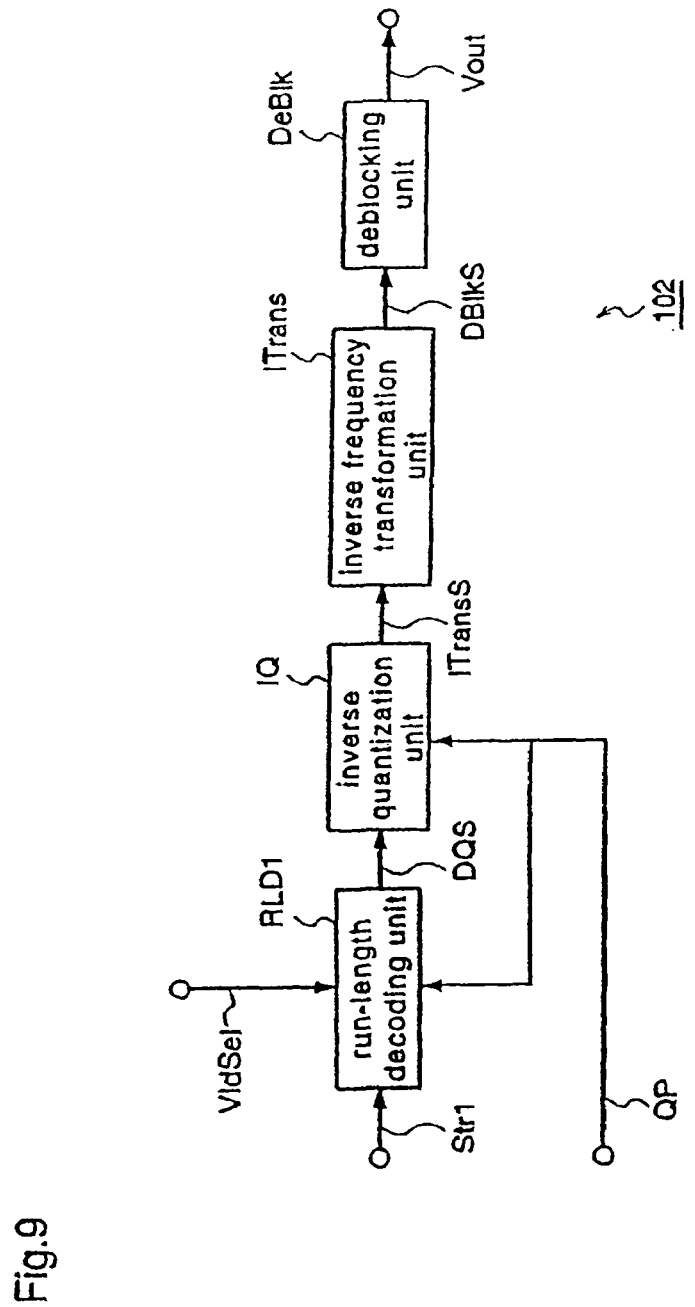
FIG. 9 is a block diagram for explaining an image decoding apparatus 102 according to a second embodiment of the present invention.

FIG. 9 is a block diagram for explaining an image decoding apparatus according to a second embodiment of the present invention.

This image decoding apparatus 102 according to the second embodiment decodes, for example, the coded stream Str1 that is outputted from the image coding apparatus 101 of the first embodiment.

Figure 36:
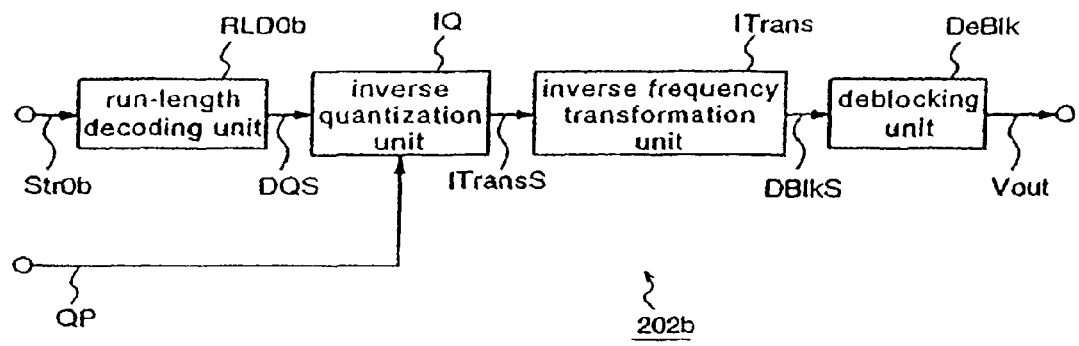
FIG. 36 is a block diagram for explaining a conventional image decoding apparatus 202b corresponding to the conventional image coding apparatus 201b.

The image decoding apparatus 102 has, in place of the run-length decoding unit RLD0b in the conventional image decoding apparatus 202b shown in FIG. 36 which subjects an inputted coded stream Str0b to a variable length decoding process, a run-length decoding unit RLD1 that subjects the inputted coded stream Str1 to a variable length decoding process on the basis of the quantization parameter QP and a VLD selection signal VldSel, to reconstitute quantized coefficients. The construction except for the run-length decoding unit RLD1 is the same as that of the image decoding apparatus 202b as shown in FIG. 36.

Figure 10:
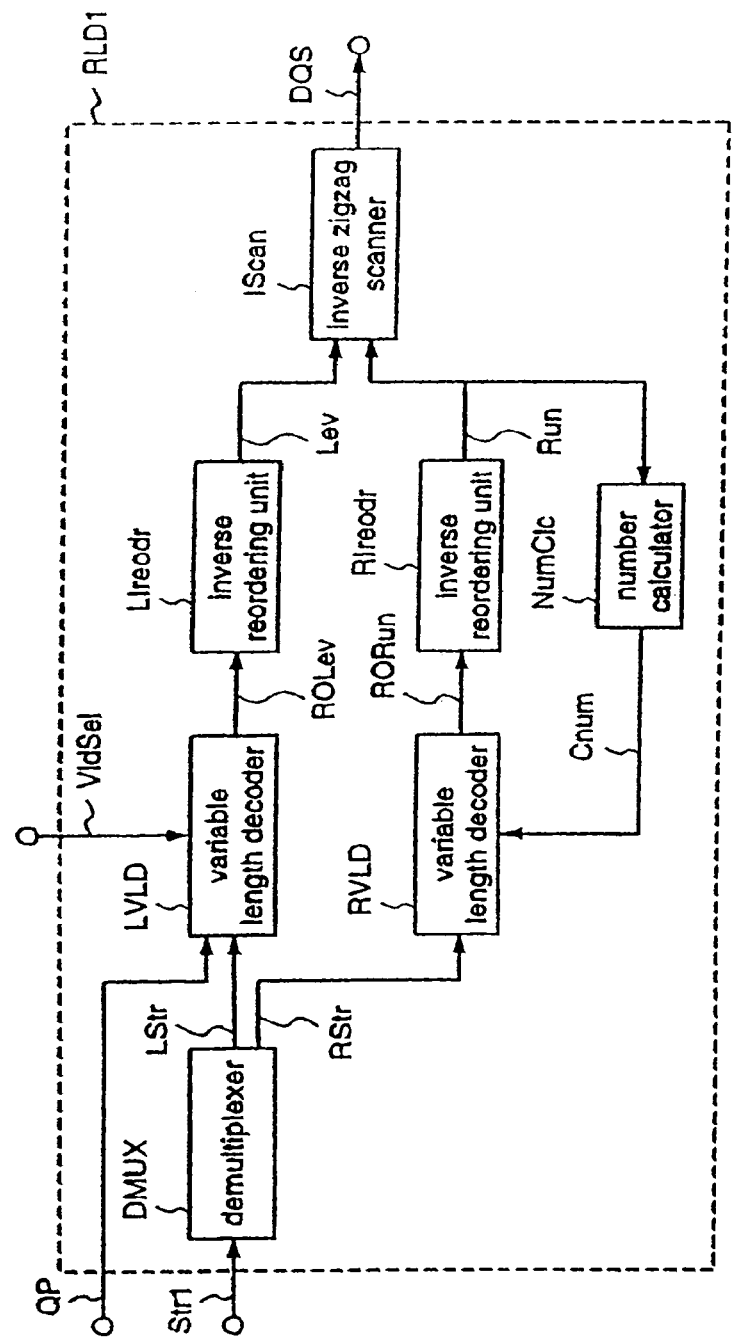
FIG. 10 is a block diagram illustrating a run-length decoding unit RLD1 that constitutes the image decoding apparatus 102 according to the second embodiment.

FIG. 10 is a block diagram for explaining a specific construction of the run-length decoding unit RLD1.

Figure 37:
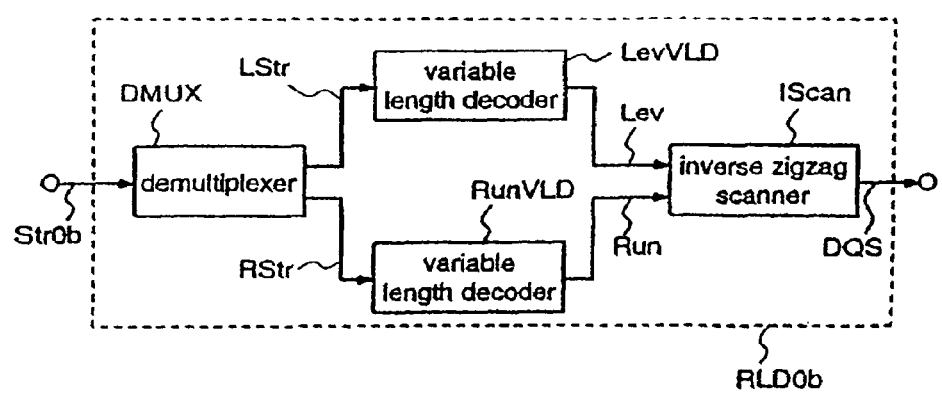
FIG. 37 is a block diagram for explaining a run-length decoding unit RLD0b that constitutes the conventional image decoding apparatus 202b.

The run-length decoding unit RLD1 has a demultiplexer DMUX for demultiplexing the multiplexed coded stream Str1 that is outputted from the image coding apparatus 101 to obtain a code string LStr corresponding to level values and a code string RStr corresponding to run values, as the conventional run-length decoding unit RLD0b as shown in FIG. 37.

The run-length decoding unit RLD1 has a variable length decoder LVLD for subjecting a level value code string LStr which is obtained by demultiplexing the multiplexed coded stream Str1 to a variable length decoding process on the basis of the quantization parameter OP and the VLD selection signal VldSel, to reconstitute level values ROLev; and a variable length decoder RVLD for subjecting a run value code string RStr which is obtained by demultiplexing the multiplexed coded stream Str1 to a variable length decoding process on the basis of the number of undecoded coefficients to reconstitute run values RORun.

The run-length decoding unit RLD1 further includes an inverse reordering unit LIreodr that reorders the level values ROLev outputted from the variable length decoder LVLD in a reverse order to that of the reordering unit Lreodr on the coding end to reconstitute the outputs Lev from the level calculator on the coding end; an inverse reordering unit RIreodr that reorders the run values RORun outputted from the variable length decoder RVLD in a reverse order to that of the reordering unit Rreodr on the coding end to reconstitute the outputs Run from the run calculator on the coding end; and a number calculator NumClc that calculates the number Cnum of undecoded coefficients in a target block on the basis of the outputs Run from the inverse reordering unit RIreodr and outputs the obtained number.

The run-length decoding unit RLD1 further includes an inverse zigzag scanner IScan that reconstitutes decoded quantized components DQS in a two-dimensional array from decoded quantized components in a one-dimensional array, which are represented by the level values Lev and the run values Run.

FIGS. 11(a) and 11(b) are diagrams for explaining a variable length decoding process by the variable length decoder LVLD. FIG. 11(a) is a flowchart for explaining the variable length decoding process for reconstituting level values, and FIG. 11(b) is an explanatory diagram showing a code table that is employed in the variable length decoding process. Here, code tables L1 and L2 which are employed in the variable length decoding process for the level values are the same as the code tables L1 and L2 which are employed in the coding process for the level values in the run-length encoding unit RLE1 according to the first embodiment.

FIGS. 12(a) and 12(b) are diagrams for explaining a variable length decoding process by the variable length decoder RVLD. FIG. 12(a) is a flowchart for explaining a variable length decoding process for reconstituting run values. FIG. 12(b) is an explanatory diagram showing code tables which are employed in the variable length decoding process. Here, code tables R1 to R8 which are employed in the variable length decoding process for run values are the same as the code tables R1 to R8, respectively, which are employed in the coding process for run values in the run-length encoding unit RLE1 according to the first embodiment.

Next, its operation will be described.

When a multiplexed coded stream Str1 is for example inputted to the image decoding apparatus 102 from the image coding apparatus 101 according to the first embodiment, the run-length decoding unit RLD1 subjects the coded stream Str1 to a decoding process and outputs decoded quantized components DQS. The operation of the run-length decoding unit RLD1 is an inverse to that of the run-length encoding unit RLE1.

To be more specific, in the run-length decoding unit RLD1, the demultiplexer DMUX demultiplexes the inputted multiplexed coded stream Str1 to obtain a level value code string LStr corresponding to level values and a run value code string RStr corresponding to run values, and outputs the level value code string and the run value code string to the variable length decoder LVLD and the variable length decoder RVLD, respectively.

The variable length decoder LVLD obtains level values ROLev corresponding to respective codes (code words) for the level value code string LStr obtained from the demultiplexer DMUX, by using plural code tables which indicate correspondences between the level value and the code (code word), on the basis of the quantization parameter QP from the quantization unit Q and a VLD selection signal VldSel from the outside instructing selection of variable length decoding, and outputs the obtained level values to the inverse reordering unit LIreodr. On the other hand, the variable length decoder RVLD Obtains run values ROLev corresponding to respective codes (code words) for the run value code string RStr obtained from the demultiplexer DMUX, by using plural code tables which indicate correspondences between the run value and the code (code words, on the basis of the number Cnum of undecoded coefficients outputted from the number calculator NumClc, and outputs the obtained run values to the inverse reordering unit RIreodr.

The inverse reordering unit LIreodr subject the level values ROLev outputted from the variable length decoder LVLD to an inverse arrangement process to the process by the reordering unit Lreodr on the coding end, to reconstitute the outputs Lev from the level calculator on the coding end. On the other hand, the inverse reordering unit RIreodr subjects the run values RORun outputted from the variable length decoder RVLD to an arrangement process that is an inverse to the process of the reordering unit Rreodr on the coding end, to reconstitute the outputs Run from the run calculator on the coding end. Further, the number calculator NumClc calculates the number Cnum of undecoded coefficients in a target block on the basis of the outputs Run from the inverse reordering unit RIreodr, and outputs the obtained number Cnum to the variable length decoder RVLD.

Then, the inverse zigzag scanner IScan carries out an operation that is an inverse to that of the zigzag scanner Scan to reconstitute decoded quantized components DOS in a two-dimensional array from the quantized components in a one-dimensional array, which are represented by the level values Lev and the run values Run, and outputs the obtained quantized components DQS to the inverse quantization unit IQ.

Hereinafter, the operation of the variable length decoder LVLD will be specifically described with reference to FIGS. 11(a) and 11(b).

The variable length decoder LVLD obtains the quantization parameter QP from the quantization unit Q of the image coding apparatus 101 (step Sc1), and determines whether the obtained quantization parameter QP is equal to or larger than a threshold of the quantization parameter QP, which is held in the variable length decoder LVLD (step Sc2).

Figure 11:
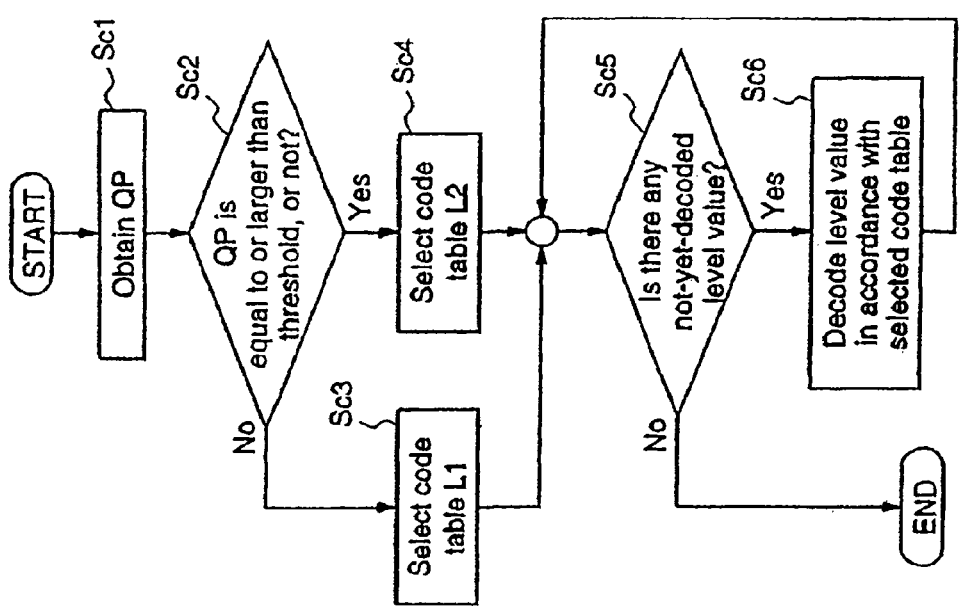
FIGS. 11(a) and 11(b) are diagrams for explaining a variable-length decoding process by a variable length decoder LVLD.

When the result of the determination indicates that the obtained quantization parameter QP is smaller than the threshold of the quantization parameter QP, the variable length decoder LVLD selects the code table L1 (see FIG. 11(b)) that is constituted by the arrangement Alev of level values and the arrangement Ca1 of codes (code words) (step Sc3), and when the obtained quantization parameter QP is equal to or larger than the threshold of the quantization parameter QP, selects the code table L2 (see FIG. 11 (b)) that is constituted by the arrangement Alev of level values and the arrangement Ca2 of codes (code words) (see FIG. 11(b)) (step Sc4).

Thereafter, the variable length decoder LVLD determined whether there is any undecoded level value Lev in the target block (step Sc5). When undecoded level values Lev are included in the target block, the variable length decoder carries out a decoding process for reconstituting level Values Lev by using the selected code table, i.e., a process for obtaining level values corresponding to codes (step Sc6), and then carries out the above-mentioned process of step Sc5. On the other hand, the result of the determination in step Sc5 indicates that there is no undecoded level value Lev in the target bloc, the variable length decoder finished the variable length decoding process for reconstituting the level values Lev.

Here, when the LVD selection signal VidSel previously designates a variable length decoding process using a specific code table, the variable length decoder LVLD carries out a variable length decoding process for reconstituting level values by using the specific code table, regardless of the value of the quantization parameter QP.

Next, the operation of the variable length decoder RVLD will be specifically described with reference to FIG. 12.

The variable length decoder RVLD determines whether there is any undecoded non-zero coefficients in a target block on the basis of the output (the number of undecoded coefficients) Cnum from the number calculator NumClc (step Sd1). When the result of the determination shows that there are undecoded non-zero coefficients, the variable length decoder calculates the number of undecoded zero coefficients in the target block on the basis of the number Cnum of the undecoded coefficients (Step Sd2).

The variable length decoder RVLD selects a code table according to the obtained number of undecoded zero coefficients (step Sd3). To be more specific, when the number of undecoded zero coefficients is one, the variable length decoder selects the code table R1 that is constituted by the arrangement Arun of run values and the arrangement Cb1 of codes (code words) (see FIG. 12(b)). Similarly, the variable length decoder selects the code table R2 when the number of undecoded zero coefficients is two, the code table R3 when the number of undecoded zero coefficients is three, and the code table R4 when the number of undecoded zero coefficients it four. Further, the variable length decoder selects the code table R5 when the number of undecoded zero coefficients is five, the code table R6 when the number of undecoded zero coefficients is six, and the code table R7 when the number of undecoded zero coefficients is seven, respectively. Further, when the number of undecoded zero coefficients is eight or more, the variable length decoder RVLD selects the code table R8.

Next, the variable length decoder RVLD carries out a decoding process for reconstituting run values Run by using the selected code table, i.e., a process for obtaining run values corresponding to respective codes (step Sd4), and then carries out the above-mentioned determination process of step Sd1.

Further, when the result of the determination in step Sa1 indicates that there is no undecoded non-zero coefficient, the variable-length decode RVLD finishes the variable length decoding process for reconstituting the run values.

Figure 32:
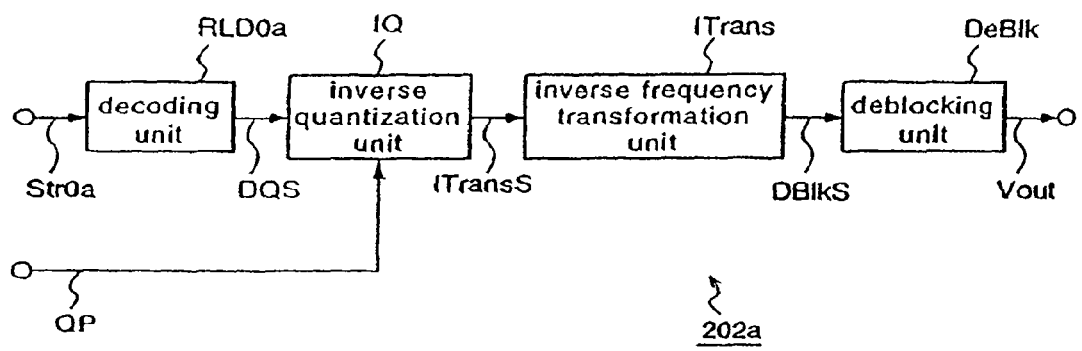
Figure 33:
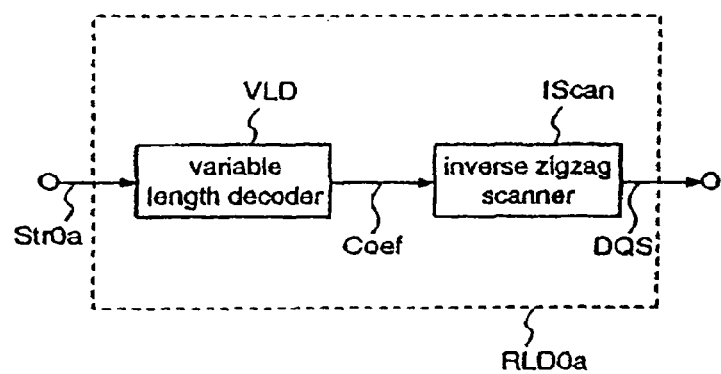

In this image decoding apparatus 102 according to the second embodiment, the inverse quantization unit IQ, the inverse frequency transformation unit ITrans, and the deblocking unit DeBlk operate in the same manners as those in the conventional image decoding apparatus 202a (see FIG. 32) and image decoding apparatus 202b (see FIG. 36).

To be more specific, the inverse quantization unit IQ carries out an inverse operation of the quantization unit Q, i.e., an operation of inversely quantizing the decoded quantized components DQS with referring to the quantization parameter QP, to output decoded frequency components ITransS. The inverse frequency transformation unit ITrans carries out an inverse operation of the frequency transformation unit Trans, i.e., an operation of transforming the decoded frequency components ITransS corresponding to each block according to inverse DCT or inverse Wavelet transformation, to reconstitute decoded pixel value signals DBlkS corresponding to respective blocks. Then, the deblocking unit DeBlk integrates the decoded pixel value components DBlkS of respective blocks, and outputs a decoded image signal Vout corresponding to each picture (frame).

As described above, the image decoding apparatus 102 according to the second embodiment includes the run-length decoding unit RLD1 that transforms a run code string RStr and a level code string LStr which constitute coded data, respectively, into a run value Run indicating the number of successive zero coefficients Coef and a level value Lev indicating a value of anon-zero coefficient following the zero coefficients, to reconstitute quantized coefficients on the basis of the run value and the level value. Therefore, a decoding process corresponding to a variable length coding process by which quantized coefficients can be coded at a higher coding efficiency with its redundant information being removed can be satisfactory carried out.

In addition, the run-length decoding unit RLD1 according to the second embodiment includes the variable length decoder LVLD that selects a code table according to the value of the quantization parameter QP and carries out variable length decoding for reconstituting level values by using the selected code table. Therefore, a level value code string that is composed of a reduced total number of bits corresponding to codes which are assigned to level values can be satisfactorily decoded.

The run-length decoding unit RLD1 further includes the variable length decoder RVLD that selects a code table according to the number of undecoded zero coefficients in a target block and decodes a code string corresponding to reordered run values by using the selected code table, and the inverse reordering unit RIreodr that reorders the run values which are obtained by the decoding process in a reverse order to the reordering process for run values in the run-length encoding unit RLD1. Therefore, the total number of bits corresponding to codes which are assigned to the run values can be effectively reduced, and the run value code string comprising the run values can be satisfactorily decoded.

In this second embodiment, the variable length decoder RVLD selects a code table according to the number of undecoded zero coefficients in the target block (i.e., the output Cnum from the number calculator NumClc), but this variable length decoder RVLD may select the code table on the basis of not only the output Cnum from the number calculator NumClc but also the VLD selection signal VldSel. For example, when a variable length decoding process using a specific code table is previously indicated by the VLD selection signal VldSel, the variable length decoder RVLD performs a variable length decoding process by using the specific code table to reconstitute run values, regardless of the number of undecoded zero coefficients in the target block.

Embodiment 3

Figure 13:
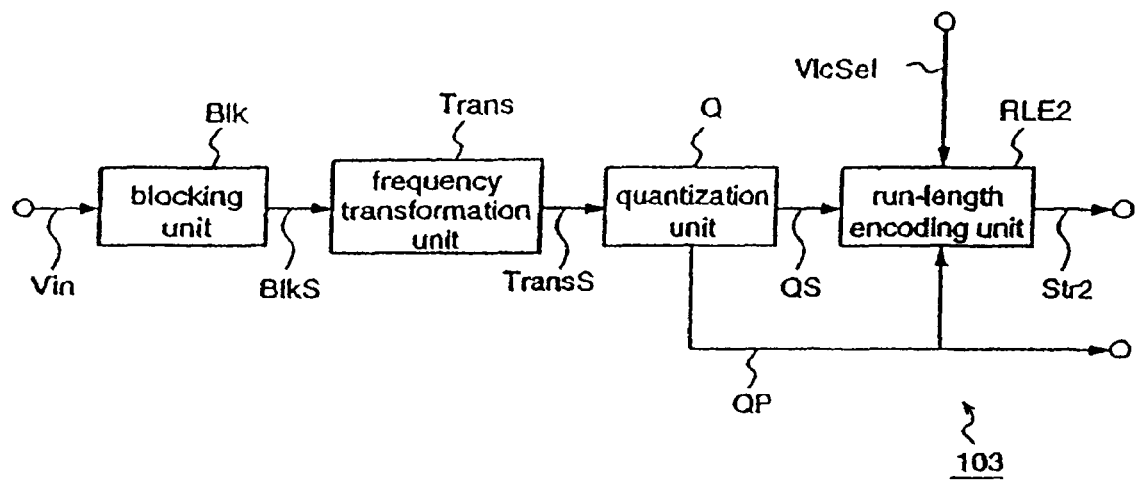
FIG. 13 is a block diagram for explaining an image coding apparatus 103 according to a third embodiment of the present invention.

FIG. 13 is a block diagram for explaining an image coding apparatus according to a third embodiment of the present invention.

Figure 38:
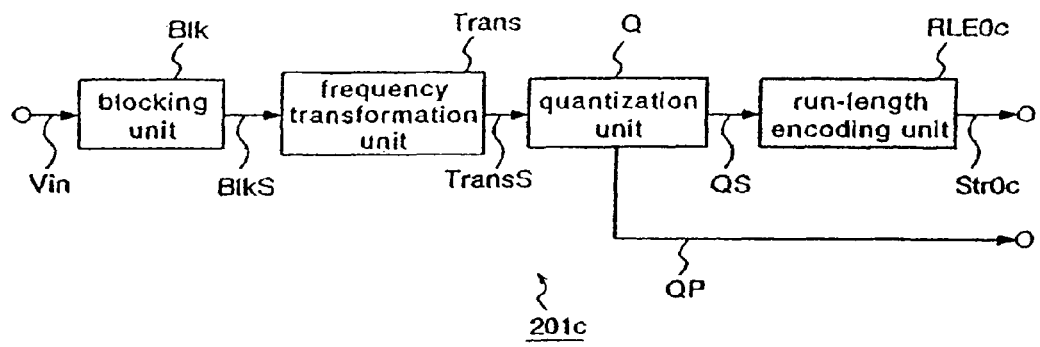
FIG. 38 is a block diagram for explaining another image coding apparatus 201c that performs the conventional run-length encoding.

This image coding apparatus 103 according to the third embodiment has, in place of the run-length encoding unit RLE0c in the image coding apparatus 201c shown in FIG. 38 which subjects outputs (quantized components) QS from the quantization unit Q to a variable length coding, process and outputs a coded stream Str0c, a run-length encoding unit RLE2 that subjects the outputs QS from the quantization unit Q to a variable length coding process on the basis of a quantization parameter QP or a VLC selection signal VlcSel and outputs a coded stream Str2. Other components of the image coding apparatus 103 of the third embodiment are the same as those in the conventional image coding apparatus 201c.

To be more specific, the run-length encoding unit RLE2 has, like the conventional run-length encoding unit RLE0c, the first code table T1 (see FIG. 42) that shows the correspondence between the pair of a run value and a level value (hereinafter, referred to as run-level pair) and a corresponding code, according to combinations of the run values and the level values. This run-length encoding unit RLE2 regularly changes the correspondences between the run-level pair and the code in the first code table, on the basis of the first code table, to form a second code table having different correspondences from the first code table, and selects one of the first and second code tables on the basis of the quantization parameter QP that is outputted from the quantization unit Q or the VLC selection signal VlcSel from outside, as well as assigns codes to the run-level pairs associated with coefficients in the target data to be processed, on the basis of the selected code table.

Here, the quantization parameter OP is a parameter that indicates the value of the quantization step, and the quantization step is approximately proportional to the quantization parameter QP. To be more specific, when the quantization parameter QP is larger, the quantization components have smaller absolute values, then zero run in the quantized components (the length of successively continuing components whose values are zero) gets longer, and thus the level value has a smaller absolute value. Therefore, in this case, a code table in which smaller codes are assigned to run-level pairs comprising larger run values and smaller level values is selected, thereby to increase the coding efficiency. Conversely, when the quantization parameter QP is smaller, the quantized components have larger absolute values. Therefore, a code table in which smaller codes are assigned to run-level pairs comprising smaller run values and larger level values is selected, thereby increasing the coding efficiency.

Further, when the VLC selection signal VlcSel from the outside of the image coding apparatus 103 is inputted, the run-length encoding unit RLE2 selects a code table that is employed in the coding process in accordance with the selection signal VlcSel. Thus, when an appropriate code table is selected from outside according to image characteristics (the value of motion of an image, the complexity of the motion, the minuteness of a pattern, or the like), or when a stream that can be decoded by an image decoding apparatus including only one code table is formed on the side of the image coding apparatus 103, this image coding apparatus 103 can be controlled by the VLC selection signal VlcSel for always using a predetermined code table. That is, it is also possible to carry out a variable length coding process without changing a code table but using only one code table.

Figure 14:
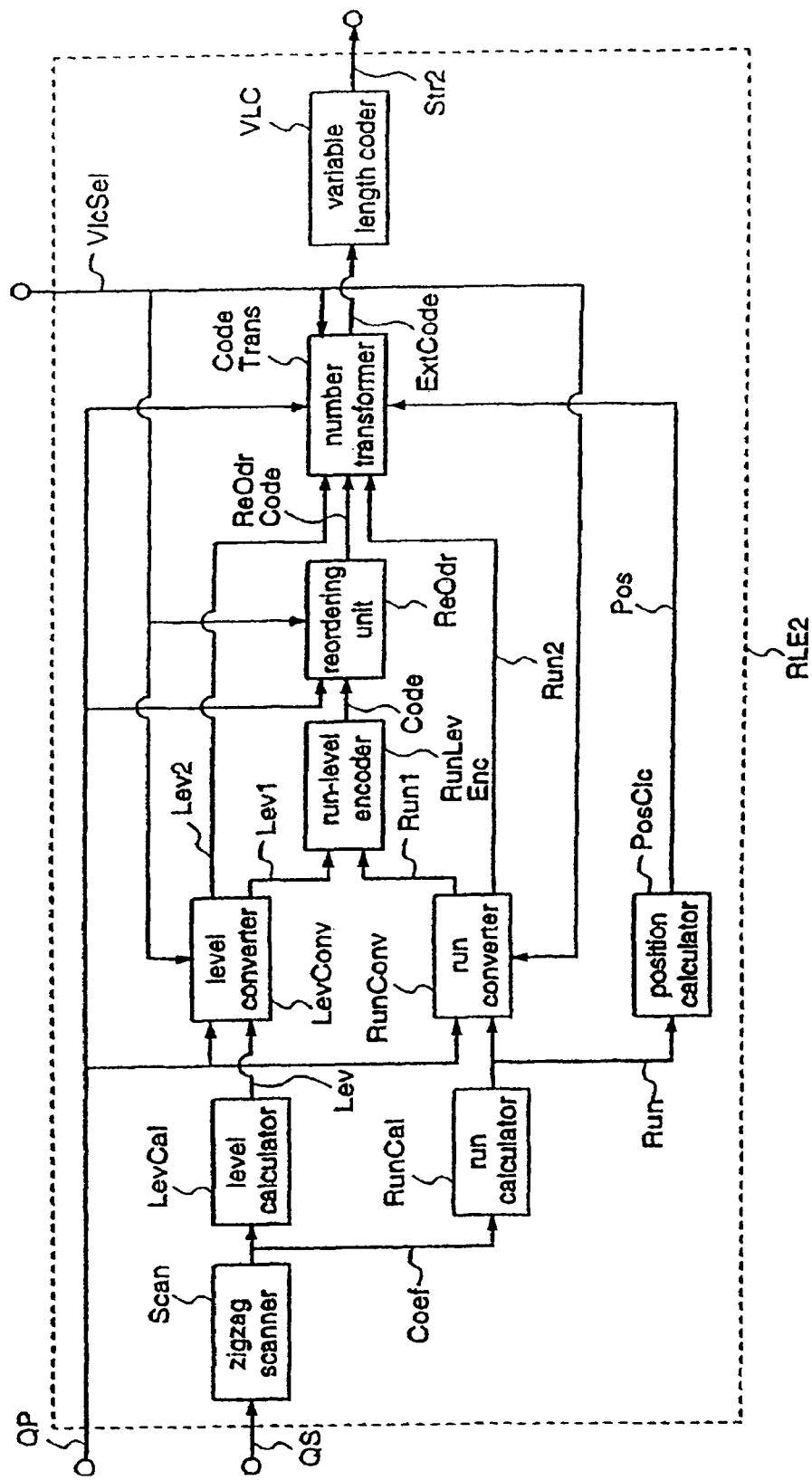
FIG. 14 is a block diagram illustrating a run-length encoding unit RLE2 that constitutes the image coding apparatus 103 according to the third embodiment.

FIG. 14 is a block diagram for explaining a specific construction of the run-length encoding unit RLE2.

The run-length encoding unit RLE2 has, like the conventional run-length encoding unit RLE0c (see FIG. 39), a zigzag scanner Scan for transforming outputs (quantized components) QS in a two-dimensional array from the quantization unit Q into quantized components Coef in a one-dimensional array (i.e., predetermined order); a run calculator RunCal for calculating the number of successive quantized components whose values are zero (zero coefficients) Coef and outputting a run value Run; and a level calculator LevCal for calculating a value of a quantized component whose value is not zero (non-zero coefficient) Coef, following the zero coefficients, and outputting a level value Lev.

In this third embodiment, the run-length encoding unit RLE2 further has a run converter RunConv for carrying out a conversion process of dividing the output (run value) Run from the run calculator RunCal into a run value Run1 indicating an upper digit of the run value Run and a run value Run2 indicating a lower digit of the run value. Run, on the basis of the quantization parameter QP or the VLC selection signal VlcSel; and a level converter LevConv for carrying out a conversion process of dividing the output (level value) Lev from the level calculator LevCal into a level value Lev1 indicating an upper digit of the level value Lev and a level value Le2 indicating a lower digit of the level value Lev on the basis of the quantization parameter QP or the VLC selection signal VlcSel.

The run-length encoding unit RLE2 further includes a run-level encoder RunLevEnc for obtaining a code number Code corresponding to a pair of the run value Run1 and the level value Lev1 (hereinafter, referred to as a run-level upper digit pair) according to a code table or arithmetic operation; and an reordering unit ReOdr for carrying out a process for reordering run-level upper digit pairs so that run-level upper digit pairs for higher frequency components, corresponding to an object block to be processed, correspond to smaller code numbers on the basis of correspondences between the run-level upper digit pair and code number Code, in accordance with the quantization parameter QP or the VLC selection signal VlcSel, and outputting a code number ReOdrCode corresponding to a reordered run-level upper digit pair.

The run-length encoding unit RLE2 further includes a position calculator PosClc for calculating the number of coded quantized components (coded coefficients) from the run value Run and outputting the number Pos of the coded coefficients; a code transformer CodeTrans for outputting a code number ExtCode corresponding to a run-level pair, indicated by a second code table, from the level value Lev2 and the run value Run2, on the basis of the correspondences between the run-level upper digit pair and the code number ReOdrCode; and a variable length coder VLC for assigning a bit string (code word) to the code number ExtCode to generate a code string Str2.

Figure 39:
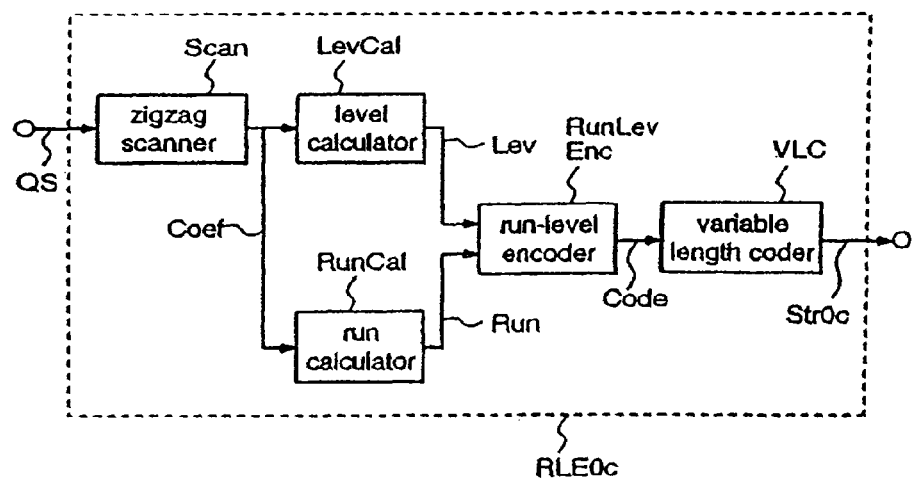
FIG. 39 is a block diagram illustrating a run-length encoding unit RLE0c that constitutes the conventional image coding apparatus 201c.

The zigzag scanner Scan, the run calculator RunCal, the level calculator LevCal, and the variable length coder VLC in the run-length encoding unit RLE2 are the same as those in the conventional run-length encoding unit RLE0c as shown in FIG. 39.

Next, functions and effects will be described.

The zigzag scanner Scan transforms the quantized components QP in a two-dimensional array into quantized components Coef in a one-dimensional array, i.e., to which an order is set. The run calculator RunCal calculates the number of successive zero components (quantized components whose values are zero) Coef, and outputs a run value Run indicating the obtained number. The level calculator LevCal calculates a value of a non-zero component (a quantized component whose value is not zero, following the zero components) Coef, and outputs a level value Lev indicating the value of the non-zero component.

The run converter RunConv carries out a conversion process of dividing the run value Run into the run value Run1 indicating an upper digit of the run value Run and the run value Run2 indicating a lower digit of the run value Run. The level converter LevConv carries out a conversion process of dividing the level value Lev into the level value Lev1 indicating an upper digit of the level value Lev and the level value Lev2 indicating a lower digit of the level value Lev.

Figures 42, 43:
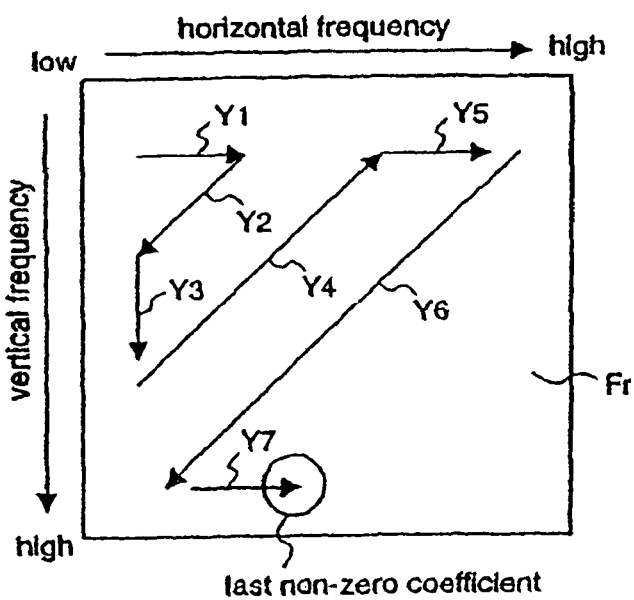
FIG. 42 is a diagram showing an example of a code table that is employed by the run-length encoding unit RLE0c that constitutes the conventional image coding apparatus 201c.
FIG. 43 is a diagram showing an example of an order in which quantized components are coded by the conventional run-length encoding units RLE0a, RLE0b, or RLE0c.

The run-level encoder RunLevEnc obtains a code number Code corresponding to a pair of the level value Lev1 and the run value Run1 (run-level upper digit pair) according to a code table (first code table) shown in FIG. 42 or arithmetic operation. The reordering unit ReOdr carries out a process of reordering the run-level upper digit pairs in accordance with the quantization parameter QP or the VLC selection signal VlcSel, and outputs a code number ReOdrCode corresponding to a reordered run-level upper digit pair. According to the process of reordering the run-level upper digit pairs, the correspondences between the run-level upper digit pair and the code number Code, which are obtained by the run-level encoder RunLevEnc, are converted into correspondences in which smaller code numbers correspond to run-level upper digit pairs corresponding to higher frequency components in the target block to be processed.

The position calculator PosClc calculates the number of coded components from the run value Run, and outputs the number Pos of coded coefficients. The code transformer CodeTrans outputs a code number ExtCode corresponding to a run-level pair from the level value Lev2 and the run value Run2, on the basis of the correspondences between the run-level upper digit pair and the code number ReOdrCode. At this time, the code transformer CodeTrans employs the number Pos of coded coefficients which is outputted from the position calculator PosClc, to obtain the number of uncoded components.

Here, the code number ExtCode corresponding to the run-level pair, which is outputted from the code transformer CodeTrans, is obtained on the basis of the second code table which have different correspondences between the run-level pair and the code number from those of the first code table. This second code table is formed as follows: a code table that has different correspondences between a run-level pair and a code number from the first code table is initially formed by the reordering process by the reordering unit ReOdr, and then this code table formed by the reordering unit ReOdr is modified by the number transformer CodeTrans on the basis of the number Pos of coded coefficients so as not to include correspondences between run-level pair and code number, corresponding to run values Run exceeding the number of uncoded components.

The variable length coder VLC assigns a bit string (code word) to the code number ExtCode to generate a coded stream Str2.

FIGS. 15(a) and 15(b) show examples of the second code table which is formed by the run-length encoding unit RLE2 on the basis of the first code table. Here, the first code table is the same as the code table shown in FIG. 42, which is employed in the conventional run-length encoding unit RLE0c. In the first and second code tables, a bit string (code word) is assigned to the code number in a one-to-one relationship, while it is needless to say that shorter code words are assigned to code numbers Code having smaller values.

FIG. 15(a) shows, as an example of the second code table, a second code table T2a that is suitable for a case where the quantization parameter QP is smaller.

This second code table T2a is formed as follows.

Initially, a value corresponding to ½ of the level Lev is assigned as the level value Lev1, and an absolute value of (Lev1×2−Lev) is assigned as the level value Lev2.

Here, when the level value Lev is an odd number, a value that is obtained by dividing an even number having an absolute value which is one larger than that of the level value Lev, by 2 is employed as the level value Lev1. To be more specific, when the level value Lev is positive, a value corresponding to ½ of (Lev+1) is assigned to the level value Lev1, while when the level Value Lev is negative, a value corresponding to ½ of (Lev−1) is assigned to the level value Lev1.

Then, a code number Code corresponding to a pair of the level value Lev1 and the run value Run is obtained from the first code table (see FIG. 42) according to the combinations of the level values Lev and the run value Run.

Further, the code number Code corresponding to a pair of the level value Lev1 and the run value Run is converted according to the next formula (1) when the Lev value is positive, and according to the formula (2) when the Lev value is negative. The second code table T2a shows correspondences between the code number and the run-level pair which are obtained by the above conversion.

$$2 \times (Code - Lev2) - 1 \qquad (1)$$

$$2 \times (Code - Lev2) \qquad (2)$$

For example, when focusing attention on a run-level pair (level=−2, run=1) in the code table (first code table) in FIG. 42, a code number Code corresponding to this run-level pair is converted from "10" indicated by the first code table T1 in FIG. 42 into "12" indicated by the second code table T2a in FIG. 15(a).

That is, since the run-level pair (Lev, Run) is (−2, 1) in this case, Lev1 and Lev2 are calculated as follows.

$$Lev1 = Lev \cdot (½) = -1$$

$$Lev2 = |Lev1 \cdot 2 - Lev| = |-1 \cdot 2 - (-2)| = 0$$

Therefore, (Lev1, Run) is (−1, 1), and this run-level pair corresponds to a code number (Code=6) according to the first code table (see FIG. 42).

Then, a code number corresponding to the run-level pair (Lev, Run)=(−2, 1) is calculated by employing the formula (2):

$$2 \times (Code - Lev2) = 2 \times (6 - 0) = 12$$

The code table in FIG. 15(a) is characterized in that smaller code numbers (i.e., shorter code words) are assigned to run-level pairs comprising smaller run values and larger level values as compared to the code table (first code table) shown in FIG. 42, and this is suitable for a case where the quantization parameter QP is smaller.

FIG. 15(b) shows, as another example of the second code table, a second code table T2b that is suitable for a case where the quantization parameter QP is larger.

This second code table T2b is formed as follows.

Initially, a value corresponding to ½ of the run value Run is assigned as the run value Run1, and an absolute value of (Run1×2−Run) is assigned as the run value Run2. Here, when the run value is an odd number, an integer part of the value corresponding to ½ of (Run+1) is assigned to the run value Run1.

Then, a code number Code corresponding to a pair of the level value Lev and the run value Run1 is obtained from the first code table (see FIG. 42), according to combinations of the level values Lev and the run values Run1.

Further, the code number Code corresponding to a pair of the level value Lev and the run value Run1 is converted on the basis of the next formula (3) when Lev value is positive, and the formula (4) when Lev value is negative. The second code table T2b shows correspondences between the code number and the run-level pair which are obtained as a result of the conversion.

$$2\times(Code+Run2)-1 \quad (3)$$

$$2\times(Code+Run2)-2 \quad (9)$$

For example, when focusing attention on a run-level pair (level=−1, run=2) in the code table (first code table) of FIG. 42, a code number Code corresponding to this run-level pair is converted from "12" indicated by the first code table T1 in FIG. 42 to "10" indicated by the second code table T2b in FIG. 15(b).

To be more specific, since the run-level pair (Lev, Run) in this case is (−1, 2), Run1 and Run2 are calculated as follows.

$$Run1=Run\cdot(\tfrac{1}{2})=1$$

$$Run2=|Run1\cdot 2-Run|=|1\cdot 2-2|=0$$

Therefore, (Lev, Run1) is (−1, 1), and this run-level pair corresponds to a code number (code=6) according to the first code table (FIG. 42).

Then, a code number corresponding to the run-level pair (Lev, Run)=(−1, 2) is calculated by using the formula (4):

$$2\times(Code+Run2)=2\times(6-0)-2=10.$$

The second code table T2b shown in FIG. 15(b) is characterized in that smaller code numbers (i.e., shorter code words) are assigned to run-level pairs comprising larger run values and smaller level values as compared to the code table (first code table) T1 shown in FIG. 42, and this is suitable for a case where the quantization parameter QP is larger.

FIGS. 16(a)-16(c) show other examples of the second code table that is formed on the basis of the first code table by the run-length encoding unit RLE2. Here, the first code table is the same as the code table T1 shown in FIG. 42, which is employed in the conventional run-length encoding unit RLE0c.

The number transformer CodeTrans calculates the number of uncoded components (the number of coefficients which has not yet been subjected to a coding process) in a target block to be processed, on the basis of the number Pos of coded-coefficients which is outputted from the position calculator PosClc. Further, the second code table which is formed from the first code table is made include no code words corresponding to run-level pairs including run values exceeding the number of uncoded components. Thereby, coding at higher compression efficiency is enabled.

FIG. 16(a) shows a second code table T2c that is formed when the number of uncoded components is three or more. FIG. 16(b) shows a second code table T2d that is formed when the number of uncoded components is two. FIG. 16(c) shows a second code table T2e that is formed when the number of uncoded components is one.

When correspondences between run-level pairs including run values which will never be used and codes are deleted from the code table as described above, a shorter code is assigned to the run-level pair. For example, according to the second code table T2e as shown in FIG. 16(c), a run-level pair comprising a run value [0] and a level value [4] corresponds to a code number [7]. The run-level pair comprising the run value [0] and the level value [4] corresponds to a code number [11] according to the second code table T2d shown in FIG. 16(b), while the run-level pair comprising the run value [0] and the level value [4] corresponds to a code number having a further larger value (not shown) according to the second code table T2c shown in FIG. 16(a).

Figure 17:
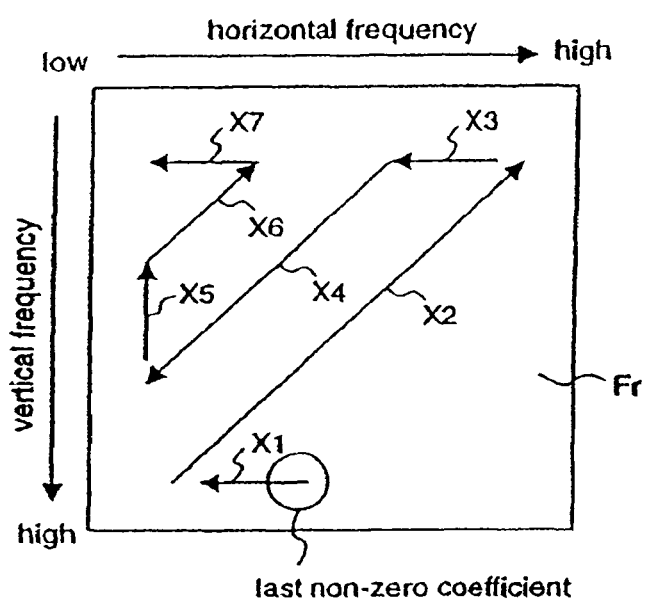
FIG. 17 is a diagram showing an example of an order in which quantized components are coded by the run-length encoding unit RLE2 according to the third embodiment.

FIG. 17 shows an example of a coding order in the run-length encoding unit RLE2 of the image coding apparatus 103 according to the third embodiment.

Generally, absolute values of level values corresponding to lower frequency components are large and, in the code table, code numbers Code having larger values correspond to run-level pairs corresponding to the lower frequency components. On the contrary, absolute values of level values corresponding to higher frequency components are small and, in the code table, code numbers having smaller values correspond to run-level pairs corresponding to the higher frequency components.

As described with reference to FIG. 16, the increase in the compression efficiency, which is obtained by deleting code numbers (code words) corresponding to run-level pairs that include run values exceeding the number of uncoded components from the code table, gets larger as the number of uncoded components is smaller, as well as larger as the absolute value of the level value is larger, because the ratio of decrease in the value of the assigned code number is larger as compared to the case where the code numbers are not yet deleted.

Thus, when quantized components having larger absolute values of the level values and corresponding to lower frequency components are coded later in the coding of quantized components by the run-length encoding unit RLE2, like in the image coding apparatus 103 according to the third embodiment, the compression efficiency is further increased.

To be more specific, the reordering unit ReOdr reorders quantized components so as to be successively arranged from a run-level pair of a quantized component corresponding to a higher frequency component (the last non-zero component) to a run-level pair of a quantized component corresponding to a lower frequency component, as shown by arrows X1 to X7 in FIG. 17, to add an EOB indicating the last coded component in a target block after a code word corresponding to a run-level pair of a quantized component having the lowest frequency component, thereby increasing the compression efficiency.

Further, in the third embodiment, the quantization parameter QP and the VLC selection signal VlcSel are supplied to the level converter LevConv, the run converter RunConv, the reordering unit ReOdr, and the number transformer CodeTrans. Therefore, a code table can be changed according to the quantization parameter QP, or an appropriate code table can be selected from outside according to contents of an image (the value of a motion of the image, the complicity of the motion, or the minuteness of a pattern).

For example, when the code table that is employed in the coding process is changed in accordance with the VLC selection signal VlcSel from outside of the image coding apparatus, the image decoding apparatus can create a stream that is decodable by a decoding unit having only one code table.

In this third embodiment, the image coding apparatus 103 that encodes quantized coefficients of an image signal as a target data to be processed includes the run-length encoding unit RLE2 that assigns variable-length codes to the quantized coefficient using a code table, and this run-length encoding unit RLE2 forms the second code table that is optimized for the target data to be processed on the basis of the first code table, and selects one of the first and second code tables as a code table that is employed for the assignment of variable length codes, on the basis of the quantization parameter QP or the VLC selection signal VlSel. Therefore, redundant information included in the target data can be removed effectively, thereby further increasing the compression rate for image signals or the like.

In this third embodiment, the run-length encoding unit RLE2 includes various devices for increasing the compression rate, i.e., the run converter RunConv, the level converter LevConv, the reordering unit ReOdr, and the number transformer CodeTrans, as shown in FIG. 14. However, the run-length encoding unit RLE2 may include only some of the devices for increasing the compression rate. In this case, the run-length encoding unit RLE2 can be easily mounted.

Further, in the third embodiment, the second code table is obtained by modifying correspondences between the run-level pairs and the code numbers in both parts constituting the first code table: a part which can be regularly generated by an arithmetic operation (regularly build VLC), and a part which cannot be regularly generated (table look up VLC). However, when the first code table has the part which can be regularly generated by an arithmetic operation (regularly build VLC) and the part which cannot be regularly generated (table loop up VLC), the second code table may be formed by modifying only the part as the part of the first code table, which can be regularly generated by an arithmetic whose operation is easily carried out. In this case, the mounting of the run-length encoding unit RLE2 can be more easily performed.

According to this third embodiment, in the run-length encoding unit that performs variable length coding of quantized components by using run-level pairs, the quantized components are successively subjected to variable length coding from high frequency component to low frequency component. However, it goes without saying that in a run-length encoding unit that subjects run values and level values corresponding to quantized components in the target block separately to the variable length coding process like in the first embodiment, the run values and the level values corresponding to the quantized components in the target block may be subjected to variable length coding, successively from high frequency component to low frequency component.

Embodiment 4

Figure 18:
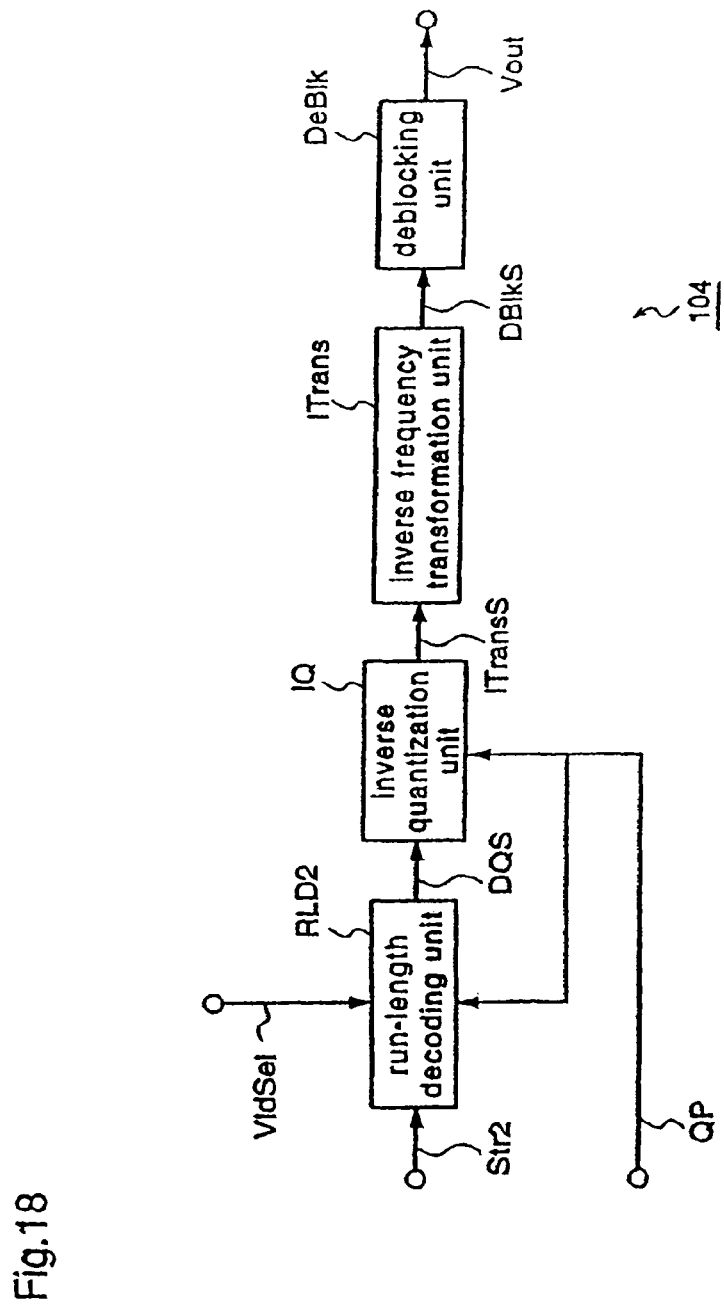
FIG. 18 is a block diagram for explaining an image decoding apparatus 104 according to a fourth embodiment of the present invention.

FIG. 18 is a block diagram for explaining an image decoding apparatus according to a fourth embodiment of the present invention.

Figure 40:
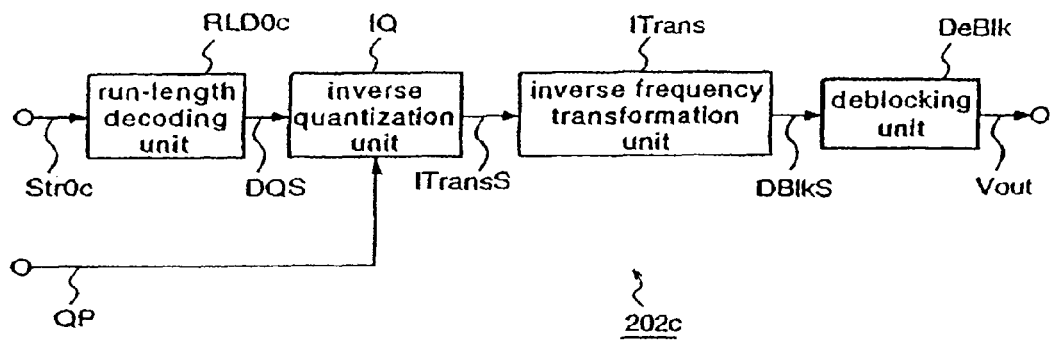
FIG. 40 is a block diagram for explaining a conventional image decoding apparatus 202c corresponding to the conventional image coding apparatus 201c.

This image decoding apparatus 104 according to the fourth embodiment has, in place of the run-length decoding unit RLD0c in the conventional image decoding apparatus 202c as shown in FIG. 40 which subjects a coded stream Str0c to a variable length decoding process and outputs decoded quantized components DQS, a run-length decoding unit RLD2 that subjects a coded stream Str2 to a variable length decoding process on the basis of the quantization parameter QP or a variable length decoding selection signal (VLD selection signal) VldSel and outputs decoded, quantized components DQS. Other components of the image decoding apparatus 104 according to the fourth embodiment are the same as those in the conventional image decoding apparatus 202c.

To be more specific, the run-length decoding unit RLD2 has, like the conventional run-length decoding unit RLD0c, a first code table T1 (see FIG. 42) which indicates, the correspondence between the pair of a run value and a level value (hereinafter, referred to as run-level pairs) and the corresponding code, according to combinations of the run values and the level values. Then, the run-length decoding unit RLD2 regularly changes the correspondences between run-level pairs and codes in the first code table, on the basis of the first code table, to form a second code table having different correspondences from those of the first code table, and selects one of the first and second code tables in accordance with the quantization parameter QP outputted from the quantization unit Q or the VLD selection signal VldSel from outside, as well as transforms code words (bit string) that constitute the coded stream Str2 into pairs of run values and level values associated with coefficients in the target data to be processed, on the basis of the selected code table.

As described above, the quantization parameter QP is a parameter indicating the value of the quantization step, and the quantization step is approximately proportional to the quantization parameter QP. To be more specific, when the quantization parameter QP is larger, the quantized components have smaller absolute values, then zero run of the quantized components (the length of successively continuing components whose values are zero) gets longer, and thus level values have smaller absolute values. In this case, accordingly, a code table in which smaller codes are assigned to run-level pairs comprising larger run values and smaller level values is selected, thereby to further improve a coding efficiency. Conversely, when the quantization parameter QP is smaller, the quantized components have absolute values, and thus a code table in which smaller codes are assigned to run-level pairs comprising smaller run values and larger level values is selected, thereby to increase the coding efficiency.

Figure 19:
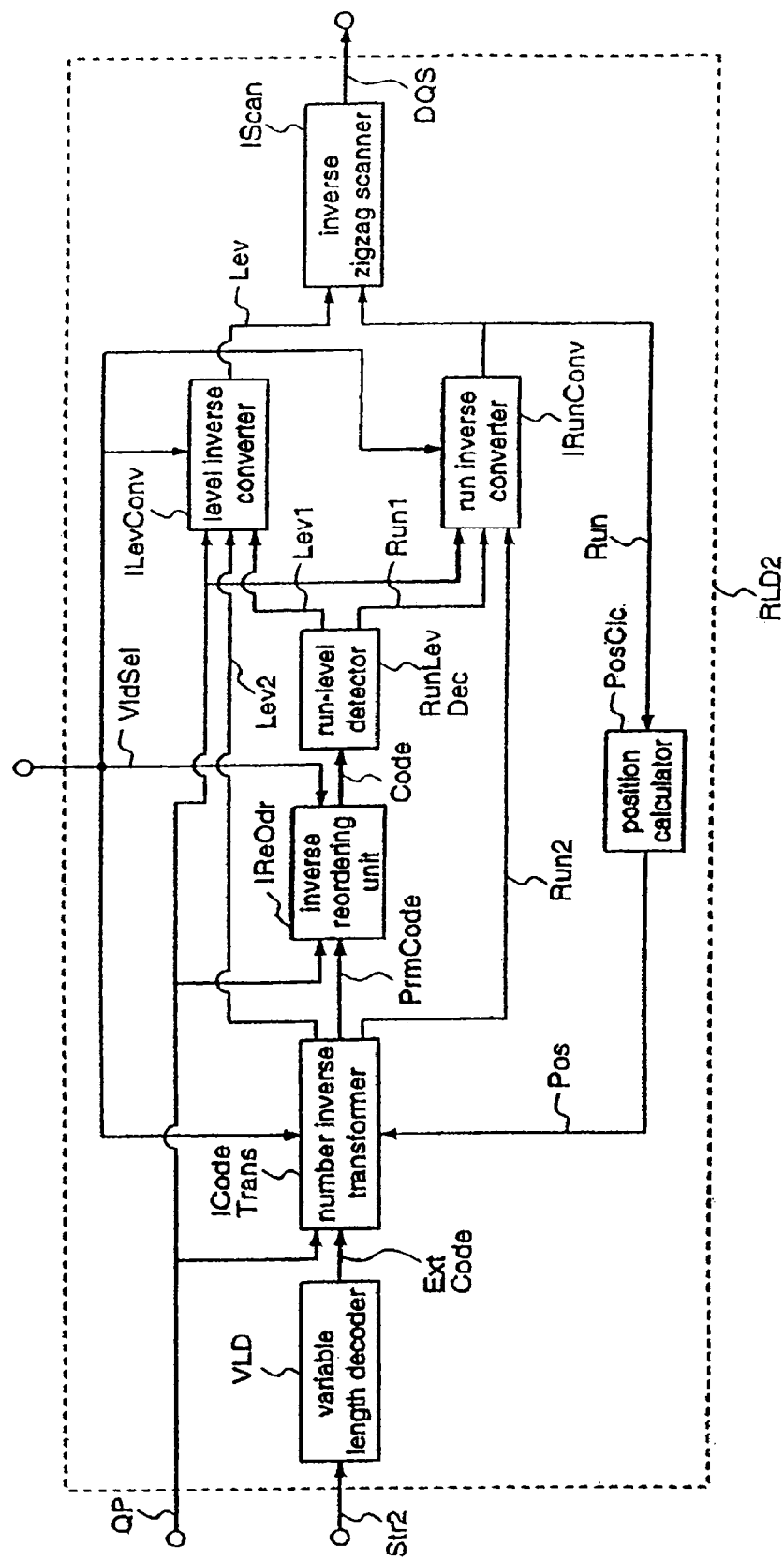
FIG. 19 is a block diagram illustrating a run-length decoding unit RLD2 that constitutes the image decoding apparatus 104 according to the fourth embodiment.

FIG. 19 is a block diagram illustrating a specific construction of the run-length decoding unit RLD2.

The run-length decoding unit RLD2 has, as the conventional run-length decoding unit RLD0c, a variable length decoder VLD, and this decoder VLD decodes the coded stream Str2 outputted from the image coding apparatus 103 according to the third embodiment and outputs a code number ExtCode.

In this fourth embodiment, the run-length decoding unit RLD2 has a number inverse transformer ICodeTrans for carrying out a number inverse transformation process for dividing the code number ExtCode into a code number PrmCode corresponding to a run-level upper digit pair comprising a level value Lev1 and a run value Run1, a level value Lev2, and a run value Run2 on the basis of the quantization parameter QP or the VLD selection signal VidSel; and an inverse reordering unit IReOdr for reordering plural code numbers PrmCode corresponding to a target block to be processed in order of increasing frequency of run-level pair, and outputting the plural code numbers Code which correspond to the target block and have a changed order.

The run-length decoding unit RLD2 further includes a run-level detector RunLevDec for detecting a run-level pair corresponding to a code number Code according to a code table or arithmetic operation, and outputting a level value Lev1 and a run value Run1 constituting the run-level pair; a run inverse converter IRunConv for reconstituting a run value Run from the run value Run1 indicating the upper digit of the run value Run and the Run value Run2 indicating the lower digit of the run value Run; and a level inverse converter ILevConv for reconstituting a level value Lev from the level value Lev1 indicating the upper digit of the level value Lev and the level value Lev2 indicating the lower digit of the level value Lev.

The run-length decoding unit RLD2 further include, as the conventional run-length decoding unit RLD0c, an inverse zigzag scanner IScan. This scanner IScan transforms quantized components in a one-dimensional array, which are represented by the level values Lev and the run values Run, into decoded quantized components DQS in a two-dimensional array, and outputs the same.

Figure 41:
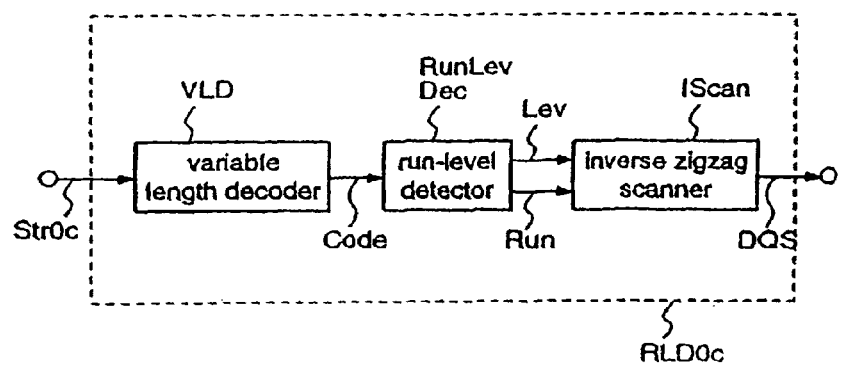
FIG. 41 is a block diagram for explaining a run-length decoding unit RLD0c that constitutes the conventional image decoding apparatus 202c.

Here, the variable length decoder VLD, the run-level detector RunLevDec, and the inverse zigzag scanner IScan in the run-length decoding unit RLD2 are the same as those in the run-length decoding unit RLD0c shown in FIG. 41.

Next, functions and effects will be described.

In the run-length decoding unit RLD2, the variable length decoder VLD carries out an inverse operation to that of the variable length coder VLC. That is, the variable length decoder VLD decodes the coded stream Str2 and outputs a code number ExtCode corresponding to a code word (bit string) that constitutes the stream. The number inverse transformer ICodeTrans carries out an inverse operation to that of the number transformer CodeTrans on the basis of the quantization parameter QP or the VLD selection signal VldSel, to divide the code number ExtCode into a code number Prm-Code corresponding to a run-level upper digit pair comprising the level value Lev1 and the run value Run1, a level value Lev2, and a run value Run2.

The inverse reordering unit IReOdr carries out an inverse operation to that of the reordering unit ReOdr on the basis of the quantization parameter QP or the VLD selection signal VldSel. Thereby, a process for reordering plural code numbers PrmCode corresponding to the target block to be processed in order of increasing frequency of run-level pair is carried out, and plural code numbers Code which have a changed order and correspond to the block are outputted. The run-level detector RunLevDec detects a run-level pair corresponding to a code number Code according to a code table or arithmetic operation, and outputs the level value Lev1 and the run value Run1 constituting the detected run-level pair.

The run inverse converter IRunConv carries out an inverse operation to that of the run converter RunConv on the basis of the quantization parameter QP or the VLD selection signal VldSel, to reconstitute the run value Run from the run value Run 1 indicating the upper digit of the run value Run and the run value Run2 indicating the lower digit of the run value Run. Further, the level inverse converter ILevConv carries out an inverse operation to that of the level converter LevConv on the basis of the quantization parameter QP or the VLD selection signal VldSel, to reconstitute the level value Lev from the level value Lev1 indicating the upper digit of the level value Lev and the level value Lev2 indicating the lower digit of the level value Lev.

Here, in the number inverse transformer IcodeTrans, the inverse reordering unit IReOdr, the run inverse converter IRunConv and the level inverse converter ILevConv, the selection of the first or second code table is performed on the basis of the quantization parameter QP or the VLD selection signal VldSel, and the operations are carried out according to the selected code table.

The inverse zigzag scanner IScan carries out an inverse operation to the operation of the zigzag scanner Scan, to transform quantized components in a one-dimensional array which are represented by the level values Lev and the run values Run, into decoded quantized components DQS in a two-dimensional array, on the basis of the level values Lev and the run values Run.

Further, when the VLD selection signal VldSel is inputted from outside, the run-length decoding unit RLD2 selects an appropriate code table corresponding to contents of an image (the value of a motion of the image, the complicity of the motion, the minuteness of a pattern), which is indicated by the VLD selection signal VldSel.

In this fourth embodiment, the quantization parameter QP and the VLD selection signal VldSel are supplied to the number inverse transformer ICodeTrans, the inverse reordering unit IReOdr, the run inverse converter IRunConv, and the level inverse converter IlevConv, respectively. Thus, a code table can be changed according to the quantization parameter QP, or an appropriate code table can be selected from outside of the image decoding apparatus, according to characteristics of an image, i.e., the value of a motion of the image, the complexity of the motion, the minuteness of a pattern or the like.

As described above, in this fourth embodiment, the image decoding apparatus 104 that decodes coded data which are obtained by variable-length-coding quantized coefficients of an image signal includes the run-length decoding unit RLD2 for transforming a variable length code into quantized components using a code table. Further, the run-length decoding unit RLD2 forms a second code table that is optimized for the target data to be processed, on the basis of the first code table, and selects one of the first and second code tables as a code table that is employed in the conversion of a variable length code into quantized coefficients, in accordance with the quantization parameter QP or the VLD selection signal VldSel. Therefore, a decoding process corresponding to a variable length coding process that can effectively remove redundant information included in the target data to be processed can be satisfactorily carried out.

In this fourth embodiment, as shown in FIG. 19, the run-length decoding unit RLD2 has various devices for increasing the compression rate, i.e., the number inverse transformer ICodeTrans, the inverse reordering unit IReOdr, the run inverse converter IRunConv, and the level inverse converter ILevConv, while the run-length decoding unit RLD2 may has only some of these devices for increasing the compression rate. In this case, the run-length decoding unit RLD2 can be mounted more easily.

Further, in the fourth embodiment, the second code table is formed by changing the correspondences between run-level pairs and code numbers in both parts which constitute the first code table: the part that can be regularly generated by an arithmetic operation (regularly build VLC) and the part that cannot be regularly generated (table look up VLC). However, when the first code table has the part that can be regularly generated by an arithmetic operation (regularly build VLC) and the part that cannot be regularly generated (table loop up VLC), the second code table may be formed by changing only the part as a part of the first code table, which can be regularly generated by the arithmetic whose operation is easily carried out. In this case, the mounting of the run-length decoding unit RLD2 can be performed more easily.

According to this fourth embodiment, in the run-length decoding unit that performs variable length decoding of coded data corresponding to quantized components by using run-level pairs, the variable length decoding of the coded data corresponding to the quantized components is performed successively from high frequency component to low frequency component. However, it is possible that, in a run-length decoding unit that subjects coded data of run values and level values corresponding to quantized components in a target block separately to variable length decoding as in the second embodiment, the coded data of run values and level values corresponding to the quantized components of the target block are subjected to the variable length decoding, successively from high frequency component to low frequency component.

Embodiment 5

Figure 20:
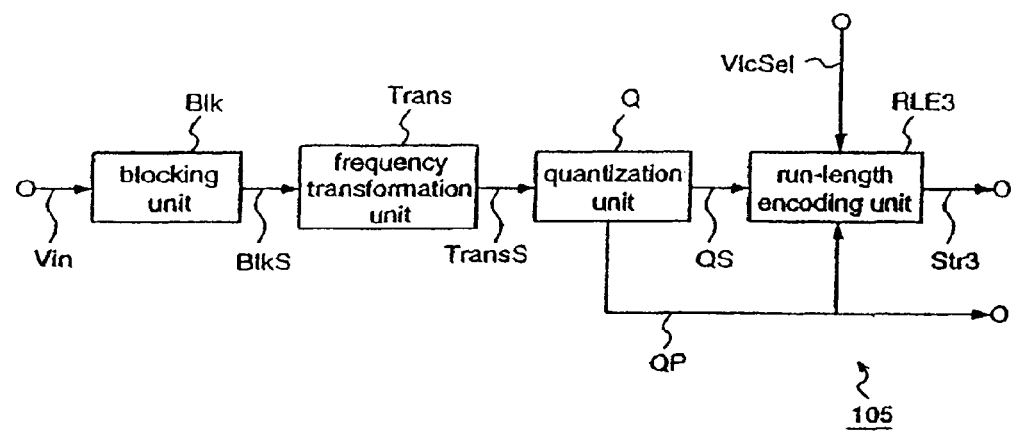
FIG. 20 is a block diagram for explaining an image coding apparatus 105 according to a fifth embodiment of the present invention.

FIG. 20 is a block diagram for explaining an image coding apparatus according to a fifth embodiment of the present invention.

This image coding apparatus 105 include, in place of the run-length encoding unit RLE2 in the image coding apparatus 103 according to the third embodiment as shown in FIG. 13, a run-length encoding unit RLE3 that encodes a run-level pair as well as encode the number of non-zero components, like the run-length encoding unit RLE2. Other components of the image coding apparatus 105 according to the fifth embodiment are the same as those in the image coding apparatus 103 according to the third embodiment.

Figure 21:
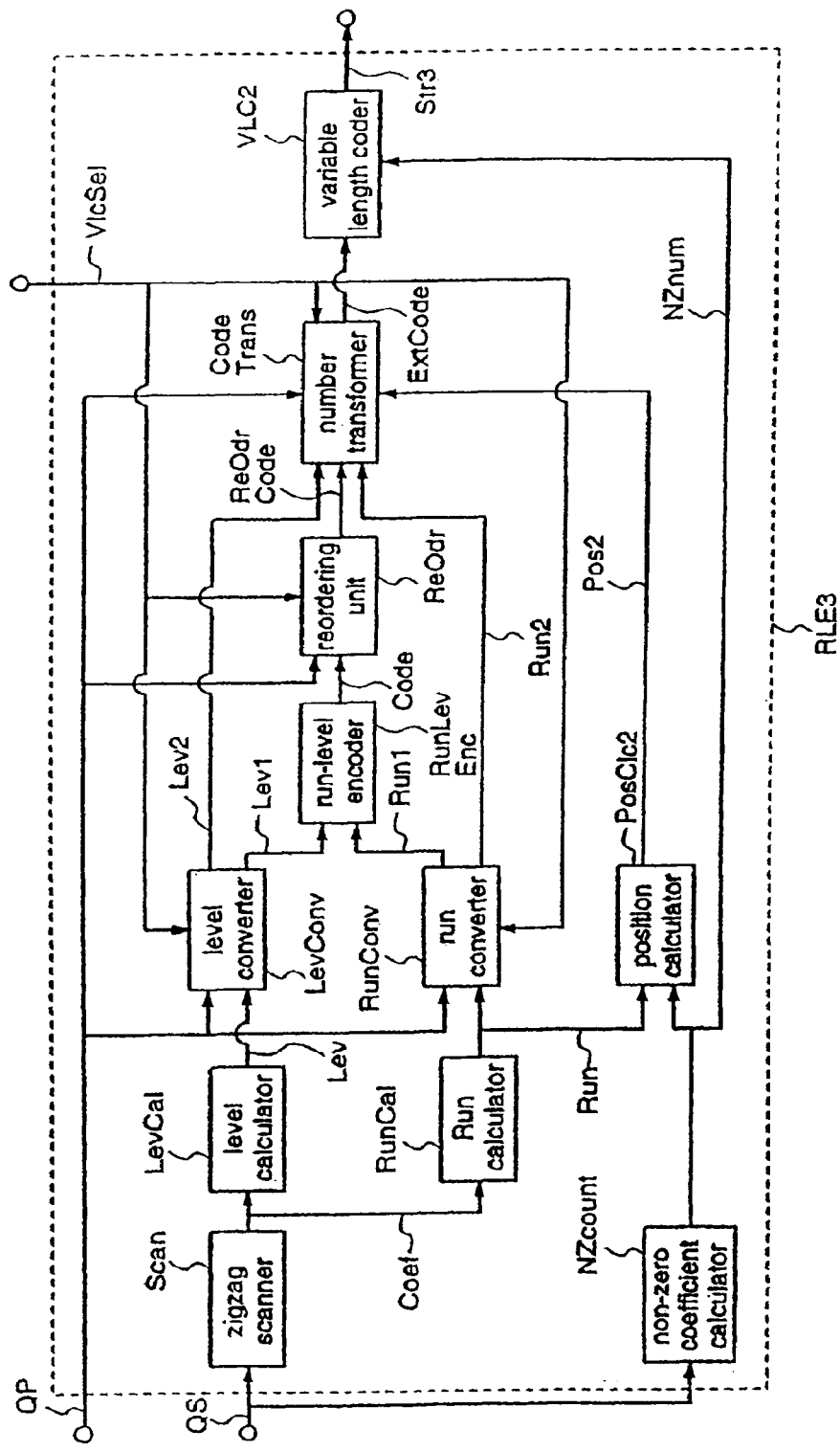
FIG. 21 is a block diagram illustrating a run-length encoding unit RLE3 that constitutes the image coding apparatus 105 according to the fifth embodiment.

FIG. 21 shows a specific construction of the run-length encoding unit RLE3 in the image coding apparatus 105.

This run-length encoding unit RLE3 according to the fifth embodiment has, in place of the position calculator PosClc in the run-length encoding unit RLE2 according to the third embodiment as shown in FIG. 14, a non-zero coefficient counter NZcount for counting the number NZnum of non-zero coefficients on the basis of inputted quantized components, and a position calculator PosClc2 for calculating the number Pos2 of coded coefficients on the basis of the counted number Nznum of non-zero coefficients and a run value Run calculated by the run calculator RunCal.

The run-length encoding unit RLE3 according to the fifth embodiment encodes an output (code number) ExtCode from the number transformer CodeTrans as well as encodes the number NZnum of non-zero components, unlike the variable length coder VLC of the run-length encoding unit RLE2 according to the third embodiment.

Other components of the run-length encoding unit RLE3 are the same as those of the run-length encoding unit RLE2 according to the third embodiment.

Next, functions and effects will be described.

Operations of the blocking unit Blk, the frequency transformation unit Trans, and the quantization unit Q in the image coding apparatus 105 according to the fifth embodiment are the same as those in the image coding apparatus 103 according to the third embodiment. Further, operations of components other than the non-zero coefficient counter NZcount, the position calculator PosClc2, the number trans former CodeTrans, and the variable length coder VLC2 in the run-length encoding unit RLE3 according to the fifth embodiment, i.e., the scanner Scan, the run calculator RunCal, the level calculator LevCal, the run converter RunConv, the level converter LevConV, the run-level encoder RunLevEnc, and the reordering unit ReOdr are identical to those of the run-length encoding unit RLE2 according to the third embodiment. Thus, the operations of the non-zero coefficient counter NZcount, the position calculator PosClc2, the number transformer CodeTrans, and the variable length coder VLC2 will be hereinafter mainly described.

When quantized components QS outputted from the quantization unit Q are inputted to the run-length encoding unit RLE3, the non-zero coefficient counter NZcount in the run-length encoding unit RLE3 counts the number of non-zero components NZnum in the plural quantized components corresponding to respective blocks on the basis of the quantized components QS, and outputs the obtained number NZnum of non-zero components to the position calculator PosClc2 and the variable length coder VLC2.

The position calculator PosClc2 calculates a sum of the number of coded zero components and the number of non-zero components in a target block on the basis of the number NZnum of non-zero components from the non-zero coefficient counter NZcount and a run value Run from the run calculator RunCal, and outputs the obtained value Pos2

The number transformer CodeTrans outputs a code number ExtCode corresponding to a run-level pair from a level value Lev2 and a run value Run2, on the basis of correspondences between the run-level upper digit pairs and the code numbers ReOdrCode. At this time, the number transformer CodeTrans employs the calculated value Pos2 that is outputted from the position calculator PosClc2 to obtain the number of uncoded components in the target block.

Here, the code number ExtCode corresponding to a run-level pair, which is outputted from the number transformer CodeTrans, is obtained on the basis of the second code table having different correspondences between run-level pairs and code numbers from the first code table. This second table is formed as follows: a code table having different correspondences between run-level pairs and code numbers from the first code table is initially formed by the reordering process in the reordering unit ReOdr, and go then the code table formed by the reordering unit ReOdr is modified by the number transformer CodeTrans on the basis of the calculated value Pos2 so that run-level pairs having run values which are larger than the maximum run value. Run in the code table correspond to code numbers ExtCode to which no codes are assigned.

The variable length coder VLC2 encodes the number NZnum of non-zero components, as well as performs coding for the code number ExtCode to assign a bit string (code word) to the code number ExtCode to generate a coded stream Str3.

Hereinafter, the operation of the variable length coder VLC2 will be specifically described.

Unlike the variable length coder VLC according to the third embodiment, the variable length coder VLC2 according to the fifth embodiment not only encodes the code number ExtCode corresponding to a run-level pair of a target block but also encodes the number NZnum of non-zero components In the target block before coding the code number ExtCode of the block.

As described above, when the number NZnum of non-zero coefficients is coded before coding the code number ExtCode of a block, the number NZnum of non-zero components of the target block can be initially decoded at the decoding, and it can be checked that reconstitution of the last run-level pair in the target block has been completed, at a time when the run-level pairs corresponding to the number NZnum of non-zero components have been reconstituted. Consequently, a specific value EOB that is, coded at the end of the target block (a value that is transmitted after the last non-zero component), which is required by the variable length coder VLC according to the third embodiment, is not required by the variable length coder VLC2

Next, the operations of the position calculator PosClc2 and the number transformer CodeTrans will be specifically described.

Assuming that a target block includes NBlock quantized components QS (including both of zero components and non-zero components), the maximum run length (the maximum number of successively continuing zero coefficients) is (NBlock−NZnum) on the basis of the number NZnum of non-zero coefficients in the target block. Further, the maximum run value (the maximum number of successively continuing zero coefficients) MaxRun(1) at a time when the coding of the first run-level pair has been completed is represented by the following formula (5), using a run value FRun of the first run-level pair of the target block.

$$\text{MaxRun}(1) = \text{NBlock} - \text{NZnum} - \text{FRun} \quad (5)$$

Generally, the maximum run value MaxRun(i) at a time when coding of an i-th run-level pair in a block has been completed is represented by the following formula (6).

$$\text{MaxRun}(i) = \text{NBlock} - \text{NZnum} - \{\text{the sum of 1st~}i\text{-th run values}\} \quad (6)$$

Therefore, the position calculator PosClc2 outputs a calculated value Pos2 represented by the following formula (7), thereby indicating to the number transformer CodeTrans that the maximum run value MaxRun(i) is a value represented by the formula (8).

$$\text{Pos2} = \text{NZnum} + \{\text{the sum of 1th~}i\text{-th run values}\} \quad (7)$$

$$\text{MaxRun}(i) = \text{NBlock} - \text{Pos2} \quad (8)$$

The number transformer CodeTrans forms the second code table in which code numbers ExtCode to which no code is assigned are made correspond to run-level pairs having run values which are larger than the maximum run value MaxRun. Thereby, redundancy in the coding process due to the assignment of codes to run-level pairs which will never occur is deleted, thereby increasing the compression rate.

When a variable-length code table that is composed of a first part which can be generated by an arithmetic operation (regularly build VLC) and a second part which cannot be regularly generated by an arithmetic operation (table look up VLC) is employed as the first and second code tables when the variable length coding process for the quantized components is carried out, the second code table may be formed by changing both of the first and second parts in the first code table according to the maximum run value, or the second code table may be formed by changing only the first part in the first code table, which can be generated by an arithmetic whose operation is easily performed according to the maximum run value.

Further, in place of changing the code table to one in which no code is assigned to run-level pairs having run values Run which are larger than the maximum run value MaxRun(i) when the variable length code table is changed according to the maximum run value MaxRun(i) at a time when the coding of an i-th run-level pair has been completed, a variable-length code table may be directly changed to one in which no code is assigned to run-level pairs having run values Run that are larger than the maximum run value MaxRun(i).

FIGS. 24(a)-24(c) are diagrams showing examples of the variable length code tables. In a code table Ta (FIG. 24(a)), shorter codes, are assigned to smaller run valves as compared to a code table Tb (FIG. 24(b)). In the code table Tb (FIG. 24(b)), further shorter codes are assigned to smaller run values as compared to a code table Tc (FIG. 24(c)).

In addition, in the code table Tc (FIG. 24(C)), shorter codes are assigned to level values having smaller absolute values as compared to the code table Tb (FIG. 24(b)). In the code table Tb, further shorter codes are assigned to level values having smaller absolute values as compared to the code table Ta (FIG. 24(a)).

Therefore, it is preferable to select the code table Ta in FIG. 24(a) when the maximum run value MaxRun is smaller, the code table Tc in FIG. 24(c) when the maximum run value MaxRun is larger, and the code table Tb in FIG. 24(b) when the maximum run value MaxRun is an intermediate value.

According to the fifth embodiment, the image coding apparatus 105 that encodes quantized coefficients which are obtained by quantizing frequency components of an image signal is provided with the run-length encoding unit RLE3 that assigns variable length codes to the quantized components using a code table. Then, the run-length encoding unit RLE3 selects a code table in which run-level pairs which will never occur are deleted on the basis of the sum of the number of processed coefficients (coded coefficients) in a target block to be coded and the number of uncoded non-zero coefficients in the target block, in other words, the sum of the number of non-zero coefficients in the target block and the number of already-processed run values in the target block, thereby increasing the variable length coding efficiency.

According to this fifth embodiment, in the run-length encoding unit that performs variable length coding of quantized components corresponding to each block by using run-level pairs, the number NZnum of non-zero components in a target block is coded. However, it is possible that coding of the number NZnum of non-zero components of a target block may be performed in a run-length encoding unit that performs variable length coding of run values and level values corresponding to quantized components of each block separately, as in the first embodiment. In this case, the maximum run value in the target block can be set at a value that is obtained by subtracting the number NZnum of non-zero components from the number of all components in the target block.

Embodiment 6

Figure 22:
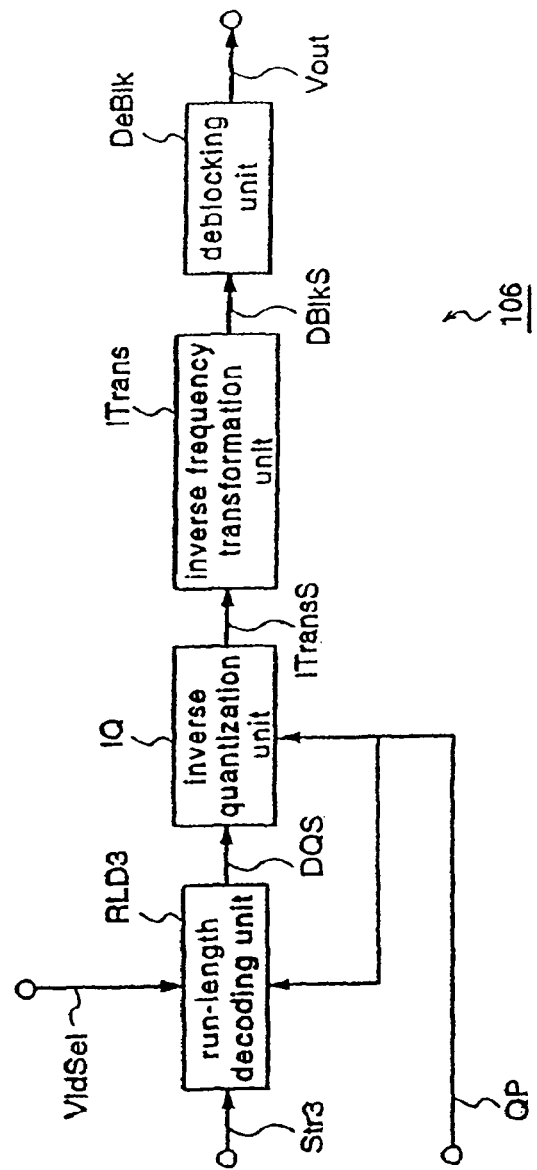
FIG. 22 is a block diagram for explaining an image decoding apparatus 106 according to a sixth embodiment of the present invention.

FIG. 22 is a block diagram for explaining an image decoding apparatus according to a sixth embodiment of the present invention.

This image decoding apparatus 106 according to the sixth embodiment has, in place of the run-length decoding unit RLD2 in the image decoding apparatus 104 according to the fourth embodiment as shown in FIG. 18, a run-length decoding unit RLD3 that performs a decoding process for coded data to reconstitute the number of run-level pairs and the number of non-zero, components in each block, as in the run-length decoding unit RLD2. Other components of the image decoding apparatus 106 according to the sixth embodiment are the same as those in the image decoding apparatus 104 according to the fourth embodiment.

Figure 23:
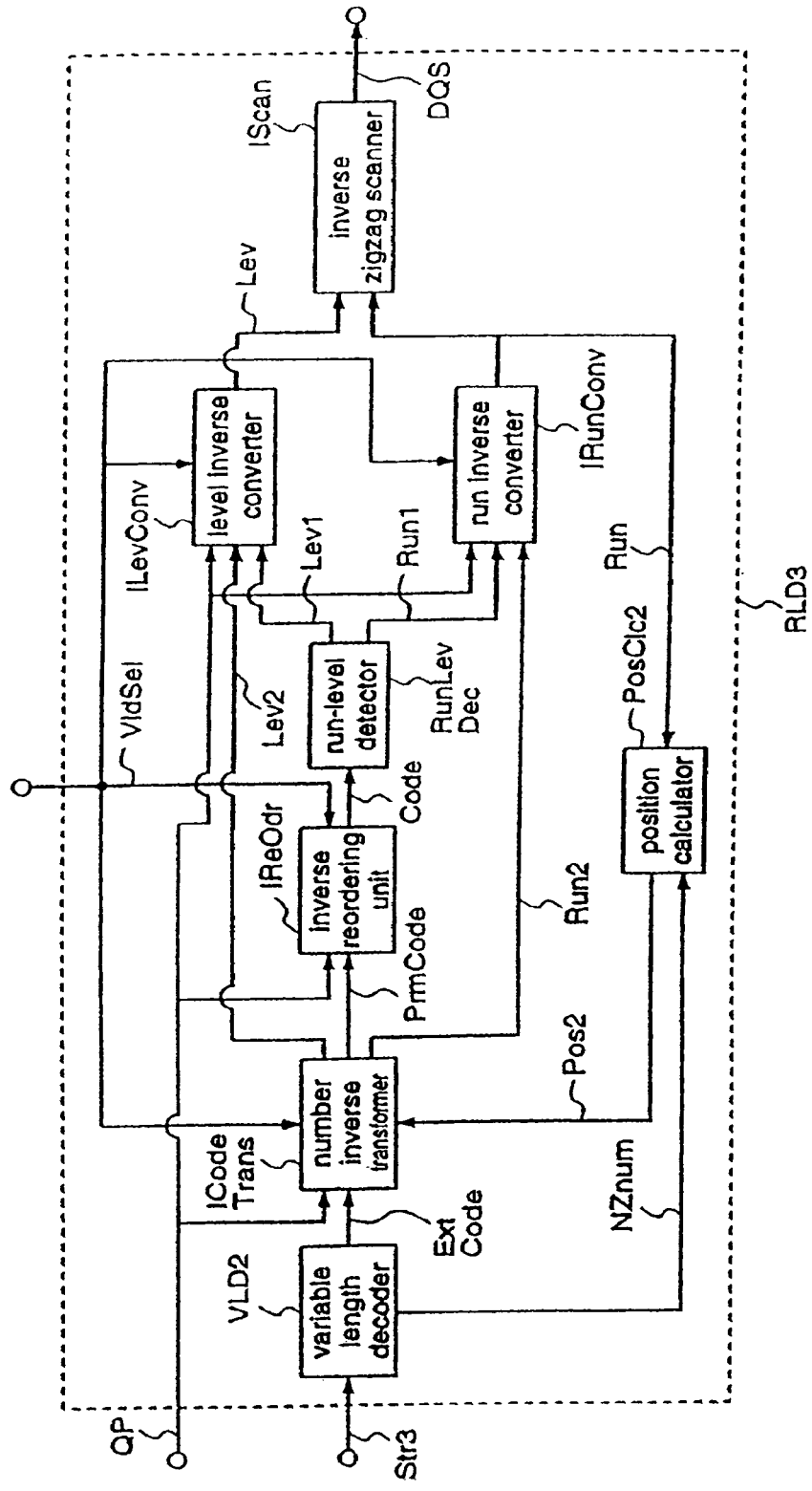
FIG. 23 is a block diagram illustrating a run-length decoding unit RLD3 that constitutes the image decoding apparatus 106 according to the sixth embodiment.
Figure 25:
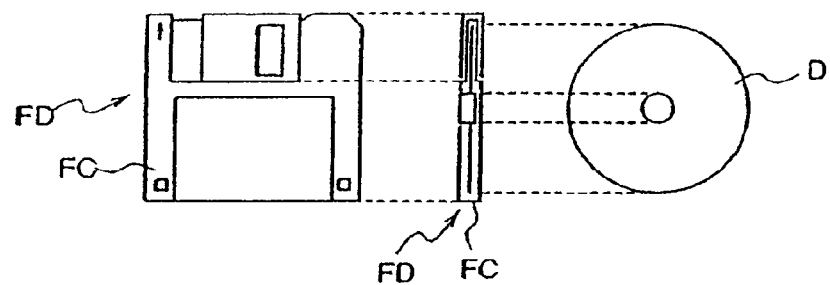
FIGS. 25(a)-25(c) are diagrams for explaining a data storage medium which contains a program for implementing a variable length coding process or a variable length decoding process according to any of the above embodiments by a computer system (FIGS. 25(a) and 25(b)), and the computer system (FIG. 25(c)).
Figure 25:
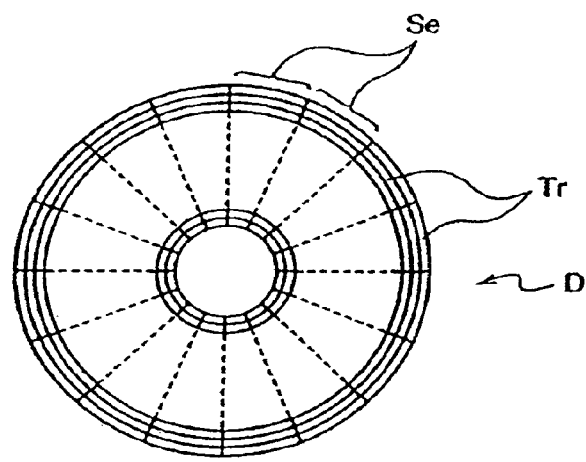
Figure 25:
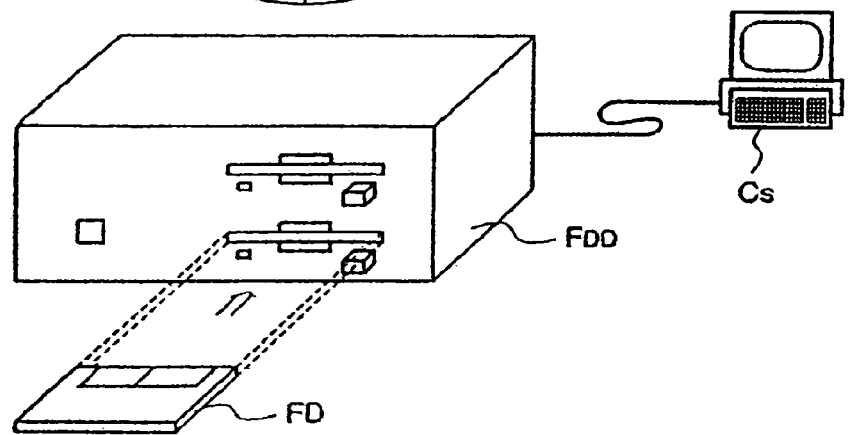

FIG. 23 shows a specific construction of the run-length decoding unit RLD3 in the image decoding apparatus 106.

This run-length decoding unit RLD3 of the sixth embodiment includes, in place of the position calculator PosClc in the run-length decoding unit RLD2 according to the fourth embodiment as shown in FIG. 19, a position calculator PosClc2 for calculating the sum Pos2 of the number of decoded run values in a target block to be decoded and the number NZnum of non-zero coefficients in the target block.

Further, a variable length decoder VLD2 of the run-length decoding unit RLD3 according to the sixth embodiment is different from the variable length decoder VLD in the run-length decoding unit RLD2 according to the fourth embodiment in that a decoding process for reconstituting a code number ExtCode and a decoding process for reconstituting the coded number NZnum of non-zero components are carried out.

Next, functions and effects will be described.

Operations of the inverse quantization unit IQ, the inverse frequency transformation unit ITrans, and the deblocking unit DeBlk in the image decoding apparatus 106 according to the sixth embodiment are the same as those in the image decoding apparatus 104 of the fourth embodiment. Further, operations of components of the run-length decoding unit RLD3 according to the sixth embodiment other than the variable length decoder VLD2, the position calculator PosClc2 and the number inverse transformer IcodeTrans, i.e., the inverse reordering unit IReOdr, the run-level detector RunLevDec, the level inverse converter ILevConv, the run inverse converter IRunConv, and the inverse zigzag scanner IScan are identical to those of the run-length decoding unit RLD2 according to the fourth embodiment. Therefore, operations of the variable length decoder VLD2, the position calculator PosClc2, and the number inverse transformer ICodeTrans will be hereinafter mainly described.

The variable length decoder VLD2 decodes the coded stream Str3, and outputs a code number ExtCode corresponding to a code word (bit string) that composes the coded stream. The number inverse transformer ICodeTrans carries out an inverse operation to that of the number transformer CodeTranson the basis of at least either the quantization parameter QP or the VLD selection signal VldSel, and the sum Pos2 of the number of decoded coefficients and the number of undecoded non-zero coefficients, to divide the code number ExtCode into a code number PrmCode corresponding to the run-level upper digit pair comprising the level value Lev1 and the run value Run1, a level value Lev2, and a run value Run2.

The inverse reordering unit IReOdr, the run-level detector RunLevDec, the run inverse converter IRunConv, the level inverse converter ILevConv, and the inverse zigzag scanner IScan performs the same operations as those in the fourth embodiment.

Here, the number inverse transformer ICodeTrans, the inverse reordering unit IReOdr, the run inverse converter IRunConv, and the level inverse converter ILevConv selects one of the first and second code tables on the basis of at least either the quantization parameter QP or the VLD selection signal VldSel, and the sum Pos2 of coefficients, and perform the operations on the basis of the selected code table.

Hereinafter, the operation of the variable length decoder VLD2 will be specifically described.

The variable length decoder VLD2 according to the sixth embodiment is different from the variable length decoder VLD according to the fourth embodiment in that it decodes not only the code number ExtCode corresponding to a run-level pair but also the coded number NZnum of non-zero components in the target block. When the number NZnum of non-zero components is obtained by the decoding, at a time when NZnum run-level pairs have been decoded, this NZnum-th run-level pair is judged to be the last run-level pair. Consequently, the variable length decoder VLD2 does not require a value BOB that is required by the variable length decoder VLD and is coded at the end of the target block.

For example, assuming that there are NBlock quantized components QS in the target block, including zero components and non-zero components, the maximum run value (the maximum number of successively continuing zero coefficients) is (NBlock−NZnum) on the basis of the number NZnum of non-zero coefficients in the target block. Further, the maximum run value (the maximum number of successively continuing zero coefficients) MaxRun(1) at a time when the decoding for reconstituting the first run-level pair has been performed is (NBlock−NZnum−FRun) as described in the fifth embodiment.

Generally, the maximum run value MaxRun(i) at a time when decoding for reconstituting an i-th run-level pair in a block has been performed is obtained as follows:

$$\text{MaxRun}(i) = \text{Nblock} - \text{Nznum} - \{\text{the sum of 1st} \sim i\text{-th run values}\}$$

Therefore, the position calculator PosClc2 outputs the sum Pos2 of coefficients [=NZnum+{the sum of 1st~i-th run values}], thereby indicating to the number transformer CodeTrans that the maximum run value at a time when the decoding for reconstituting an i-th run-level pair has been performed is (NBlock−Pos2).

The number inverse transformer ICodeTrans employs a code table in which no code is assigned to code numbers corresponding to run-level pairs comprising run values which are larger than the maximum run value Run, to obtain a code number ExtCode corresponding to a code, thereby decoding a code that is assigned to a code number according to code assignment which avoids assignment of codes to run-level pairs which will never occur.

Here, when a variable length code table that is composed of the first part which can be generated by an arithmetic operation (regularly build VLC) and the second part that cannot be regularly generated (table loop up VLC) is employed as the first and second code tables in the variable length decoding process, the second code table may be formed by changing both of the first and second parts in the first code table according to the maximum run value, while the second code table may be formed by changing only the first part of the first code table which can be generated by an arithmetic whose operation is easily carried out, according to the maximum run value.

Further, when a variable length code table is changed according to the maximum run value MaxRun at a time when the decoding for reconstituting an i-th run-level pair has been completed, the variable length code table can be changed directly to the code table Ta in FIG. 24(a), the code table Tb in FIG. 24(b), or the code table Tc in FIG. 24(c), in place of changing the code table to one in which no code is assigned to run-level pairs comprising run values which are larger than the maximum run value MaxRun.

For example, it is preferable to select the code table Ta in FIG. 24(a) when the maximum run value MaxRun is smaller, the code table Tc in FIG. 24(c) when the maximum run value MaxRun is larger, and code table Tb in FIG. 24(b) when the maximum run value MaxRun is an intermediate value.

As described above, according to the sixth embodiment, the image decoding apparatus 106 that reconstitutes quantized coefficients which are obtained by quantizing frequency components of an image signal by a decoding process for coded data is provided with the run-length decoding unit RLD3 for obtaining a quantized coefficient corresponding to a variable length code by employing a code table. Then, this run-length decoding unit RLD3 selects a code table including no run-level pairs which will never occur, on the basis of the sum of the number of processed coefficients (decoded coefficients) in a target block and the number of undecoded non-zero coefficients in the target block. Therefore, a decoding process corresponding to a variable length coding process that can more effectively remove redundant information included, in the quantized coefficients to be processed can be satisfactorily carried out.

According to this sixth embodiment, in the run-length decoding unit that performs variable length decoding for quantized components of each block by using run-level pairs, the coded number NZnum of non-zero components in a target block is decoded. However, it is possible that, for example, in a run-length decoding unit that subjects run values and level values corresponding to quantized components of each block separately to the variable length decoding process as in the second embodiment, the coded number NZnum of non-zero components of the target block is decoded. In this case, it can be judged that the NZnum-th level value is the last level value in the target block, at a time when NZnum level values have been decoded.

In any of the aforementioned embodiments, the code table is changed according to the quantization parameter QP, while the code table may be changed according to another parameter. For example, another parameter may be newly derived and expressly switched for each block.

In the above-mentioned embodiments, as a method for subjecting coefficients such as quantized components to a variable length coding (decoding) process, a method is shown in which a VLC table is employed, and the VLC table is changed on the basis of at least either information about processed coefficients which have been subjected to the coding (decoding) process, or a parameter relating to generation of the coefficients. However, the method for variable-length coding (decoding) coefficients such as quantized components according to the present invention is not restricted to one using the VLC table. For example, the method for variable-length coding the quantized components as described in any of the first, third, and fifth embodiments may be a variable length coding method in which the VLC table is not employed, and a code table corresponding to the VLC table is changed on the basis of at least either the information about the processed coefficients, or the parameter relating to generation of the coefficients. Further, the method for variable-length decoding the coded data corresponding to the quantized components according to any of the second, fourth, and sixth embodiments may be a variable length decoding method by Which the VLC table is not employed, and a code table corresponding to the VLC table is changed on the basis of at least either the information about the processed coefficients, or the parameter relating to generation of the coefficients.

The image coding apparatus that carries out a variable length coding process or the image decoding apparatus that carries out a variable length decoding process according to any of the aforementioned embodiments is implemented by hardware, while these apparatuses may be implemented by software. In this case, when a program for executing the variable length coding or decoding process according to any of the aforementioned embodiments is recorded in a data storage medium such as a flexible disk, the image coding apparatus or the image decoding apparatus according to any of the aforementioned embodiments can be easily implemented in an independent computer system.

FIGS. 25(a)-25(c) are diagrams for explaining a computer system for executing the variable length coding process according to the first, third or fifth embodiment, or the variable length decoding process according to the second, fourth, or sixth embodiment.

FIG. 25(a) shows a front view of a flexible disk FD which is a medium that contains a program employed in the computer system, a cross-sectional view thereof, and a flexible disk body D. FIG. 25(b) shows an example of a physical format of the flexible disk body D.

The flexible disk FD is composed of the flexible disk body D and a case FC that contains the flexible disk body D. On the surface of the disk body D, a plurality of tracks Tr are formed concentrically from the outer circumference of the disk toward the inner circumference. Each track is divided into 16 sectors Se in the angular direction. Therefore, in the flexible disk FD containing the above-mentioned program, data of the program for executing the variable length coding process or the variable length decoding process are recorded in the assigned storage areas (sectors) on the flexible disk body D.

FIG. 25(c) shows the structure for recording or reproducing the program in/from the flexible disk FD. When the program is recorded in the flexible disk ED, data of the program are written in the flexible disk FD from the computer system Cs through the flexible disk drive FDD. When the above-mentioned image coding apparatus or image decoding apparatus is constructed in the computer system Cs by the program recorded in the flexible disk FD, the program is read from the flexible disk FD by the flexible disk drive FDD and then loaded to the computer system Cs.

Although in the above description a flexible disk is employed as a storage medium that contains a program for executing the variable length coding process or the variable length decoding process, an optical disk may be employed as the storage medium. Also in this case, the variable length coding process or variable length decoding process can be performed by software in like manner as the case of using the flexible disk. The storage medium is not restricted to these disks, and any medium may be employed as long as it can contain the program, for example, a CD-ROM, a memory card, or a ROM cassette. Also when such data storage medium is employed, the variable length coding or variable length decoding process can be performed by the computer system in the same manner as the case of using the flexible disk.

Applications of the image coding method or image decoding method according to any of the aforementioned embodiments and systems using the same will be described hereinafter.

Figure 26:
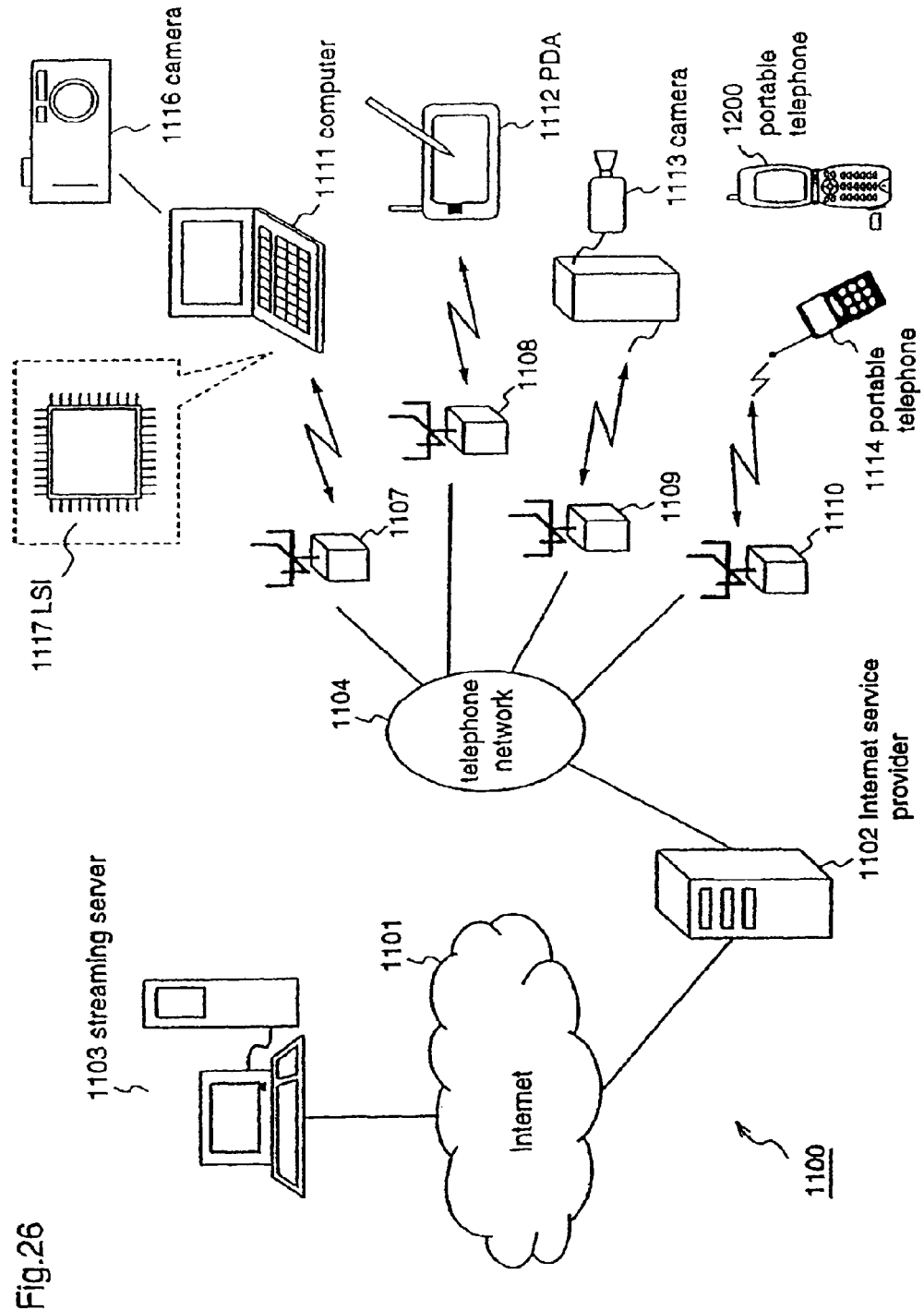
FIG. 26 is a diagram for explaining an application of an image coding method and an image decoding method according to any of embodiments, and this figure shows a contents supply system that implements contents distribution services.

FIG. 26 is a block diagram illustrating an entire construction of a contents provision system 1100 that performs contents distribution services.

A communication service provision area is divided into regions (cells) of desired size, and base stations 1107 to 1110 which are each fixed radio stations are established in the respective cells.

In this contents provision system 1100, various devices such as a computer 1111, a PDA (personal digital assistant) 1112, a camera 1113, a portable telephone 1114, and a portable telephone with a camera 1200 are connected, for example, to the Internet 1101 through an Internet service provider 1102, a telephone network 1104, and the base stations 1107 to 1110.

However, the contents provision system 1100 is not restricted to a system including all of the plural devices shown in FIG. 26, but may be one including some of the plural devices shown in FIG. 26. Further, the respective devices may be connected directly to the telephone network 1104, not through the base stations 1107 to 1110 as the fixed radio stations.

The camera 1113 is a device that can take moving images of an object, like a digital video camera. The portable telephone may be a portable telephone set according to any of PDC (Personal Digital Communications) system, CDMA (Code Division Multiple Access) system, W-CDMA (Wide-band-Code Division Multiple Access) system, and GSM (Global System for Mobile Communications) system, or PHS (Personal Handyphone System).

A streaming server 1103 is connected to the camera 1113 through the base station 1109 and the telephone network 1104. In this system, live distribution based on coded data which are transmitted by a user using the camera 1113 can be performed. The coding process for the data of taken images may be carried out by either the camera 1113 or the server that transmits the data. Moving image data which are obtained by taking moving images of an object by means of the camera 1116 may be transmitted to the streaming server 1103 through the computer 1111. The camera 1116 is a device that can take still images or moving images of an Object, such as a digital camera. In this case, coding of the moving image data can be performed by either the camera 1116 or the computer 1111. Further, the coding process is carried out by an LSI 1117 included in the computer 1111 or the camera 1116.

Image coding or decoding software may be stored in a storage medium (a CD-ROM, a flexible disk, a hard disk, or the like) which is a recording medium that contains data readable by the computer 1111 or the like. The moving image data may be transmitted through the portable telephone with a camera 1200. The moving image data are data which have been coded by an LSI included in the portable telephone 1200.

In this contents provision system 1100, contents corresponding to images taken by the user by means of the camera 1113 or the camera 1116 (for example, live video of a music concert) are coded in the camera in the same manner as any of the aforementioned embodiments, and transmitted from the camera to the streaming server 1103. The contents data are subjected to streaming distribution from the streaming server 1103 to a requesting client.

The client may be any of the computer 1111, the PDA 1112, the camera 1113, the portable telephone 1114 and the like, which can decode the coded data.

In this contents provision system 1100, the coded data can be received and reproduced on the client side. When the data are received, decoded, and reproduced in real time on the client side, private broadcasting can be realized.

The coding or decoding in the respective devices that constitute this system can be performed using the image coding apparatus or the image decoding apparatus according to any of the aforementioned embodiments.

A portable telephone will be now described as an example of the image coding or decoding apparatus.

Figure 27:
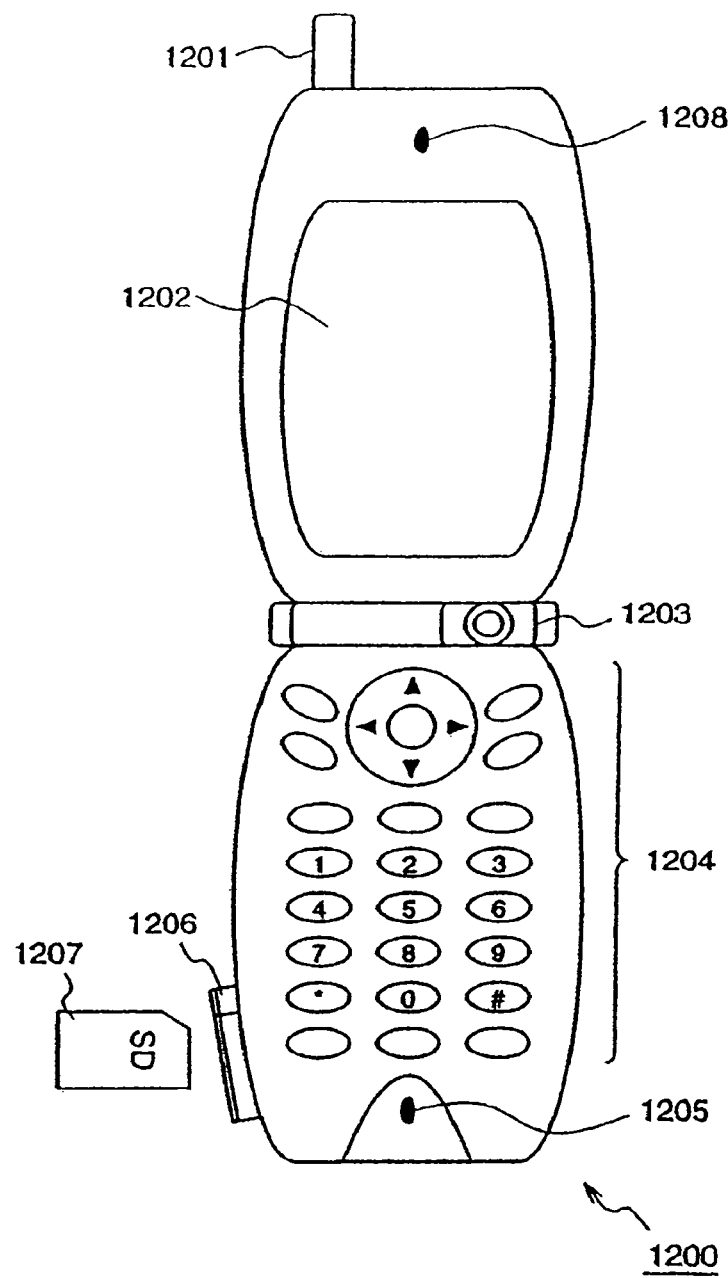
FIG. 27 is a diagram for explaining a portable telephone that employs an image coding method and an image decoding method according to any of embodiments.

FIG. 27 is a diagram illustrating a portable telephone 1200 that employs the image coding method and the image decoding method according to any of the aforementioned embodiments.

This portable telephone 1200 includes an antenna 1201 for transmitting/receiving radio waves to/from the base station 1110, a camera unit 1203 that can take video or still images of an object, such as a CCD camera, and a display unit 1202 such as a liquid crystal display for displaying data of the video taken by the camera unit 1203 or video received through the antenna 1201.

The portable telephone 1200 further includes a main body 1204 including plural control keys, a voice output unit 1208 for outputting voices such as a speaker, a voice input unit 1205 for inputting voices such as a microphone, a storage medium 1207 for retaining coded data or decoded data such as data of taken moving images or still images, or data, moving image data or still image data of received e-mails, and a slot unit 1206 which enables the storage medium 1207 to be attached to the portable telephone 1200.

The storage medium 1207 has a flash memory element as a type of EEPROM (Electrically Erasable and Programmable Read Only Memory) that is an electrically programmable and erasable non-volatile memory contained in a plastic case, like a SD card.

The portable telephone 1200 will be described more specifically with reference to FIG. 28.

The portable telephone 1200 has a main control unit 1241 that performs general control for the respective units of the main body including the display unit 1202 and the control key 1204.

The portable telephone 1200 further includes a power supply circuit 1240, an operation input control unit 1234, an image coding unit 1242, a camera interface unit 1233, a LCD (Liquid Crystal Display) control unit 1232, an image decoding unit 1239, a multiplexing/demultiplexing unit 1238, a recording/reproduction unit 1237, a modulation/demodulation unit 1236, and an audio processing unit 1235. The respective units of the portable telephone 1200 are connected to each other via a synchronization bus 1250.

The power supply circuit 1240 supplies power from a battery pack to the respective units when a call end/power supply key is turned ON under the control of a user, thereby activating the digital portable telephone with a camera 1200 to be turned into an operable state.

In the portable telephone 1200, the respective units operate under control of the main control unit 1241 that is constituted by a CPU, a ROM, a RAM and the like. To be more specific, in the portable telephone 1200, an audio signal that is obtained by voice inputting into the voice input unit 1205 in a voice communication mode is converted into digital audio data by the audio processing unit 1235. The digital audio data is subjected to a spectrum spread process by the modulation/demodulation circuit 1236, further subjected to a DA conversion process and a frequency transformation process by the transmission/receiving circuit 1231, and transmitted through the antenna 1201.

In this portable telephone set 1200, a signal received through the antenna 1201 in the voice communication mode is amplified, and then subjected to a frequency transformation process and an AD conversion process. The received signal is further subjected to a spectrum inverse spread process in the modulation/demodulation circuit 1236, converted into an analog audio signal by the audio processing unit 1235, and this analog audio signal is outputted through the voice output unit 1208.

When the portable telephone 1200 transmits an electronic mail in a data communication mode, text data of the e-mail that is inputted by manipulation of the control key 1204 on the main body is transmitted to the main control unit 1241 via the operation input control unit 1234. The main control unit 1241 controls the respective units so that the text data is subjected to the spectrum spread process in the modulation/demodulation circuit 1236, then subjected to the DA conversion process and the frequency transformation process in the transmission/receiving circuit 1231, and then transmitted to the base station 1110 through the antenna 1201.

When this portable telephone 1200 transmits image data in the data communication mode, data of an image taken by the camera unit 1203 is supplied to the image coding unit 1242 via the camera interface unit 1233. When the portable telephone 1200 does not transmit the image data, the data of the image taken by the camera unit 1203 can be displayed directly on the display unit 1202 via the camera interface unit 1233 and the LCD control unit 1232.

The image coding unit 1242 includes the image coding apparatus according to any of the aforementioned embodiments. This image coding unit 1242 compressively encodes the image data supplied, from the camera unit 1203 by the image coding method according to any of the above embodiments to convert the same into coded image data, and outputs the obtained coded image data to the multiplexing/demultiplexing unit 1238. At the same time, the portable telephone 1200 transmits voices which are inputted to the voice input unit 1205 while the image is being taken by the camera unit 1203, as digital audio data, to the multiplexing/demultiplexing unit 1238 through the audio processing unit 1235.

The multiplexing/demultiplexing unit 1238 multiplexes the coded image data supplied from the image coding unit 1242 and the audio data supplied from the audio processing unit 1235 by a predetermined method. Resultant multiplexed data is subjected to a spectrum spread process in the modulation/demodulation circuit 1236, then further subjected to the DA conversion process and the frequency transformation process in the transmission/receiving circuit 1231, and obtained data is transmitted through the antenna 1201.

When the portable telephone 1200 receives data of a moving image file that is linked to a home page or the like in the data communication mode, a signal received from the base station 1110 through the antenna 1201 is subjected to a spectrum inverse spread process by the modulation/demodulation circuit 1236, and resultant multiplexed data is transmitted to the multiplexing/demultiplexing unit 1238.

When the multiplexed data that is received via the antenna 1201 is decoded, the multiplexing/demultiplexing unit 1238 demultiplexes the multiplexed data to divide the data into a coded bit stream corresponding to the image data and a coded bit stream corresponding to the audio data, and the coded image data is supplied to the image decoding unit 1239 and the audio data is supplied to the audio processing unit 1235, via the synchronization bus 1250.

The image decoding unit 1239 includes the image decoding apparatus according to any of the aforementioned embodiments. The image decoding unit 1239 decodes the coded bit stream of the image data by the decoding method corresponding to the coding method according to any of the above-mentioned embodiments, to reproduce moving image data, and supplies the reproduced data to the display unit 1202 through the LCD control unit 1232. Thereby, for example, the moving image data included in the moving image file that is linked to the home page is displayed. At the same time, the audio processing unit 1235 converts the audio data into an analog audio signal, and then supplies the analog audio signal to the voice output unit 1208. Thereby, for example, the audio data included in the moving image file that is linked to the home page is reproduced.

Here, a system to which the image coding method and the image decoding method according to any of the aforementioned embodiments is applicable is not restricted to the above-mentioned contents provision system.

Figure 29:
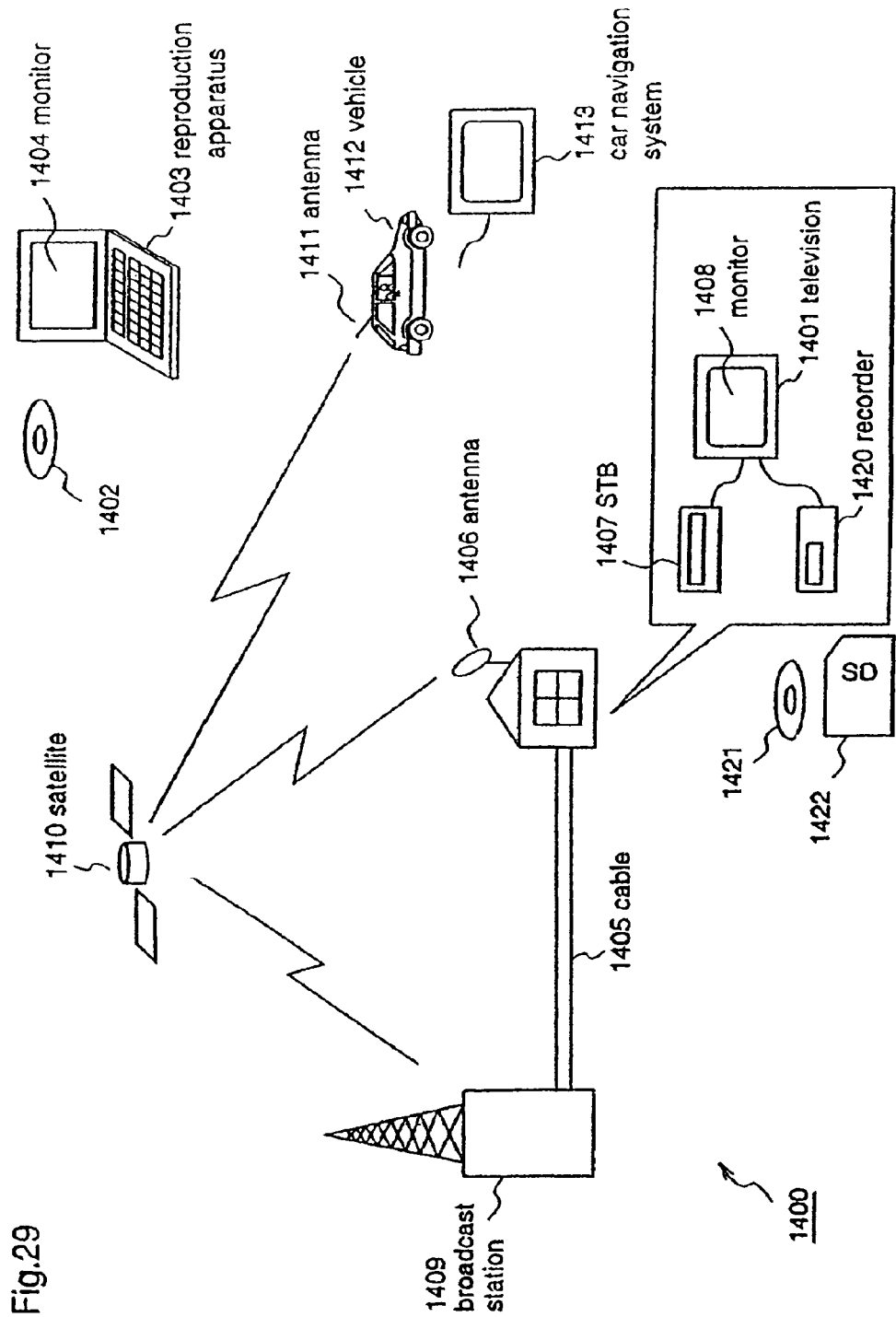
FIG. 29 is a diagram showing a digital broadcasting system that employs an image coding apparatus or an image decoding apparatus according to any of embodiments.

Recently, digital broadcasting using satellites or terrestrial waves is talked frequently, and the image coding apparatus and the image decoding apparatus according to the above embodiments is applicable also to a digital broadcasting system as shown in FIG. 29.

More specifically, a coded bit stream corresponding to video information is transmitted from a broadcast station 1409 to a satellite 1410 such as a communication satellite or a broadcast satellite, via radio communication. When the broadcast satellite 1410 receives the coded bit stream corresponding to the video information, the satellite 1410 outputs broadcasting waves, and these waves are received by an antenna 1406 at home including satellite broadcast receiving facility. For example, an apparatus such as a television (receiver) 1401 or a set top box (STB) 1407 decodes the coded bit stream, and reproduces the video information.

Further, the image decoding apparatus according to any of the aforementioned embodiments can be mounted also on a reproduction apparatus 1403 that can read and decode the coded bit stream recorded on a storage medium 1402 such as a CD or a DVD (recording medium).

In this case, a reproduced video signal is displayed on a monitor 1404. The image decoding apparatus may be mounted on the set top box 1407 that is connected to a cable for cable television 1405 or an antenna for satellite/terrestrial broadcast 1406, to reproduce an output of the image decoding apparatus to be displayed on a monitor 1408 of the television. In this case, the image decoding apparatus may be incorporated not in the set top box but in the television. A vehicle 1412 having an antenna 1411 can receive a signal from the satellite 1410 or the base station 1107, and reproduce a moving image to display the same on a display device of a car navigation system 1413 or the like which is mounted on the vehicle 1412.

Further, it is also possible that an image signal can be coded by the image coding apparatus according to any of the aforementioned embodiments and recorded in a recording medium.

A specific example of a recording device is a recorder 1420 such as a DVD recorder that records image signals on a DVD disk 1421, and a disk recorder that records image signals on a hard disk. The image signals may be recorded on a SD card 1422. Further, when the recorder 1420 includes the image decoding apparatus according to any of the aforementioned embodiments, the image signals which are recorded on the DVD disk 1421 or the SD card 1422 can be reproduced by the recorder 1420 and displayed on the monitor 1408.

Figure 28:
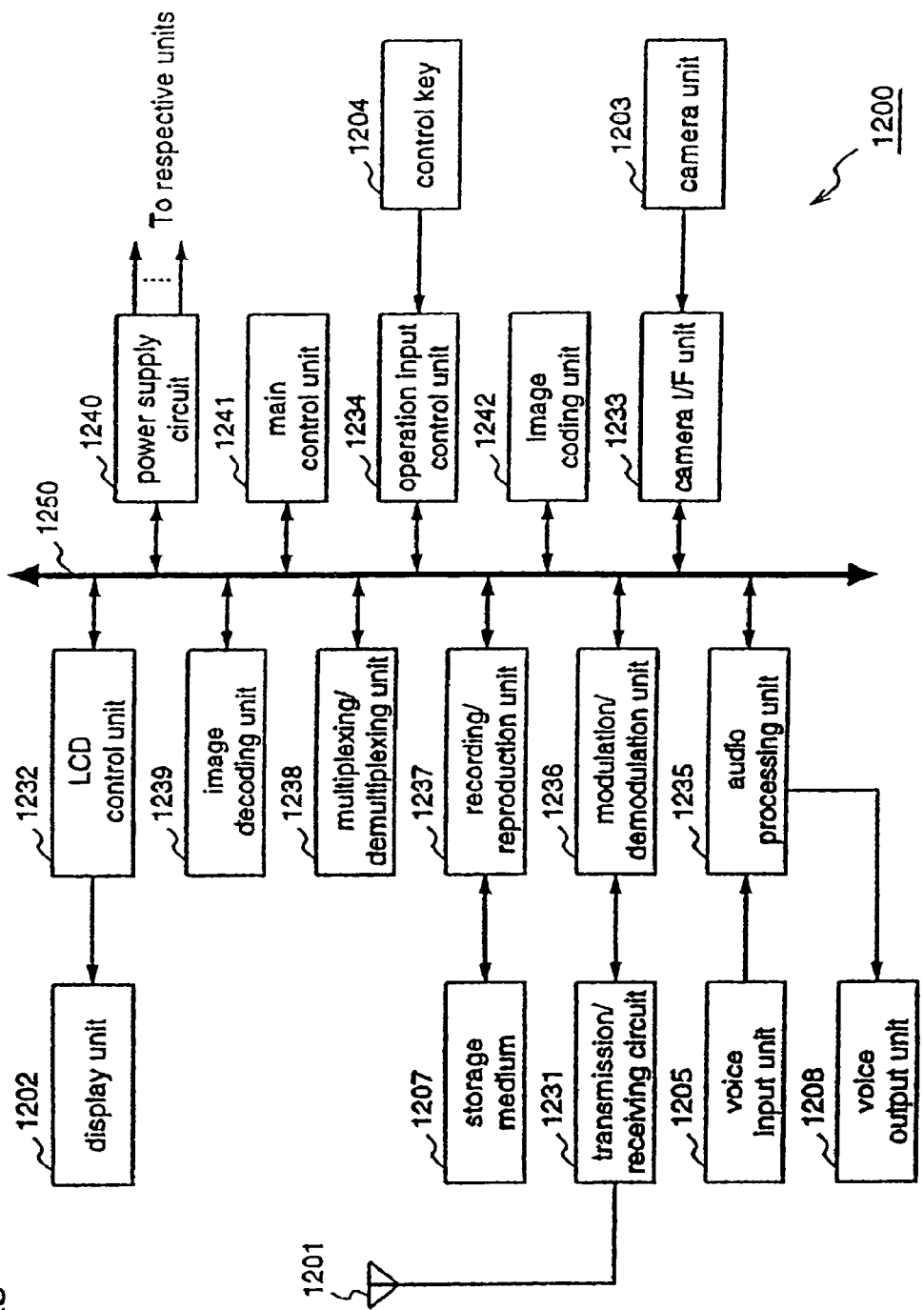
FIG. 28 is a block diagram illustrating the portable telephone as shown in FIG. 27.

Here, the structure of the car navigation system 1413 may include, for example, the components of the portable telephone shown in FIG. 28 other than the camera unit 1203, the camera interface unit 1233 and the image coding unit 1242, and the same apply to the computer 1111, or the television (receiver) 1401.

Further, as the terminal such as the portable telephone 1114, one of three types of terminals: a transmission-receiving type terminal having both of a coder and a decoder, a transmission terminal having only a coder, and a receiving terminal having only a decoder, can be mounted.

As described above, the image coding method or the image decoding method according to any of the aforementioned embodiments is applicable to any of the above-mentioned devices or systems, whereby the effects as described in the above embodiments can be obtained.

Further, it goes without saying that the embodiments and their applications of the present invention are not restricted to those shown in this description.

INDUSTRIAL AVAILABILITY

The variable length coding method and the variable length decoding method according to the present invention effectively eliminates redundant information included in coefficient data as a target of a variable length coding process, by selecting a code table adaptively to characteristics of coefficients that compose the coefficient data or states of a coding process for the coefficients, thereby greatly improving a coding efficiency of a variable length coding process for image signals or the like. These variable length coding method and variable length decoding method are useful in data processing of transmitting or storing moving image data.

The invention claimed is:

1. A coding method for coding a coefficient of a frequency component included in a target block to be coded, the coding method comprising:
transforming the coefficient of the frequency component into a run value and a level value;
coding the level value; and
coding the run value,
wherein said coding of the run value includes:
counting a number of zero-value coefficient with a frequency component which is not higher than a frequency component corresponding to a zero-value quantized coefficient related to the run value to be coded;
selecting a code table in accordance with the counted number of zero-value coefficient; and
variable length coding the run value by using the selected code table.

2. The coding method according to claim 1,
wherein the coding method for coding the coefficient of the frequency component is performed on a block by block basis.

3. A coding apparatus which codes a coefficient of a frequency component included in a target block to be coded, the coding apparatus comprising:
a transforming unit operable to transform the coefficient of the frequency component into a run value and a level value;
a level value coding unit operable to code the level value; and
a run value coding unit operable to code the run value,
wherein the run value coding unit includes:
a number counting unit operable to count a number of zero-value coefficient with a frequency component which is not higher than a frequency component corresponding to a zero-value quantized coefficient related to the run value to be coded;
a table selecting unit operable to select a code table in accordance with the counted number of zero-value coefficient; and
a variable length coding unit operable to variable length code the run value by using the selected code table.

* * * * *